US00RE47311E

(19) United States
(12) Reissued Patent
Lue et al.

(10) Patent Number: US RE47,311 E
(45) Date of Reissued Patent: Mar. 19, 2019

(54) SILICON ON INSULATOR AND THIN FILM TRANSISTOR BANDGAP ENGINEERED SPLIT GATE MEMORY

(71) Applicant: MACRONIX INTERNATIONAL CO., LTD., Hsinchu (TW)

(72) Inventors: Hang-Ting Lue, Hsinchu (TW); Erh-Kun Lai, Tarrytown, NY (US)

(73) Assignee: MACRONIX INTERNATIONAL CO., LTD., Hsinchu (TW)

(21) Appl. No.: 15/210,751

(22) Filed: Jul. 14, 2016

Related U.S. Patent Documents

Reissue of:
(64) Patent No.: 8,937,340
Issued: Jan. 20, 2015
Appl. No.: 13/899,629
Filed: May 22, 2013

U.S. Applications:
(60) Division of application No. 12/056,489, filed on Mar. 27, 2008, now Pat. No. 8,482,052, which is a
(Continued)

(51) Int. Cl.
*H01L 23/52* (2006.01)
*H01L 29/66* (2006.01)
(Continued)

(52) U.S. Cl.
CPC .... *H01L 29/66833* (2013.01); *G11C 16/0466* (2013.01); *G11C 16/0483* (2013.01);
(Continued)

(58) Field of Classification Search
CPC ..... H01L 21/822; H01L 21/30608; H01L 27/112; H01L 27/115; H01L 29/7883;
(Continued)

(56) References Cited

U.S. PATENT DOCUMENTS

RE31,083 E 11/1982 DeKeersmaecker et al.
4,630,086 A 12/1986 Sato et al.
(Continued)

FOREIGN PATENT DOCUMENTS

EP 0016246 10/1980
EP 0016246 A1 10/1980
(Continued)

OTHER PUBLICATIONS

Dons et al. "Direct tunneling diode structure with a multilayer charge injection barrier," Dec. 21, 1998, American Institute of Physics, vol. 73, No. 25, pp. 3712-3714.*
(Continued)

*Primary Examiner* — Christopher E. Lee
(74) *Attorney, Agent, or Firm* — Haynes Beffel & Wolfeld LLP

(57) ABSTRACT

Memory cells comprising thin film transistor, stacked arrays, employing bandgap engineered tunneling layers in a junction free, NAND configuration. The cells comprise a channel region in a semiconductor strip formed on an insulating layer; a tunnel dielectric structure disposed above the channel region, the tunnel dielectric structure comprising a multilayer structure including at least one layer having a hole-tunneling barrier height lower than that at the interface with the channel region; a charge storage layer disposed above the tunnel dielectric structure; an insulating layer disposed above the charge storage layer; and a gate electrode disposed above the insulating layer Arrays and methods of operation are described.

18 Claims, 65 Drawing Sheets

Related U.S. Application Data continuation-in-part of application No. 11/831,594, filed on Jul. 31, 2007, now Pat. No. 7,426,140, and a continuation-in-part of application No. 11/549,520, filed on Oct. 13, 2006, now Pat. No. 7,473,589, and a continuation-in-part of application No. 11/425,959, filed on Jun. 22, 2006, now Pat. No. 7,709,334, and a continuation of application No. 11/324,581, filed on Jan. 3, 2006, now Pat. No. 7,315,474.

(60) Provisional application No. 61/018,589, filed on Jan. 2, 2008, provisional application No. 60/980,788, filed on Oct. 18, 2007, provisional application No. 60/748,911, filed on Dec. 9, 2005, provisional application No. 60/748,807, filed on Dec. 9, 2005, provisional application No. 60/689,231, filed on Jun. 10, 2005, provisional application No. 60/689,314, filed on Jun. 10, 2005, provisional application No. 60/647,012, filed on Jan. 27, 2005, provisional application No. 60/640,229, filed on Jan. 3, 2005.

(51) Int. Cl.

| | |
|---|---|
| ***G11C 16/04*** | (2006.01) |
| ***H01L 21/28*** | (2006.01) |
| ***H01L 27/115*** | (2017.01) |
| ***H01L 27/11568*** | (2017.01) |
| ***H01L 29/792*** | (2006.01) |
| *H01L 27/11551* | (2017.01) |
| *H01L 27/11529* | (2017.01) |
| *H01L 27/11578* | (2017.01) |
| *H01L 27/11531* | (2017.01) |
| *H01L 27/11524* | (2017.01) |

(52) U.S. Cl.

CPC .... *G11C 16/0491* (2013.01); *H01L 21/28282* (2013.01); *H01L 27/115* (2013.01); *H01L 27/11568* (2013.01); *H01L 29/792* (2013.01); *H01L 27/11524* (2013.01); *H01L 27/11529* (2013.01); *H01L 27/11531* (2013.01); *H01L 27/11551* (2013.01); *H01L 27/11578* (2013.01)

(58) Field of Classification Search

CPC ..... H01L 29/11519; H01L 29/11521; H01L 27/0688; G11C 11/5692; G11C 13/0004; G11C 16/04; G11C 16/0483; G11C 16/0466; G11C 16/3427; G11C 16/0475; B82Y 10/00

USPC ..... 257/296, 303, 314, 316, 321, 324, 344, 257/390, E21.606, E21.679, E21.682, 257/E21.614; 365/103, 177; 438/149, 438/257, 216

See application file for complete search history.

(56) References Cited

U.S. PATENT DOCUMENTS 4,959,812 A 9/1990 Momodomi et al.
5,160,987 A * 11/1992 Pricer ..... H01L 21/30608 257/303
5,270,969 A 12/1993 Iwahashi
5,278,439 A 1/1994 Ma et al.
5,286,994 A 2/1994 Ozawa et al.
5,319,229 A 6/1994 Shimoji et al.
5,338,952 A 8/1994 Yamauchi et al.
5,355,464 A 10/1994 Fandrich et al.
5,408,115 A 4/1995 Chang
5,412,603 A 5/1995 Schreck et al.
5,424,569 A 6/1995 Prall
5,448,517 A 9/1995 Iwahashi
5,478,767 A * 12/1995 Hong ..... H01L 27/11521 257/E21.682
5,483,486 A 1/1996 Javanifard et al.
5,485,422 A 1/1996 Bauer et al.
5,509,134 A 4/1996 Fandrich et al.
5,515,324 A 5/1996 Tanaka
5,566,120 A 10/1996 D'Souza
5,602,775 A 2/1997 Vo
5,644,533 A 7/1997 Lancaster et al.
5,668,029 A 9/1997 Huang et al.
5,694,356 A 12/1997 Wong et al.
5,745,410 A 4/1998 Yiu et al.
5,753,950 A 5/1998 Kojima
5,768,192 A 6/1998 Eitan
RE35,838 E 7/1998 Momodomi et al.
5,793,677 A 8/1998 Hu et al.
5,825,062 A 10/1998 Muramoto
5,835,396 A 11/1998 Zhang
5,872,034 A 2/1999 Schlais et al.
5,877,054 A 3/1999 Yamauchi et al.
5,883,409 A 3/1999 Guterman et al.
5,895,949 A 4/1999 Endoh
5,897,351 A 4/1999 Forbes
5,901,084 A * 5/1999 Ohnakado ..... H01L 29/7883 257/321
5,926,700 A * 7/1999 Gardner ..... H01L 27/0688 257/E21.614
5,949,704 A * 9/1999 Shone ..... H01L 27/112 257/390
5,952,692 A 9/1999 Nakazato et al.
5,966,603 A 10/1999 Eitan
6,011,725 A 1/2000 Eitan
6,026,026 A 2/2000 Chan et al.
6,034,896 A 3/2000 Ranaweera et al.
6,074,917 A 6/2000 Chang et al.
6,096,603 A 8/2000 Chang et al.
6,103,572 A 8/2000 Kirihara
6,151,248 A 11/2000 Harari et al.
6,169,693 B1 1/2001 Chan et al.
6,172,907 B1 1/2001 Jenne
6,194,272 B1 2/2001 Sung et al.
6,215,148 B1 4/2001 Eitan
6,218,700 B1 4/2001 Papadas
6,219,276 B1 4/2001 Parker
6,289,175 B1 9/2001 De' Longhi et al.
6,297,096 B1 10/2001 Boaz
6,320,786 B1 11/2001 Chang et al.
6,322,903 B1 11/2001 Siniaguine et al.
6,351,406 B1 * 2/2002 Johnson ..... G11C 11/5692 365/103
6,356,478 B1 3/2002 McCollum
6,363,013 B1 3/2002 Lu et al.
6,380,068 B2 4/2002 Jeng et al.
6,396,741 B1 5/2002 Bloom et al.
6,420,215 B1 * 7/2002 Knall ..... H01L 21/822 257/E21.606
6,434,053 B1 * 8/2002 Fujiwara ..... G11C 16/0466 257/324
6,436,768 B1 8/2002 Yang et al.
6,458,642 B1 10/2002 Yeh et al.
6,469,343 B1 10/2002 Miura et al.
6,487,114 B2 11/2002 Jong et al.
6,512,696 B1 1/2003 Fan et al.
6,522,585 B2 2/2003 Pasternak
6,538,923 B1 3/2003 Parker
6,552,386 B1 4/2003 Wu et al.
6,566,699 B2 5/2003 Eitan et al.
6,587,903 B2 7/2003 Roohparvar
6,605,840 B1 8/2003 Wu
6,614,070 B1 9/2003 Hirose et al.
6,614,694 B1 9/2003 Yeh et al.
6,617,639 B1 9/2003 Wang et al.
6,643,181 B2 11/2003 Sofer et al.
6,643,185 B1 11/2003 Wang et al.
6,645,813 B1 11/2003 Hsieh et al.
6,646,924 B1 11/2003 Tsai et al.
6,653,712 B2 11/2003 Knall et al.
6,653,733 B1 11/2003 Gonzalez et al.
6,657,252 B2 12/2003 Fried et al.

(56) References Cited

U.S. PATENT DOCUMENTS 6,657,894 B2 12/2003 Yeh et al.
6,670,240 B2 12/2003 Ogura et al.
6,670,671 B2 12/2003 Sasago et al.
6,674,138 B1 1/2004 Halliyal et al.
6,677,200 B2 1/2004 Lee et al.
6,690,601 B2 2/2004 Yeh et al.
6,709,928 B1 3/2004 Jenne et al.
6,714,457 B1 3/2004 Hsu et al.
6,720,614 B2 4/2004 Lin et al.
6,720,630 B2 4/2004 Mandelman et al.
6,727,544 B2 * 4/2004 Endoh ..... H01L 27/115 257/296
6,731,544 B2 5/2004 Han et al.
6,734,065 B2 5/2004 Yim et al.
6,737,675 B2 5/2004 Patel et al.
6,740,928 B2 5/2004 Yoshii et al.
6,744,105 B1 6/2004 Chen et al.
6,750,525 B2 6/2004 Yim et al.
6,756,631 B2 * 6/2004 Wu ..... H01L 27/115 257/316
6,768,661 B2 7/2004 Vyvoda et al.
6,784,480 B2 8/2004 Bhattacharyya
6,795,357 B1 9/2004 Liu et al.
6,798,012 B1 9/2004 Ma et al.
6,815,764 B2 11/2004 Bae et al.
6,815,805 B2 11/2004 Weimer
6,818,558 B1 11/2004 Rathor et al. ..... H01L 27/115 257/E21.679
6,825,523 B2 11/2004 Caprara et al.
6,829,175 B2 12/2004 Tsai et al.
6,841,813 B2 1/2005 Walker et al.
6,849,905 B2 2/2005 Ilkbahar et al.
6,856,551 B2 2/2005 Mokhlesi et al.
6,858,899 B2 2/2005 Mahajani et al.
6,858,906 B2 2/2005 Lee et al.
6,881,994 B2 4/2005 Lee et al.
6,885,044 B2 4/2005 Ding
6,888,750 B2 5/2005 Walker et al.
6,891,262 B2 5/2005 Nomoto et al.
6,897,514 B2 5/2005 Kouznetsov et al.
6,897,533 B1 5/2005 Yang et al.
6,911,691 B2 6/2005 Tomiie et al.
6,912,163 B2 6/2005 Zheng et al.
6,925,007 B2 8/2005 Harari et al.
6,927,448 B2 8/2005 Liu
6,933,555 B2 8/2005 Hsieh et al.
6,937,511 B2 8/2005 Hsu et al.
6,942,320 B2 9/2005 Chung et al.
6,970,383 B1 11/2005 Han et al.
6,977,201 B2 12/2005 Jung
6,995,424 B2 2/2006 Lee et al.
6,996,011 B2 2/2006 Yeh et al.
7,005,349 B2 2/2006 Lee et al.
7,005,366 B2 2/2006 Chau et al.
7,009,882 B2 3/2006 Chen et al.
7,012,297 B2 3/2006 Bhattacharyya
7,015,540 B2 3/2006 Ishii et al.
7,018,895 B2 3/2006 Ding
7,026,682 B2 4/2006 Chung et al.
7,042,045 B2 5/2006 Kang et al.
7,133,317 B2 5/2006 Liao et al.
7,057,234 B2 6/2006 Tiwari
7,071,061 B1 7/2006 Pittikoun et al.
7,075,828 B2 7/2006 Lue et al.
7,078,762 B2 7/2006 Ishii et al.
7,106,625 B2 9/2006 Yeh
7,115,469 B1 10/2006 Halliyal et al.
7,115,942 B2 10/2006 Wang
7,120,059 B2 10/2006 Yeh
7,129,538 B2 10/2006 Lee et al.
7,133,313 B2 11/2006 Shih
7,135,734 B2 11/2006 Eldridge et al.
7,151,692 B2 12/2006 Wu
7,154,143 B2 12/2006 Jung et al.
7,154,779 B2 12/2006 Mokhlesi et al.
7,157,769 B2 1/2007 Forbes
7,158,420 B2 1/2007 Lung
7,164,603 B2 1/2007 Shih et al.
7,166,513 B2 1/2007 Hsu et al.
7,187,590 B2 3/2007 Zous et al.
7,190,614 B2 3/2007 Wu
7,209,386 B2 4/2007 Yeh
7,209,389 B2 4/2007 Lung et al.
7,209,390 B2 4/2007 Lue et al.
7,242,622 B2 6/2007 Hsu et al.
7,250,646 B2 7/2007 Walker et al.
7,279,740 B2 10/2007 Bhattacharyya et al.
7,315,474 B2 1/2008 Lue
7,399,674 B2 7/2008 Chen et al.
7,416,940 B1 * 8/2008 Torii et al. ..... 438/257
7,426,140 B2 9/2008 Lue
7,442,988 B2 10/2008 Oh et al.
7,473,589 B2 1/2009 Lai et al.
7,646,056 B2 1/2010 Choi et al.
7,709,334 B2 5/2010 Lai et al.
7,851,848 B2 12/2010 Lue et al.
8,094,497 B2 1/2012 Lue et al.
8,101,989 B2 1/2012 Lue
8,482,052 B2 7/2013 Lue et al.
8,937,340 B2 1/2015 Lue et al.
2001/0012663 A1 8/2001 Magri' et al.
2001/0045615 A1 11/2001 Ajit
2001/0055838 A1 12/2001 Walker et al.
2002/0167844 A1 11/2002 Han et al.
2002/0179958 A1 12/2002 Kim
2003/0023603 A1 1/2003 Ellison et al.
2003/0025147 A1 2/2003 Nomoto et al.
2003/0030100 A1 2/2003 Lee et al.
2003/0032242 A1 2/2003 Lee et al.
2003/0036250 A1 2/2003 Lin et al.
2003/0042534 A1 3/2003 Bhattacharyya
2003/0047755 A1 3/2003 Lee et al.
2003/0067032 A1 4/2003 Caprara et al.
2003/0146465 A1 8/2003 Wu
2003/0185055 A1 10/2003 Yeh et al.
2003/0224564 A1 12/2003 Kang et al.
2004/0070020 A1 * 4/2004 Fujiwara ..... G11C 16/0475 257/314
2004/0079983 A1 4/2004 Chae et al.
2004/0084714 A1 5/2004 Ishii et al.
2004/0108512 A1 6/2004 Iwata et al.
2004/0119122 A1 6/2004 Ilkbahar et al.
2004/0124466 A1 * 7/2004 Walker ..... H01L 27/115 257/344
2004/0125629 A1 7/2004 Scheuerlein et al.
2004/0145024 A1 * 7/2004 Chen ..... G11C 16/0483 257/390
2004/0151024 A1 * 8/2004 Fricke ..... G11C 13/0004 365/177
2004/0183126 A1 9/2004 Bae et al.
2004/0214379 A1 * 10/2004 Lee ..... G11C 16/3427 438/149
2004/0251489 A1 12/2004 Jeon et al.
2004/0256679 A1 12/2004 Hu
2005/0001258 A1 1/2005 Forbes
2005/0006696 A1 1/2005 Noguchi et al. ..... H01L 27/115 257/316
2005/0023603 A1 2/2005 Eldridge et al.
2005/0062091 A1 3/2005 Ding
2005/0062098 A1 3/2005 Mahajani et al.
2005/0074937 A1 4/2005 Jung
2005/0093054 A1 5/2005 Jung
2005/0157549 A1 7/2005 Mokhlesi et al.
2005/0167731 A1 8/2005 Lee et al.
2005/0184329 A1 * 8/2005 Prall ..... G11C 16/04 257/314
2005/0218522 A1 10/2005 Nomoto et al.
2005/0219906 A1 10/2005 Wu
2005/0237801 A1 10/2005 Shih
2005/0237809 A1 10/2005 Shih et al.
2005/0237813 A1 10/2005 Zous et al.
2005/0237815 A1 10/2005 Lue et al.
2005/0237816 A1 10/2005 Lue et al.
2005/0253182 A1 * 11/2005 Hung et al. ..... 257/315

(56) References Cited

U.S. PATENT DOCUMENTS

| | | | | |
|---|---|---|---|---|
| 2005/0255652 | A1 | 11/2005 | Nomoto et al. | |
| 2005/0270849 | A1 | 12/2005 | Lue | |
| 2005/0281085 | A1 | 12/2005 | Wu | |
| 2006/0007732 | A1 | 1/2006 | Yeh | |
| 2006/0043463 | A1* | 3/2006 | Liu et al. | 257/316 |
| 2006/0044872 | A1 | 3/2006 | Nazarian | |
| 2006/0088983 | A1 | 4/2006 | Fujisawa et al. | |
| 2006/0110880 | A1* | 5/2006 | Yuan | H01L 27/115 438/257 |
| 2006/0118858 | A1 | 6/2006 | Jeon et al. | |
| 2006/0197145 | A1 | 9/2006 | Pittikoun et al. | |
| 2006/0198189 | A1 | 9/2006 | Lue et al. | |
| 2006/0198190 | A1 | 9/2006 | Lue | |
| 2006/0202252 | A1 | 9/2006 | Wang et al. | |
| 2006/0202256 | A1 | 9/2006 | Harari | |
| 2006/0202261 | A1 | 9/2006 | Lue et al. | |
| 2006/0228859 | A1* | 10/2006 | Willer | H01L 27/11519 438/257 |
| 2006/0234446 | A1 | 10/2006 | Wei et al. | |
| 2006/0245246 | A1 | 11/2006 | Lung | |
| 2006/0249753 | A1 | 11/2006 | Herner et al. | |
| 2006/0258090 | A1 | 11/2006 | Bhattacharyya et al. | |
| 2006/0261401 | A1 | 11/2006 | Bhattacharyya | |
| 2006/0275986 | A1 | 12/2006 | Kobayashi et al. | |
| 2006/0281260 | A1 | 12/2006 | Lue | |
| 2007/0012988 | A1 | 1/2007 | Bhattacharyya | |
| 2007/0029625 | A1 | 2/2007 | Lue et al. | |
| 2007/0031999 | A1 | 2/2007 | Ho et al. | |
| 2007/0032018 | A1 | 2/2007 | Tuntasood et al. | |
| 2007/0045706 | A1* | 3/2007 | Bhattacharyya | B82Y 10/00 257/314 |
| 2007/0045718 | A1 | 3/2007 | Bhattacharyya | |
| 2007/0069283 | A1 | 3/2007 | Shih et al. | |
| 2007/0076477 | A1 | 4/2007 | Hwang et al. | |
| 2007/0117323 | A1 | 5/2007 | Yeh | |
| 2007/0120179 | A1 | 5/2007 | Park et al. | |
| 2007/0138539 | A1 | 6/2007 | Wu et al. | |
| 2008/0099830 | A1 | 5/2008 | Lue et al. | |
| 2008/0116506 | A1 | 5/2008 | Lue | |
| 2008/0285350 | A1 | 11/2008 | Yeh | |
| 2009/0039417 | A1 | 2/2009 | Chen et al. | |
| 2009/0253257 | A1* | 10/2009 | Jang et al. | 438/592 |
| 2010/0155823 | A1 | 6/2010 | Lue et al. | |

FOREIGN PATENT DOCUMENTS

| | | | |
|---|---|---|---|
| EP | 1079666 | | 2/2001 |
| EP | 1411555 | | 4/2004 |
| EP | 1411555 | A2 | 4/2004 |
| EP | 01677311 | | 7/2006 |
| EP | 01677311 | A1 | 7/2006 |
| EP | 01677312 | | 7/2006 |
| EP | 01677312 | A1 | 7/2006 |
| EP | 1689002 | A2 | 8/2006 |
| JP | 09162313 | | 6/1997 |
| JP | 11040682 | | 2/1999 |
| JP | 11233653 | | 8/1999 |
| JP | 2002368141 | A | 12/2002 |
| JP | 2004363329 | | 12/2004 |
| JP | 2004363329 | A | 12/2004 |
| WO | 9428551 | A1 | 12/1994 |
| WO | 0137347 | A1 | 5/2001 |

OTHER PUBLICATIONS

Aleskin et al. "Hole tunneling through a heterobarrier," May 1994, American Institute of Physics, JETP 78(5), pp. 751-759.*

Spitzer et al. "Barrier Height Studies on Metal-Semiconductor Systems," Oct. 1963, Journal of Applied Physics, vol. 34, No. 10, pp. 3061-3069.*

Sung et al., "Multi-Layer SONOS with Direct Tunnel Oxide for High Speed and Long Retention Time," IEEE 2002 Silicon Nanoelectronics Workshop, Jun. 2002, pp. 83-84.

Takata, et al., "New Non-Volatile Memory with Extremely High Density Metal Nano-Dots," IEEE IEDM Dec. 8-10, 2003, 22.5.1-22.5.4.

Tsai et al., "Novel SONOS-Type Nonvolatile Memory Device with Suitable Band Offset in HfAIO Charge-Trapping Layer," Int'l Symp. on VLSI Tech, Systems and Applications Apr. 23-25, 2007, 2 pages.

Tsai, et al., "Data Retention Behavior of a SONOS Type two-Bit Storage Flash Memory Cell," Electron Devices Meeting, 2001. IEDM Technical Digest International, Dec. 2-5, 2001 pp. 32.6.1-32.6.4.

U.S. Appl. No. 60/585,657, filed Jul. 6, 2004, 33 pages.

U.S. Appl. No. 60/585,658, filed Jul. 6, 2004, 27 pages.

Walker et al., "3D TFT-Sonos Memory Cell for Ultra-High Density File Storage Applications," 2003 Symposium on VLSI Tech Digest of Technical Papers, Jun. 10-12, 2003, 29-30.

Wang, Tahui, et al., "Reliability Models of Data Retention and Read-Disturb in 2-bit Nitride Storage Flash Memory Cells," Electron Devices Meeting, 2003 IEDM '03 Technical Digest. IEEE International , Dec. 8-10, 2003, pp. 7.4.1-7.4.4.

White et al., "On the Go with SONOS" IEEE Circuits and Devicces, vol. 16, issue 4, Jul. 2000, 22-31.

Xuan et al., "FinFET SONOS Flash Memory for Embedded Applications," IEEE IEDM, Dec. 8-10, 2003, pp. 26.4.1-26.4.4.

Yeh, C. C., et al., "Phines: a Novel Low Power Program/Erase, Small Pitch 2-Bit per Cell Flash Memory," IEDM Dec. 8-11, 2002, 931-934.

Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International, Dec. 8-10, 2003, pp. 7.5.1-7.5.4.

Bak et al. "High Speed and Nonvolatile Si Nanocrystal Memory for Scaled Flash Technology using Highly Field-Sensitive Tunnel Barrier," IEEE IEDM 03-545, Dec. 8-10, 2013, pp. 22.3.1-22.3.4.

Blomme et al., "Multilayer tunneling barriers for nonvolatile memory applications," Device Research Conf, 2002 60th DRC Digest, Jun. 24-26, 2002, pp. 153-154.

Blomme et al., Write/Erase Cycling Endurance of Memory Cells With SiO2/HfO2 Tunnel Dielectric, IEEE Transactions on Device and Materials Reliability, vol. 4, No. 3, Sep. 2004, pp. 345-351.

Buckley, J. et al., "Engineering of 'Conduction band—Crested Barriers' or 'Dielectric Constant—Crested Barriers' in view of their application of floating-gate non-volatile memory devices," VLSI 2004, 55-56.

Bude, J.D., et al. "Secondary Electron Flash—a High Performance, Low Power Flash Technology for 0.35 .mu.m and Below," Electron Devices Meeting, 1997. Technical Digest, International, Dec. 7-10, 1997, 279-282.

Chang, Kuo-Tung, et al., "A New Sonos Memory Using Source-Side Injection for Programming," IEEE Electron Device Letters, vol. 19, No. 7, Jul. 1998, 253-255.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

Chung, Steve S., "Low Voltage/Power and High Speed Flash Memory Technology for High Performance and Reliability," The 3rd WIMNACT—Singapore, Oct. 15, 2003, 1-48.

De Blauwe, Jan, "Nanocrystal Nonvolatile Memory Devices," IEEE Transactions on Nanotechnology, vol. 1, No. 1, Mar. 2002, 72-77.

Eitan, Boaz, "Can NROM, a 2-bit, Trapping Storage NVM Cell, Give a Real Challenge to Floating Gate Cells?" SSDM, Tokyo, Japan (1999), 3 pages.

Fujiwara, I., et al., "0.13 .mu.m MONOS single transistor memory cell with departed source lines," IEDM Dec. 6-9 1998, 395-998.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE 2003, pp. 299-302, SISPAD Intl. Conf. Sep. 3-5, 2003.

(56) References Cited

OTHER PUBLICATIONS

Govoreanu, et al., "Variot: A Novel Multilayer Tunnel Barrier Concept for Low-Voltage Nonvolatile Memory Devices." IEEE Electron Device Letters, vol. 24, No. 2, Feb. 2003, pp. 99-101.
Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.
Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, p. 2-3, pluse 24 pages from outline.
Hsu et al., "Split-Gate NAND Flash Memory at 120nm Technology Node Featuring Fast Programming and Erase," 2004 Symposium on VLSI Technology, Digest of Technical Papers, Jun. 15-17, 2004, pp. 78-79.
Huff, H.R. and Bevan, M. assemblers, "Questions at the International Workshop on Gate Insulators," Ad Hoc Meeting on High-k gate Dieletrics at the Semiconductor Interface Specialists Conference, Nov. 30, 2001, 3 pages.
Ito, et al., "A Novel MNOS Technology Using Gate Hole Injection in Erase Operation for Embedded Nonvolatile Memory Applications." 2004 Symp. on VLSI Tech Dig. of Papers, Jun. 15-17, 2004, 80-81.
Janai, Meir, "Data Retention, Endurance and Acceleration Factors of NROM Devices," IEEE 41st Annual International Reliability Physics Symposium, Dallas, Texas, Mar. 30, 2003-Apr. 4, 2003, 502-505.
Kim, et al., "The Effects of ONO thickness on Memory Characteristics in Nano-scale Charge Trapping Devices," Int'l Symp on VLIS Technology, Systems and Applications, Apr. 23-25, 2007, pp. 1-2.
Kobayashi, T., et al., "A Giga-scale Assist-gate (AG0-AND-Type Flash Memory Cell with 20-MB/s Programming Throughput for Content-Downloading Applications," IEDM Dec. 2-5, 2001, 2.2.1-2.2.4.
Lahiri, S. K., "MNOS/Floating-Gate Charge Couples Devices for High Density EEPROMS: A New Concept", Physics of Semiconductor Devices, Dec. 1997, pp. 951-956, voil. 3316, No. 2.
Lai et al., "A Highly Stackable Thin-Film Transistor (TFT) NAND-Type Flash Memory," IEEE 2006 Symposium on VLSI Technology Digest of Technical Papers, Jun. 13-17, 2007, Hawaii, 2 pages.
Lai et al., "A Multi-Layer Stackable Thin-Film Transistor (TFT) NAND-Type Flash Memory," Electron Devices Meeting, IEDM 2006, Int'l Dec. 11-13, 2006, 4 pages.
Lai et al., "A Study on the Erase and Retention Mechanisms for MONOS, MANOS, and BE-SONOS Non-Volatile Memory Devices," Int'l Symp on VISI Technology, Systems and Applications, Apr. 23-25, 2007, pp. 1-2.
Lee, et al., "A Novel SONOS Structure of Si02/SiN/Al203 with TaN Metal Gate for Multi-GigaBit Flash Memories," IEEE Dec. 3-10, 2003, 4 pages.
Lee, et al., "A Novel Structure of Si02/SiN/High k Dielectrics, Al2)3 for SONOS Type Flash Memory," Extended Abstracts of the 2002 International Conference on Solid State Devices and Materials, Sep. 17-19, 2002, Nagoya, 162-163.
Lee, et al., "Effects of Floating-Gate Interface on NAND Flash memory Cell Operation," IEEE Electron Device Letters, vol. 23, No. 5, May 2002, 264-266.
Lee, et al., "Operational and Reliability Comparison of Discrete-Storage Nonvolatile Memories: Advantages of Single-and Double-Layer Metal Nanocrystals," IEEE IEDM 03-557 22.6.1-22.6.4, Dec. 8-10, 2003.
Likharev, "Layered tunnel barriers for nonvolatile memory devices," Applied Physics Letters, vol. 73, No. 15, Oct. 1998, pp. 2137-2139.
Liu, et al., "A New Programming Technique for Flash Memory Devices," International Symposium on VLSI Technology, Systems and Applications, Jun. 8-10, 1999, 195-198.
Lue et al., "A BE-SONOS (Bandgap Engineered SONOS) NAND for Post-Floating Gate Era Flash Memory," Int'l Symp VLSI Tech, Apr. 23-25, 2007, 2 pages.
Lue et al., "A Novel P-Channel NAND-Type Flash memory 2-bit/cell Operation and High Programming Throughput (>20MB/sec)," IEEE Dec. 5-7, 2005, 4 pages.
Lue et al., "BE-SONOS: A Bandgap Engineered SONOS with Excellent Performance and Reliability," IEDM Tech Digest, IEEE Int'l Dec. 2005, 547-550.
Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.
Lusky, Eli et al., "Spatial characterization of Channel hot electron injection Utilizing subthreshold slope of the localized charge storage NROM memory device," Non-Volatile Semiconductor Memory Workshop, Monterey, CA (Aug. 2001) 2 pages.
Minami, et al., "New Scaling Guidelines for MNOS Nonvolatile Memory Devices," IEEE Trans on Electron Devices 38 (11) Nov. 19912519-2526, Nov. 11, 1991.
Naruke, et al., "A new flash-erase EEPROM cell with a sidewall select-gate on its source side," Int'l Electron Devices Meeting IEDM 1989. Dec. 3-6, 1989 pp. 603-606.
Rippard, W.H., et al., "Ultrathin Aluminum Oxide Tunnel Barriers," Phys. Rev. Lett. 88(4), Jan. 28, 2002, 4 pages.
Sasago, et al., "90-nm-node multi-level AG-AND type flash memory with cell size of true 2 F/sup 2//bit and programming throughput of 10 MB/s," IEDM, Dec. 8-10, 2003, pp. 823-826.
Shih et al., "A Novel 2-bit/cell Nitride Storage Flash memory with Greater than 1M P/E-cycle Endurance," IEEE Dec. 13-15, 2004, pp. 36.3.1-36.3.4.
Shin, Yoocheol, et al., "High Reliable SONOS-type NAND Flash Memory Cell with Al203 for Top Oxide," Non-Volatile Semiconductor Memory Workshop, 2003, 2 pages.
TW Office Action dated Oct. 18, 2012.
The file history of U.S. Appl. No. 12/720,112.
Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.
Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.
Buckle, J ., et al., "Engineering of 'Conduction Band-Crested Barriers'or 'Dielectric Constant-Crested Barriers'in view of their application of floating-gate non-volatile memory devices," VLSI 2004, 55-56.
Chindalore, et al., "A New Combination-Erase Technique for Erasing Nitride Based (SONOS) Nonvolatile Memories," IEEE Electron Dev. Lett. 24(4) Apr. 2003, 257-259.
DiMaria, D.J., et al., "Conduction Studies in Silicon Nitride: Dark Currents and Photocurrents," IBM J. Res. Dev. May 1977,227-244.
Eitan, et al., "NROM: A Novel Localized Trapping, 2-Bit Nonvolatile Memory Cell," IEEE Electron Device Lett 21 ( 11) Nov. 2000, 543-545.
Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.
Hinkle, C.L., et al., "Enhanced tunneling in stacked gate dielectrics with ultra-thin Hf02 (Zr02) layers sandwiched between thicker Si02 layers," Surface Science, Sep. 20, 2004, vol. 566-568, 1185-1189.
Kim et al., "Robust Multi-Bit Programmable Flash Memory Using a Resonant Tunnel Barrier," Electron Dev. Mtg. Dec. 5-7, 2005, IEDM Technical Digest 861-864.
Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.
Search Report mailed May 9, 2008 in European Application No. 06000064.3 filed on Jan. 3, 2006, 3 pages.
Search Report mailed May 9, 2008 in European Application No. 06000093.2 (Pub. No. EP-01677312) filed on Jan. 3, 2006, 4 pages.
Search Report mailed Feb. 14, 2007 in European Application No. 060000643 filed on Jan. 3, 2006, 7 pages.
Search Report mailed Feb. 14, 2007 in European Application No. 06000093.2 (Pub. No. EP-01677312) filed on Jan. 3, 2006, 7 pages.

(56) References Cited

OTHER PUBLICATIONS

Search Report mailed Nov. 14, 2007 in European Application No. 060000643 (Pub. No. EP-01677312) filed on Jan. 3, 2006, 4 pages.
Search Report mailed Nov. 14, 2007 in European Application No. 06000093.2 (Pub. No. EP-01677312) filed on Jan. 3, 2006, 4 pages.
Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.
Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007,214-216.
Yamada et al., "A self-convergence erasing scheme for a simple stacked gate flash EEPROM," Proc. Int'l. Electron Devices Meeting, Dec. 1991 307-310.

* cited by examiner

LAYOUT EXAMPLE OF THIS VIRTUAL GROUND ARRAY.

EQUIVALENT CIRCUIT OF THE VIRTUAL GROUND ARRAY.

SILICON ON INSULATOR AND THIN FILM TRANSISTOR BANDGAP ENGINEERED SPLIT GATE MEMORY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application *is a reissue application of U.S. Pat. No. 8,937,340, issued from U.S. application Ser. No. 13/899,629, filed 22 May 2013, which* is a divisional of U.S. application Ser. No. 12/056,489, filed Mar. 27, 2008 (*now U.S. Pat. No. 8,482,052*). The U.S. application Ser. No. 12/056,489 is a continuation-in-part of U.S. patent application Ser. No. 11/831,594, filed Jul. 31, 2007 (*now U.S. Pat. No. 7,426,140*); which is a continuation of U.S. patent application Ser. No. 11/324,581, filed Jan. 3, 2006 (*now U.S. Pat. No. 7,315,474*), which is based upon, and claims priority under 35 U.S.C. §119(e) of provisional U.S. Patent Application No. 60/640,229, filed on Jan. 3, 2005; provisional U.S. Patent Application No. 60/647,012, filed on Jan. 27, 2005; provisional U.S. Patent Application No. 60/689,231, filed on Jun. 10, 2005; and provisional U.S. patent application No. 60/689,314, filed on Jun. 10, 2005; the entire contents of each of which are incorporated herein by reference. The U.S. application Ser. No. 12/056,489 is a continuation-in-part of U.S. patent application Ser. No. 11/425,959, filed on Jun. 22, 2006 (*now U.S. Pat. No. 7,709,334*), which claims priority to provisional U.S. Patent Application No. 60/748,807, filed on Dec. 9, 2005, the entire contents of each of which are incorporated herein by reference. The U.S. application Ser. No. 12/056,489 is a continuation-in-part of U.S. patent application Ser. No. 11/549,520, filed on Oct. 13, 2006 (*now U.S. Pat. No. 7,473,589*), which claims priority to provisional U.S. Patent Application No. 60/748,911, filed on Dec. 9, 2005, the entire contents of each of which are incorporated herein by reference. The U.S. application Ser. No. 12/056,489 claims the benefit of provisional U.S. Patent Application No. 60/980,788, filed on Oct. 18, 2007 and provisional U.S. Patent Application No. 61/018,589, filed on Jan. 2, 2008, the entire contents of each of which are incorporated herein by reference.

BACKGROUND OF THE INVENTION

Non-volatile memory ("NVM") refers to semiconductor memory which is able to continually store information even when the supply of electricity is removed from the device containing the NVM cell. NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed to prevent loss of programmed data. Typically, non-volatile memory can be programmed, read and/or erased based on the device's end-use requirements, and the programmed data can be stored for a long period of time.

Generally, non-volatile memory devices may have various designs. One example of an NVM cell design is the so-called SONOS (silicon-oxide-nitride-oxide-silicon) device, which may use a thin tunnel oxide layer, to allow hole direct tunneling erase operations. Although such designs may have good erase speed, the data retention is usually poor, in part because direct tunneling may occur even at a low electrical field strengths that may exist during a retention state of a memory device.

Another NVM design is NROM (nitrided read-only memory), which uses a thicker tunnel oxide layer to prevent charge loss during retention states. However, a thick tunnel oxide layer may impact channel erase speed. As a result, band-to-band tunneling hot-hole (BTBTHH) erase methods can be used to inject hole traps to compensate the electrons. However, the BTBTHH erase methods may cause some reliability issues. For example, the characteristics of NROM devices employing BTBTHH erase methods may degrade after numerous P/E (program/erase) cycles.

In addition, techniques have been explored to stack layers of memory arrays on a single integrated circuit in order to address the need for high-density non-volatile memory.

Thus, a need in the art exists for non-volatile memory cell designs and arrays which can be operated (programmed/erased/read) numerous times with improved data retention performance and increased operation speeds, and in addition are suitable for implementation in thin film structures and in stacked arrays.

BRIEF SUMMARY OF THE INVENTION

The present invention relates to junction-free, thin-film memory cells formed on silicon on insulator substrates and similar insulating structures, and to stacked junction free memory cells. An integrated circuit memory device is described comprising a semiconductor body formed on an insulating layer, such as on a silicon on insulator substrate; a plurality of gates arranged in series on the semiconductor body, the plurality of gates including a first gate in the series and a last gate in the series, with insulating members isolating gates in the series from adjacent gates in the series; and a charge storage structure on the semiconductor body. The charge storage structure includes dielectric charge trapping locations beneath more than one of the plurality of gates in the series, the charge storage structure including a tunnel dielectric structure disposed above the semiconductor body, a charge storage layer disposed above the tunnel dielectric structure, and an insulating layer disposed above the charge storage layer. The semiconductor body includes a continuous, junction-free, multiple-gate channel region beneath the plurality of gates in the series. The multiple-gate channel region may have one of n-type and p-type conductivity.

One embodiment of the present invention includes memory cells comprising: a semiconductor substrate having a source region and a drain region disposed below a surface of the substrate and separated by a channel region; a tunnel dielectric structure disposed above the channel region, the tunnel dielectric structure having a hole tunneling barrier height at an interface with the semiconductor body, and a hole tunneling barrier height spaced away from the interface that is less than the hole tunneling barrier height at an interface. A tunnel dielectric layer having this characteristic comprises a multi-layer structure including a layer in contact with the semiconductor body and at least one layer having a hole-tunneling-barrier height less than that of the layer in contact with the semiconductor body. A charge storage layer disposed above the tunnel dielectric structure; an insulating layer disposed above the charge storage layer; and a gate electrode disposed above the insulating layer.

Another embodiment of the present invention includes memory cells in contrast to the junction-free embodiments, comprising a semiconductor substrate having a source region and a drain region disposed below a surface of the substrate and separated by a channel region; a multi-layer tunnel dielectric structure disposed above the channel region, the multi-layer tunnel dielectric structure comprising at least one layer having a hole-tunneling-barrier height less than that of the layer in contact with the semiconductor body; a charge storage layer disposed above the multi-layer tunnel dielectric structure; an insulating layer disposed above the charge storage layer; and a gate electrode disposed above the insulating layer.

In certain preferred embodiments, the layer providing a smaller hole-tunneling-barrier height may contain materials such as silicon nitride ($Si_3N_4$) or hafnium oxide ($HfO_2$). In certain preferred embodiments of the present invention memory cells include a tunnel dielectric structure having multiple layers, such as a stacked dielectric tri-layer structure of silicon oxide, silicon nitride, and silicon oxide (ONO). Such tunnel dielectric structures provide a SONONOS (silicon-oxide-nitride-oxide-nitride-oxide-silicon) or a super-lattice SONONOS design.

In certain preferred embodiments of the present invention the tunnel dielectric structure can comprise at least two dielectric layers each having a thickness of up to about 4 nm. Additionally, in certain preferred embodiments of the present invention, the gate electrode comprises a material having a work function value greater than that of $N^+$ polysilicon.

In certain preferred embodiments, the tunnel dielectric structure can include a layer comprising a material having a small hole tunneling barrier height, wherein the material is present in the layer at a concentration gradient such that the concentration of the material is at a maximum at a depth point within the layer.

The present invention also includes non-volatile memory devices which comprise a plurality of memory cells (i.e., an array) in accordance with one or more of the embodiments described herein. As used herein, a "plurality" refers to two or more. Memory devices in accordance with the present invention exhibit significantly improved operational properties including increased erase speeds, improved charge retention and larger windows of operation.

The present invention also includes methods of operating non-volatile memory cells and arrays. Methods of operation in accordance with the present invention include resetting the memory devices by applying a self-converging method to tighten Vt distribution of the memory devices; programming at least one of the memory devices by channel +FN injection; and reading at least one of the memory devices by applying a voltage between an erased state level and a programmed state level of at least one of the memory devices. As used herein, the term "tighten" refers to the narrowing of the threshold voltage distribution among the many memory cells of an array. In general, threshold voltage distribution is "tightened" where the threshold voltages of several cells are within a narrow range of one another such that operation of the array is improved over conventional designs. For example, in some preferred embodiments, such as in a NAND array comprising memory cells in accordance with one or more embodiments of the present invention, a "tightened" threshold voltage distribution indicates that the threshold voltages of the various memory cells are within a 0.5V range of one another. In other array architectures employing memory cells in accordance with the present invention, the "tightened" threshold voltage distribution may have a range of about 1.0V from the upper limit to the lower limit.

One embodiment of a method of operation in accordance with the present invention includes operating an array in accordance with the present invention by applying self-converging reset/erase voltages to the substrate and the gate electrode in each memory cell to be reset/erased; programming at least one of the plurality of memory cells; and reading at least one of the plurality of memory cells by applying a voltage between an erased state level and a programmed state level of at least one of the memory devices.

The present invention also includes methods of forming a memory cell, comprising: providing a semiconductor substrate having a source region and a drain region formed therein below a surface of the substrate and separated by a channel region; forming a tunnel dielectric structure above the channel region, wherein forming the tunnel dielectric structure comprises forming at least two dielectric layers, wherein one of the at least two dielectric layers has a smaller hole tunneling barrier height than the other of the at least two dielectric layers; forming a charge storage layer above the tunnel dielectric structure; forming an insulating layer above the charge storage layer; and forming a gate electrode above the insulating layer.

According to an exemplary embodiment of junction-free technology, a semiconductor structure includes a plurality of first parallel semiconductor semiconductor body regions over a silicon-on-insulator substrate, the plurality of first semiconductor body regions being characterized by a first concentration of a first dopant type. A first select line and a second select line overlie and are substantially perpendicular to the first semiconductor body regions. A plurality of first parallel word lines are between the first select line and the second select line, each of the plurality of first word lines overlying a channel region in each of the first semiconductor body regions and being substantially perpendicular to the first semiconductor body regions. A first tunneling barrier, a first charge storage layer, and a first dielectric layer are between each of the first word lines and a corresponding channel region in each of the first semiconductor body regions. At least one first region is in each of the first semiconductor body regions. The at least one first region is adjacent to the first select line or the second select line. The at least one first region is characterized by a second dopant type. One or more second regions are in each of the first semiconductor body regions, each of the one or more second regions being between two neighboring channel regions, the one or more second regions being characterized by a second concentration of the first dopant type, wherein the one or more second regions are junction-free.

According to an exemplary embodiment of this SOI technology, the semiconductor structure further comprises a plurality of trench structures adjacent to and in parallel with the first semiconductor body regions, each of the trench structures separating two adjacent first semiconductor body regions.

According to an exemplary embodiment of this SOI technology, the first tunneling barrier includes a first oxide layer, a nitride layer and a second oxide layer.

According to an exemplary embodiment of this SOI technology, the first tunneling barrier, the first charge storage layer, and the first dielectric layer is an ONONO structure.

According to an exemplary embodiment of this SOI technology, the SOI substrate comprises an oxide layer over the substrate and under the first semiconductor body regions.

According to an exemplary embodiment of this SOI technology, the first region extends under at least one of the first select line and the second select line.

According to an exemplary embodiment of this SOI technology, the semiconductor structure is stacked providing multiple layers of junction-free, memory cells, such that it further comprises: a second dielectric layer over the first word lines. A plurality of second parallel semiconductor body regions with a third concentration of the first dopant type overlie the second dielectric layer. A plurality of second parallel word lines are between a third select line and a fourth select line, the second word lines, the third select line and the fourth select line being over and substantially perpendicular to the second semiconductor body regions. A second tunneling barrier, a second charge storage layer and a second dielectric layer are between the second word lines and the second semiconductor body regions. The second semiconductor body regions include at least one third region adjacent to the third select line and the fourth select line and fourth regions between two neighboring second word lines. The fourth regions are characterized with a fourth concentration of the first dopant type. A dimension of the first region is larger than that of the third region.

It is to be noted that in stacked, junction-free embodiments, the bottom layer can be implemented on a SOI substrate, or directly on a semiconductor bulk region, without an overlying layer of insulation.

According to another exemplary embodiment of this technology disclosed herein, a method for forming a semiconductor structure comprises forming a plurality of first parallel semiconductor body regions having a first conductivity type over a substrate. A first select line, a second select line and a plurality of first parallel word lines are formed over and substantially perpendicular to the first semiconductor body regions, the word lines configured between the first select line and the second select line. A first tunneling barrier, a first charge storage layer and a first dielectric layer are formed between the first semiconductor body regions and the word lines. First dielectric spacers are formed on a sidewall of the first select line and a sidewall of the second select line, while forming first dielectric materials between two neighboring word lines. First source/drain (S/D) regions having a second conductivity type are formed adjacent to the first select line and the second select line by using the first dielectric spacers as an implantation mask. A region is formed between two neighboring word lines. The region between neighboring word lines has a second concentration of the first type, wherein the region between two neighboring word lines is substantially junction-free.

According to an exemplary embodiment of this application, a method for operating a semiconductor structure is provided. The semiconductor structure comprises: a plurality of parallel semiconductor body regions over a substrate; a plurality of parallel word lines between a first select line and a second select line, the word lines including a selected word line and a plurality of unselected word lines, the word lines, the first select line and the second select line being over and substantially perpendicular to the semiconductor body regions; and a tunneling barrier, a charge storage layer and a dielectric layer between the word lines and the semiconductor body regions, wherein the semiconductor body regions include at least one first region adjacent to the first select line and the second select line and second regions between two neighboring word lines, wherein the first region has a dopant concentration higher than that of the second regions and wherein at least one of the second regions is junction-free. The method comprises applying a first voltage to the first select line and the second select line; applying a second voltage to the word lines, the first voltage being higher than the second voltage; and applying a third voltage to the semiconductor body regions to reset the semiconductor structure, the third voltage being higher than the second voltage.

As used herein, the phrase "small hole tunneling barrier height" refers generally to values which are less than the approximate hole tunneling barrier height at a silicon dioxide/silicon interface. In particular, a small hole tunneling barrier height is preferably less than about 4.5 eV. More preferably, a small hole tunneling barrier height is less than or equal to about 1.9 eV.

A junction-free TFT NAND device for multiple stackable 3D Flash memory is proposed. The TFT NAND has no diffusion junction (such as N+-doped junction) in the memory array. Diffusion junctions are only fabricated outside the array select transistors BLT and SLT.

An inversion layer will be induced by the wordline fringing field when the space between each wordline is small (for example, a 75 nm node). The junction-free TFT NAND structure avoids the junction punch through after repeating thermal budget. Short-channel effect can be suppressed. Thus this technique enables multiple short stacks of TFT NAND structure, achieving very high density.

3D Flash memory has attracted a lot of attention recently. 3D multiple stacks of memory enables much higher density than the conventional single-layer memory devices.

Traditional doped junction (such as n+ doped junction) has a large lateral diffusion after thermal process. The lateral diffusion is serious for very short channel device. The short-channel effect becomes more serious for a 3D Flash with multiple stacks of TFT NAND devices. The bottom layers have much larger thermal budgets so that lateral diffusion of the junction causes a severe punch through, which seriously degrades the short channel effect performance.

The junction-free NAND described herein enables multiple stacks and junction only diffuses at the array boundary, which offers a large process window to avoid punch-through.

Unlike conventional devices where the junction is formed before the spacers, a method for manufacturing the junction-free TFT NAND includes forming the junction after the spacers between the wordlines are formed. The spacer between each wordline is completely filled without a gap due to the small pitch of the TFT NAND array. Therefore, the junction IMP is blocked by the spacers inside the memory array, and junctions are instead formed outside the array.

In an alternative method one additional mask is introduced which overlays the wordlines and the BLT and SLT, and the junction IMP is carried out.

Simulation results show that an inversion layer can be induced underlying the spacers due to the fringing field from the high electric field on the wordlines, such that there is no need to fabricate n+-doped regions.

The devices described herein also include p-channel TFT NAND, where n-well and P+ junction are used.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1B:
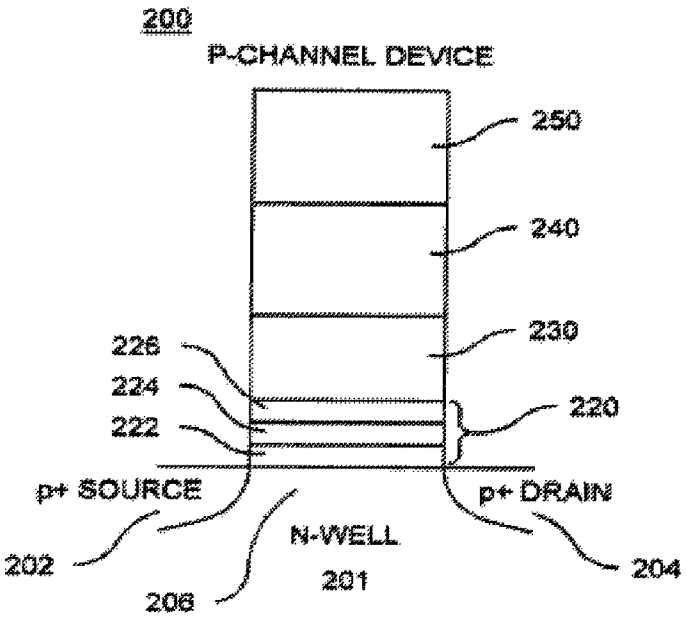
FIGS. 1a and 1b are cross-sectional schematic representations of an N-channel memory cell in accordance with one embodiment of the present invention and a P-channel memory cell in accordance with one embodiment of the present invention, respectively.

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the non-graph drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that are known in the art or to be developed.

Memory cells in accordance with the present invention can overcome some of the reliability issues in SONOS and NROM devices. For example, memory cell structures in accordance with the present invention may allow fast FN channel erase methods, while at the same time, maintaining good charge retention characteristics. Various embodiments of the memory cells according to the present invention can also alleviate reliance on the BTBTHH erase method, thereby avoiding device degradation after numerous P/E cycles.

One example may employ an ultra-thin tunnel dielectric or ultra-thin oxide layer in conjunction with the small hole tunneling barrier height layer in embodiments where the tunnel dielectric structure is a multilayer structure. This may provide better stress immunity. Non-volatile memory cells according to the present invention also show little degradation after numerous P/E cycles.

Figure 1A:
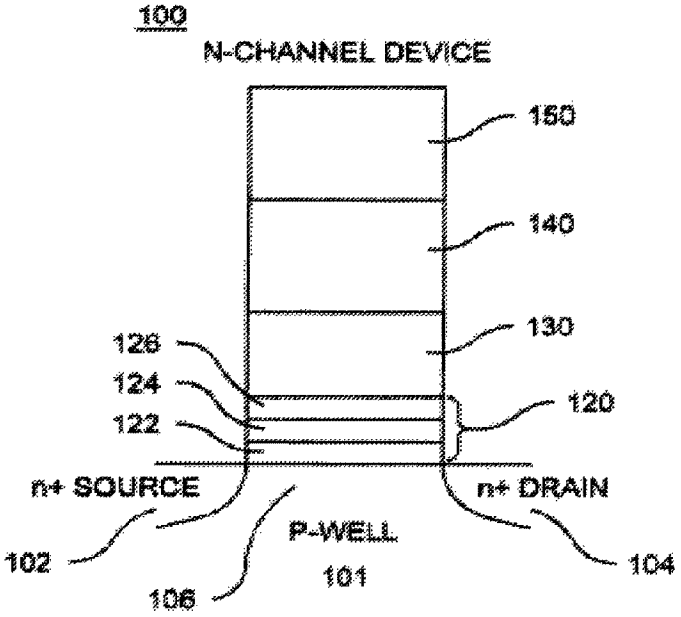

Memory cells according to the present invention may employ either an n-channel or a p-channel design, such as shown in FIGS. 1a and 1b. FIG. 1a depicts a cross-sectional view of an n-channel memory cell 100 in accordance with one embodiment of the present invention. The memory cell includes a p-type substrate 101 containing at least two n-doped regions 102 & 104, wherein each of the doped regions 102 & 104 may function as either a source or drain depending upon voltages applied. As shown in FIG. 1a, for reference purposes, doped region 102 can serve as the source and doped region 104 can serve as the drain. The substrate 101 further includes a channel region 106 between the two n-doped regions. Above the channel region 106, on the surface of the substrate 101, is a tunnel dielectric structure 120. In certain preferred embodiments, the tunnel dielectric structure 120 can comprise a tri-layer thin ONO structure wherein a small hole-tunneling-barrier height nitride layer 124 is sandwiched between a thin lower oxide layer 122 and an upper thin oxide layer 126. The memory cell 100 further includes a charge-trapping (or charge storage) layer 130, preferably a nitride, above the tunnel dielectric structure 120, and an insulating layer 140, preferably comprising a blocking oxide, disposed above the charge-trapping layer 130. A gate 150 is disposed on the insulating layer 140.

FIG. 1b, depicts a cross-sectional view of an p-channel memory cell 200 in accordance with one embodiment of the present invention. The memory cell includes an n-type substrate 201 containing at least two p-doped regions 202 & 204, wherein each of the doped regions 202 & 204 may function as either a source or drain. The substrate 201 further includes a channel region 206 between the two p-doped regions. The p-channel memory cell 200 similarly includes a tunnel dielectric structure 220, comprising a tri-layer thin ONO structure wherein a small hole-tunneling-barrier height nitride layer 224 is sandwiched between a thin lower oxide layer 222 and an upper thin oxide layer 226, a charge-trapping (or charge storage) layer 230, an insulating layer 240, and a gate 250.

Thus, for example, as depicted in FIGS. 1a and 1b, memory cells in accordance with the present invention may include: a multi-layer thin film tunnel dielectric structure, including a first silicon oxide layer O1, a first silicon nitride layer N1, and a second silicon oxide layer O2; a charge-storage layer, such as a second silicon nitride layer N2; and an insulating layer such as a third silicon oxide layer O3, on or over ("above") a substrate, such as a semiconductor substrate (e.g., a silicon substrate). The tunneling dielectric structure allows hole tunneling from the substrate to the charge-storage layer during an erase/reset operation of the memory device. Preferably, the tunnel dielectric structure in a non-volatile memory cell of the present invention has a negligible charge-trapping efficiency, and more preferably, does not trap charge at all during memory operations.

Charge storage materials such as a silicon nitride layer, $HfO_2$, and $Al_2O_3$ may be used as the small hole tunneling barrier height layer in a tunnel dielectric structure. In certain preferred embodiments of the present invention, an efficient charge storage material, such as a silicon nitride can be used as a charge storage layer in the memory device. A blocking oxide that prevents charge loss may serve as an insulating layer, such as a third silicon oxide layer O3. The memory cells according to the present invention also include a gate or gate electrode, such as a polysilicon gate, above the insulating layer. The tunnel dielectric structure, charge storage layer, insulating layer and gate can be formed above the substrate above at least a portion of a channel region, which is defined by and is disposed between a source region and a drain region.

Memory cells according to various embodiments of the present invention comprise a tunnel dielectric structure which can provide fast FN erase speeds of around 10 msec under a negative gate voltage (Vg), such as a Vg of about −10 to about −20 V. On the other hand, the charge retention can still be maintained, and, in some examples, may be better than many conventional SONOS devices. Memory cells according to the present invention can also avoid the use of band-to-band hot hole erase operations, which, are commonly used in NROM devices. Avoidance of such band-to-band hot hole erase operations may greatly eliminate hot-hole introduced damages and such avoidance is therefore desirable.

Figure 2:
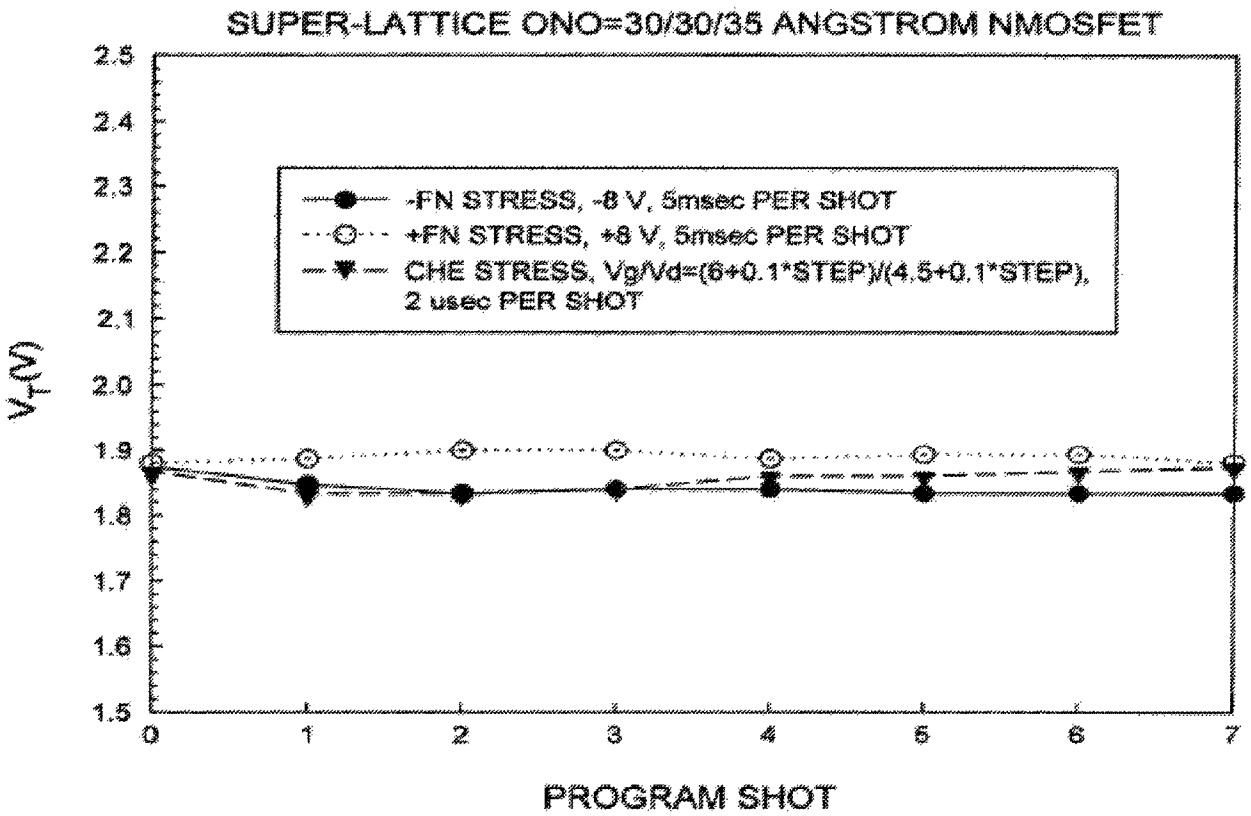
FIG. 2 is a graphical representation of the threshold voltage (charge trapping capacity) of a tunnel dielectric structure in accordance with one embodiment of the present invention under various programming methods.

Referring to FIG. 2, experimental measurements of threshold voltage for a tunnel dielectric structure in accordance with one embodiment of the present invention shows that an ultra-thin O1/N1/O2 structure can have a negligible trapping efficiency, as evidenced by the unchanged threshold voltage level under successive programming pulses. In the example tested for FIG. 2, the O1/N1/O2 layers had thicknesses of 30, 30 and 35 angstroms (Å), respectively. As shown in FIG. 2, the threshold voltage Vt remains steady at approximately 1.9 volts over the course of several program shots using various methods of programming, namely −FN programming, +FN programming and CHE (channel hot electron) programming. Thus, such an ultra thin O1/N1/O2 film may serve as a modulated tunnel dielectric structure because charge trapping appears to be negligible in the structure having nitride layer of 30 Angstroms or less. The results under various charge injection methods including CHE, +FN and −FN all suggest negligible charge trapping. Manufacturing processes or device structures may be designed to minimize interfacial traps, so that neither O1/N1 nor N1/O2 interface is active.

Figure 3:
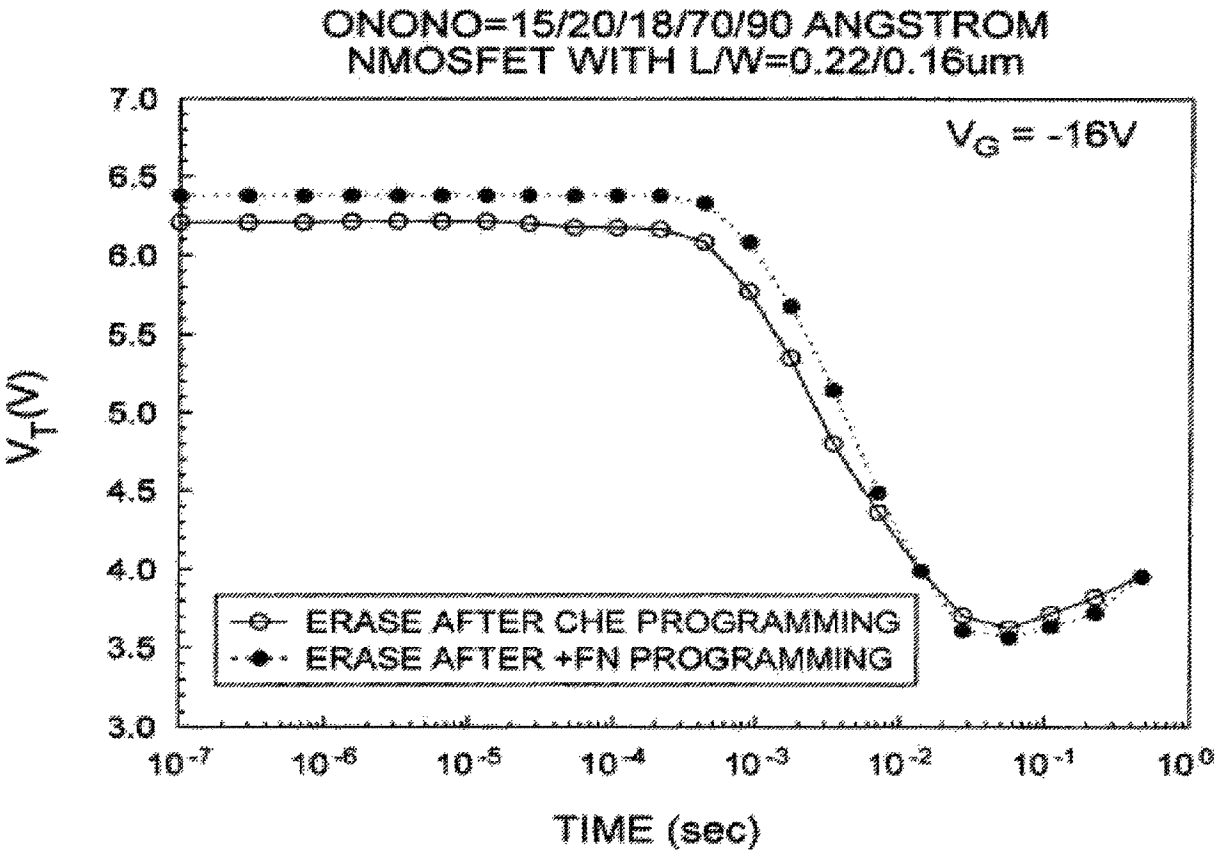
FIG. 3 is a graphical representation of the threshold voltage of a SONONOS memory cell in accordance with one embodiment of the present invention over time during erase.

FIG. 3 illustrates the erase characteristics of a memory cell having a SONONOS design in accordance with one embodiment of the present invention. The memory cell in the embodiment described in FIG. 3 comprises an n-MOSFET design with an ONO tunnel dielectric structure having thicknesses of 15 Å, 20 Å and 18 Å, respectively. The memory cell of this embodiment comprises a silicon nitride charge storage layer having a thickness of about 70 Å, an insulating silicon oxide layer with a thickness of about 90 Å, and a gate comprising any suitable conductive material, for example, n-doped polycrystalline silicon. Referring to FIG. 3, fast FN erase may be achieved, such as within 10 msec, and an excellent self-convergent erase properties may also be obtained.

Figure 4:
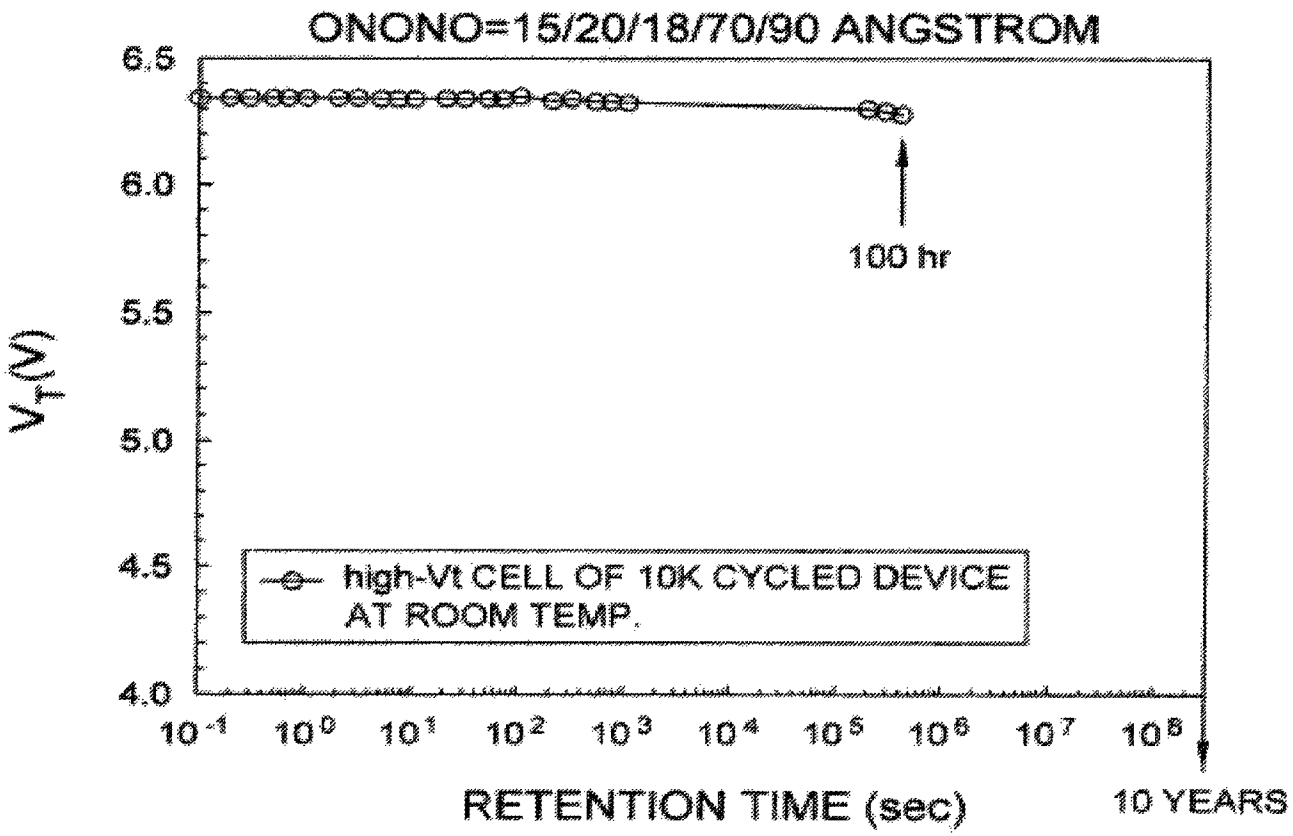
FIG. 4 is a graphical representation of the threshold voltage of a SONONOS memory cell in accordance with one embodiment of the present invention over time during retention.

FIG. 4 illustrates the charge retention characteristics of a SONONOS device in accordance with an embodiment of a memory cell according to the present invention as described with reference to FIG. 3. As shown, the retention characteristics can be better than those of conventional SONOS devices, and in terms of magnitude, may be many orders better.

Figure 5B:
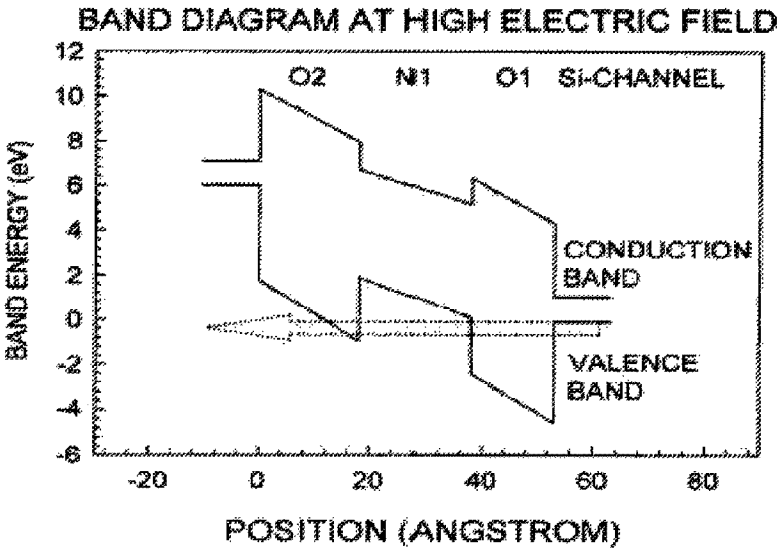
FIGS. 5a-5e are band energy diagrams of ONO tunnel dielectric structures in accordance with various embodiments of the present invention.
Figure 5A:
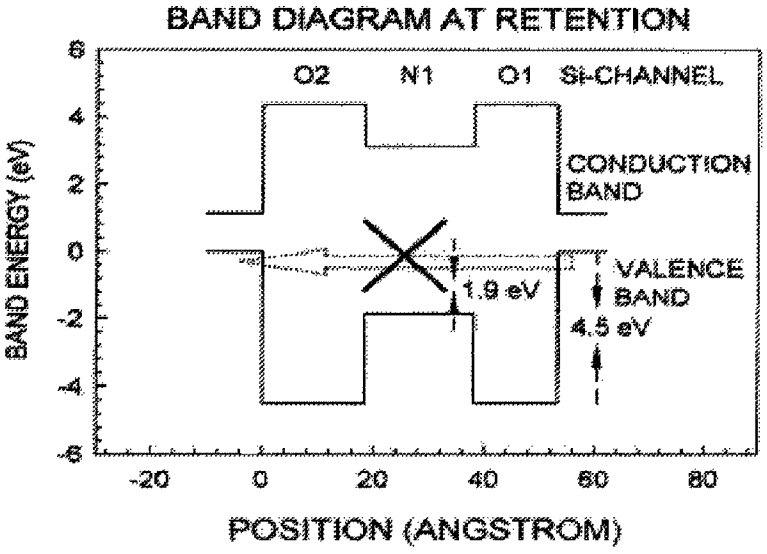

FIGS. 5a and 5b are band diagrams which illustrate possible effects of using a tunnel dielectric structure containing at least one layer having a small hole-tunneling-barrier height. The band diagram of the tunnel dielectric structure, an O1/N1/O2 trilayer in this example, under a low electrical field, which may exist during memory data retention, is shown in FIG. 5a. Direct tunneling as represented by the dotted arrow may be eliminated under low electrical fields, thereby providing good charge retention during retention states. On the other hand, band diagram offset under a high electrical field, as shown in FIG. 5b, can reduce the barrier effect of N1 and O2 such that the direct tunneling through O1 may occur. A tunnel dielectric structure having at least one small hole-tunneling-barrier height layer may allow efficient FN erase operation.

Figure 5D:
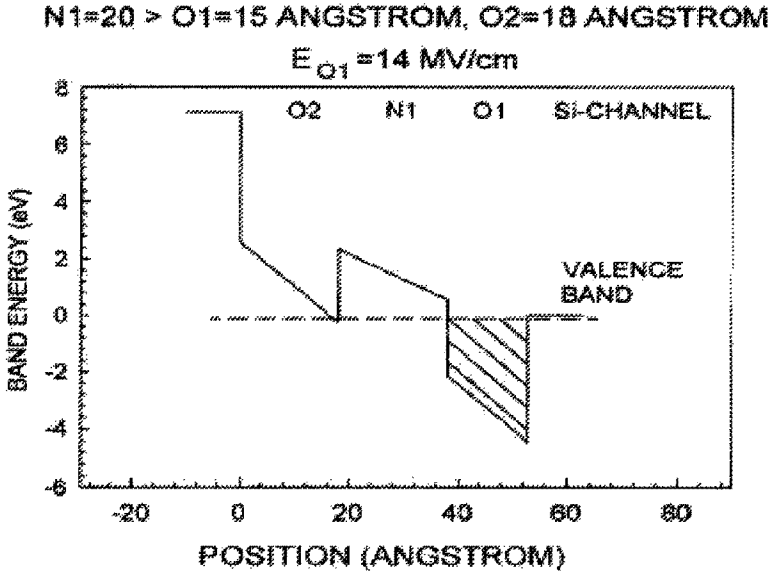
Figure 5C:
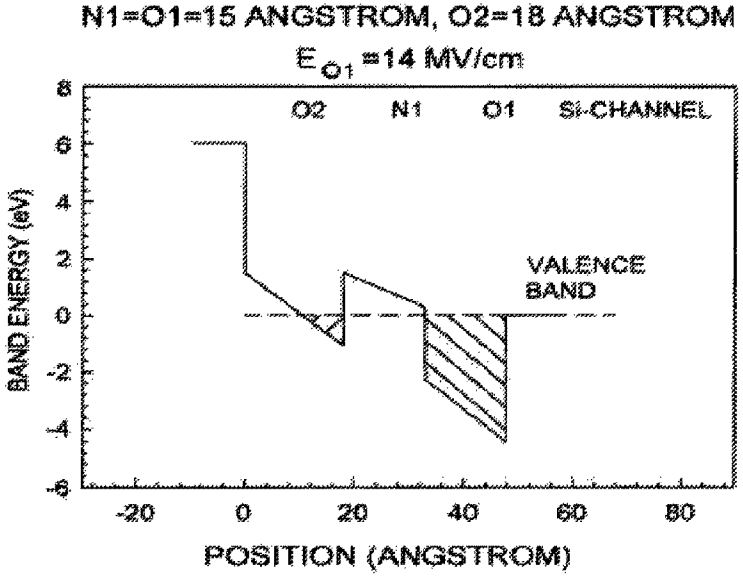

FIGS. 5c and 5d illustrate another set of band diagrams in one example. For a better band offset condition in one example, the thickness of N1 may be larger than that of O1. The band diagram of valence band is plotted at the same electrical field E01=14 MV/cm. The tunneling probability according to WKB approximation is correlated to the shadow area. In this example, for N1=O1 in thickness, the band offset does not completely screen out the barrier of O2. On the other hand, for N1>O1, the band offset can more easily screen out O1. Therefore, for N1>O1 in thickness, the hole tunneling current may be larger under the same electrical field in O1.

Figure 6:
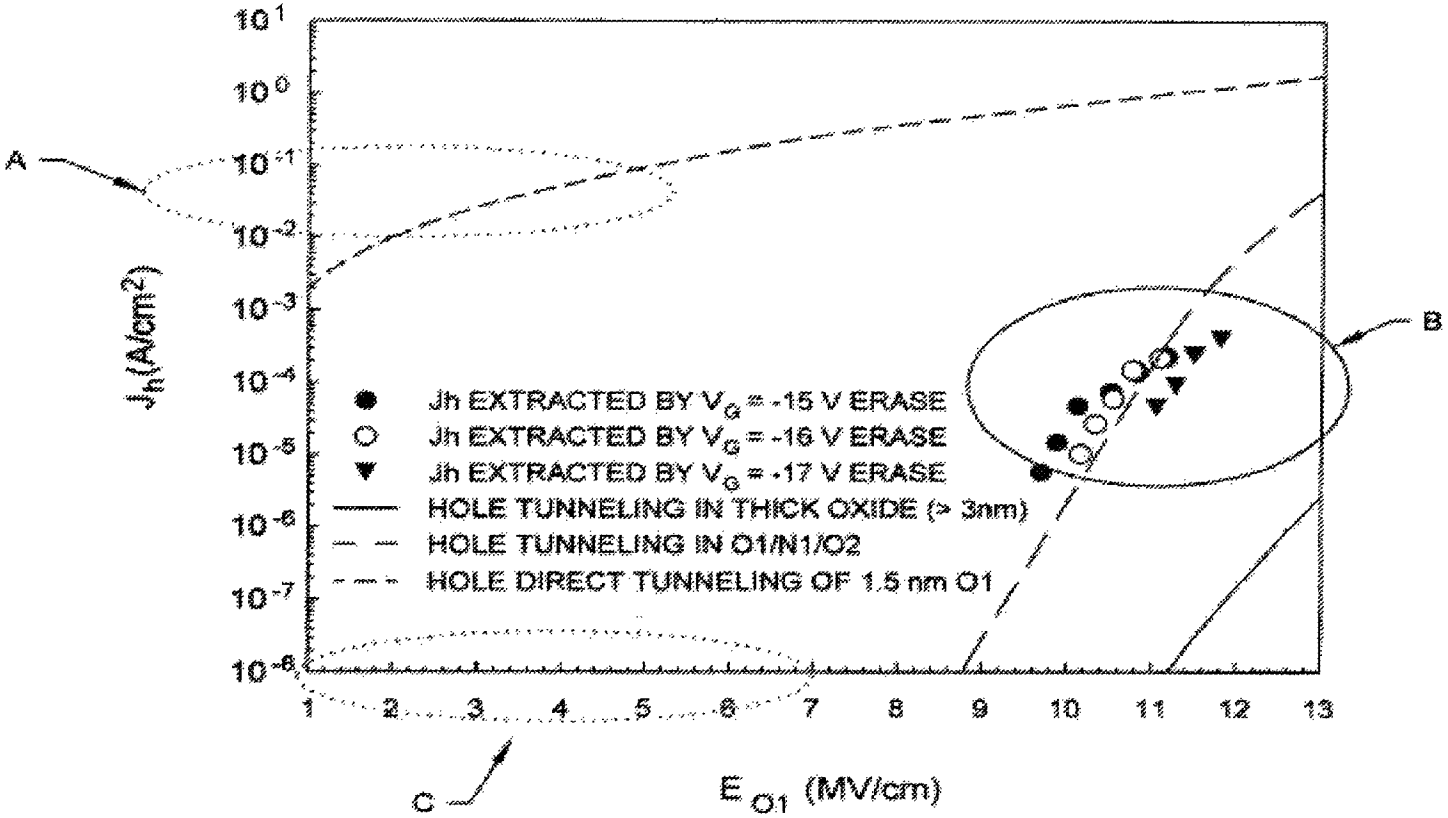
FIG. 6 is a graphical representation of hole-tunneling current versus electrical field strength for three different tunnel dielectric structures.

An experiment with measured and simulated hole tunneling currents, as shown in FIG. 6, further describes hole tunneling through a tunnel dielectric structure according to certain embodiments of the present invention. For example, hole tunneling current through the O1/N1/O2 dielectric may fall between that of an ultra-thin oxide and a thick oxide. In one example, under a high electrical field, the hole tunneling current may approximate that of an ultra-thin oxide. However, under a low electrical field, the direct tunneling can be suppressed. As shown in FIG. 6, hole tunneling current is detected through a thin oxide layer even at low electrical field strengths of only 1 MV/cm. Hole tunneling current is negligible through a thick oxide even at relatively high field strengths such as, for example, 11-13 mV/cm. However, hole tunneling current through an ONO tunnel dielectric structure approaches that of a thin oxide layer when high electric field strengths are present. In FIG. 6, the large current leakage due to hole tunneling through an ultra-thin oxide at low electrical fields can be seen at area A of the graph. In FIG. 6, hole tunneling current through an O1/N1/O2 tunnel dielectric structure at high electric field strengths can be seen at area B of the graph. In FIG. 6, the virtually non-existent tunneling current through an O1/N1/O2 tunnel dielectric structure and a thick oxide at low electrical fields can be seen at area C of the graph.

Memory cell designs in accordance with the present invention may be applied to various memory types, including but not limited to, NOR and/or NAND-type flash memories.

As noted above, a tunnel dielectric layer may include two or more layers, including one layer that may provide a small hole-tunneling-barrier height. In one example, the layer providing a small hole-tunneling-barrier height may contain silicon nitride. The layer may be sandwiched between two silicon oxide layers, thereby forming an O/N/O tunnel dielectric if silicon nitride is used as the intermediate layer. In some preferred embodiments, the bottom layer can have a thickness from about 2 nm or less. The middle and top layers in the tunnel dielectric structure can have a thickness of about 1 nm to 3 nm. In one exemplary device, a tri-layer structure may have a bottom layer, such as a silicon oxide layer, of about 10 Å to 20 Å, an intermediate layer, such as a silicon nitride layer, of about 10 Å to 30 Å, and a top layer, such as another silicon oxide layer, of about 10 Å to 30 Å. In one particular example, an O/N/O tri-layer structure having a 15 Å bottom silicon oxide layer, a 20 Å intermediate silicon nitride layer, and an 18 Å top silicon oxide layer may be used. In one particular example, an O/N/O tri-layer structure having a 13 Å bottom silicon oxide layer, a 25 Å intermediate silicon nitride layer, and an 25 Å top silicon oxide layer may be used.

In one example, a thin O/N/O tri-layer structure shows negligible charge trapping. Theoretical band diagram and tunneling current analysis, such as described with reference to FIGS. 5a, 5b and 6, may suggest that a tunnel dielectric structure, such as an O1/N1/O2 structure having thicknesses of 3 nm or less for each of the layers, can suppress the hole direct-tunneling at low electric field during retention. At the same time, it still may allow efficient hole tunneling at high electric field. This may be because the band offset can effectively screen out the tunneling barrier of N1 and O2. Therefore, this proposed device may offer fast hole tunneling erase, while it is immune from the retention problem of the conventional SONOS devices. Experimental analysis shows excellent endurance and retention properties of memory cells in accordance with various embodiments of the present invention.

In certain preferred embodiments, the tunnel dielectric structure includes at least a middle layer and two adjacent layers on opposing sides of the middle layer, wherein each of the middle layer and two adjacent layers comprises a first material and a second material, wherein the second material has a valence band energy level greater than the valence band energy level of the first material and the second material has a conduction band energy level less than the conduction band energy level of the first material; and wherein the concentration of the second material is higher in the middle layer than in the two adjacent layers and the concentration of the first material is higher in the two adjacent layers than in the middle layer. Preferably, in a tunnel dielectric structure in accordance with this embodiment of the present invention, the first material comprises oxygen and/or an oxygen-containing compound and the second material comprises nitrogen and/or a nitrogen-containing compound. For example, the first material can comprise an oxide, such as silicon oxide, and the second material can comprise a nitride, such as $Si_3N_4$ or $Si_xO_yN_z$.

Tunnel dielectrics in accordance with this aspect of the invention may be comprised of three or more layers, all of which can contain similar elements (such as Si, N and O), so long as the concentration of the material having the smallest hole tunneling barrier height is higher within the middle layer than in the two adjacent layers.

In certain tunnel dielectric structures according to the preceding embodiment of the present invention, the second material can be present in the middle layer in a gradient concentration such that the concentration of the second material in the middle layer increases from one adjacent layer/middle layer interface to a maximum concentration at a depth point within the middle layer, and decreases from the maximum concentration depth point to a lower concentration at the other adjacent layer/middle layer interface. The increase and decrease in concentration is preferably gradual.

In still other embodiments of the present invention, the tunnel dielectric structure includes at least a middle layer and two adjacent layers on opposing sides of the middle layer, wherein the two adjacent layers comprise a first material and the middle layer comprises a second material, wherein the second material has a valence band energy level greater than the valence band energy level of the first material and the second material has a conduction band energy level less than the conduction band energy level of the first material; and wherein the second material is present in the middle layer in a gradient concentration such that the concentration of the second material in the middle layer increases from one adjacent layer/middle layer interface to a maximum concentration at a depth point within the middle layer, and decreases from the maximum concentration depth point to a lower concentration at the other adjacent layer/middle layer interface. The increase and decrease in concentration is preferably gradual. Preferably, in a tunnel dielectric structure in accordance with this embodiment of the present invention, the first material comprises oxygen and/or an oxygen-containing compound and the second material comprises nitrogen and/or a nitrogen-containing compound. For example, the first material can comprise an oxide, such as silicon oxide, and the second material can comprise a nitride, such as $Si_3N_4$ or $Si_xO_yN_z$.

For example, in embodiments of the present invention where the tunnel dielectric layer comprises a tri-layer ONO structure, the bottom oxide and top oxide layers can comprise silicon dioxide and the middle nitride layer can be comprised of, for example, silicon oxynitride and silicon nitride wherein the concentration of silicon nitride (i.e., the material having the smaller hole tunneling barrier height of the two) is not constant within the layer, but rather reaches a maximum at some depth point within the layer between the two interfaces with the sandwiching oxide layers.

The precise point within the middle layer where the material with the smallest hole tunneling barrier height reaches its maximum concentration is not critical, so long as it is present in a gradient and reaches its maximum concentration in the tunnel dielectric layer at some point within the middle layer.

The gradient concentration of the material having the smallest hole tunneling barrier height can be advantageous in improving various properties of non-volatile memory devices, particularly those having a SONONOS, or SONONOS-like structure. For example, retention state charge loss can be diminished, hole tunneling under high electric fields can be improved and, to the extent it may occur, charge-trapping in the tunnel dielectric can be avoided.

Figure 5E:
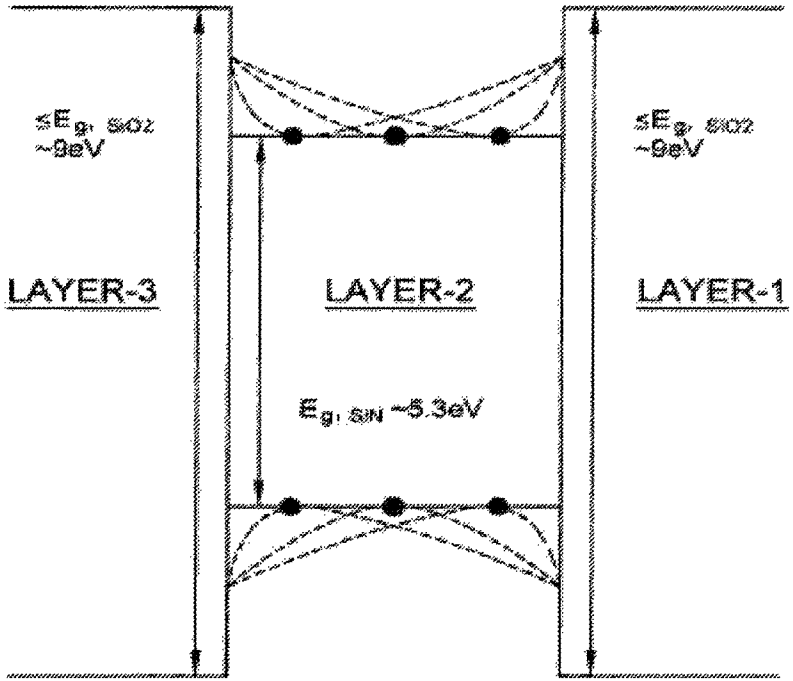

The band diagram of a tunnel dielectric layer can be advantageously modified in accordance with this aspect of the present invention such that the valence band energy level and the conduction band energy level of the middle layer do not have a constant value, but rather vary across the thickness of the layer with the concentration of the material having the smallest hole tunneling barrier height. Referring to FIG. 5e, modification of an ONO tri-layer tunnel dielectric in accordance with this aspect of the invention is shown via a band diagram. The middle layer (Layer-2) is comprised of silicon nitride. The outer layers (Layer-1 and Layer-3) are comprised of silicon dioxide. The concentration of silicon nitride in Layer-2 is varied such that the valence band energy level and the conduction band energy level reach a maximum and minimum value, respectively, at the depth in Layer-2 where the concentration of silicon nitride is highest. Three possible silicon nitride concentration gradients are shown in FIG. 5e, depicted by dashed lines representing the variable valence band energy conduction band energy levels that result from the concentration gradients. As shown in FIG. 5e, by the circles on the dashed lines representing three alternative silicon nitride concentration maximums within Layer-2, the lowest valence band energy level and the highest conduction band energy level coincide with the silicon nitride concentration maximum.

Multi-layer tunnel dielectric structures in accordance with such embodiments of the present invention, can be prepared in a variety of ways. For example, a first silicon dioxide or silicon oxynitride layer can be formed using any number of conventional oxidation approaches including, but not limited to thermal oxidation, radical (ISSG) oxidation, and plasma oxidation/nitridation, as well as chemical vapor deposition processes. A middle layer with a gradient concentration of SiN can then be formed, for example, via chemical vapor deposition processes, or alternatively, by plasma nitridation of excess oxide or oxynitride formed on top of the first layer. A third layer, the upper oxide layer, can then be formed, for example, by oxidation or chemical vapor deposition.

A charge storage layer can then be formed over the tunnel dielectric structure. In one example, a charge storage layer of about 5 nm to 10 nm may be formed over the tunnel dielectric structure. In one particular example, a silicon nitride layer of about 7 nm or thicker may be used. The insulating layer above the charge storage layer may be about 5 nm to 12 nm. For example, a silicon oxide layer of about 9 nm or thicker may be used. And the silicon oxide layer may be formed by a thermal process converting at least a portion of a nitride layer to form the silicon oxide layer. Any method, known or to be developed, for forming layers of suitable materials described herein can be used to deposit or form tunnel dielectric layers, charge-storage layers and/or insulating layers. Suitable methods include, for example, thermal growth methods and chemical vapor deposition methods.

In one example, a thermal conversion process may provide a high density or concentration of interfacial traps that can enhance the trapping efficiency of a memory device. For example, thermal conversion of nitride can be carried out at 1000, while the gate flow ratio is H2:O2=1000:4000 sccm.

In addition, because silicon nitride generally has very low (about 1.9 eV) hole barrier, it may become transparent to hole tunneling under high field. Meanwhile, the total thickness of a tunnel dielectric, such as an ONO structure, may prevent direct tunneling of electrons under a low electric field. In one example, this asymmetrical behavior may provide a memory device offering not only fast hole-tunneling erase, but also reduction or elimination of charge leakage during retention.

An exemplary device may be fabricated by 0.12 μm NROM/NBit technologies. Table 1 shows the device structure and parameters in one example. The proposed tunnel dielectric with an ultra-thin O/N/O may alter the hole tunneling current. A thicker (7 nm) N2 layer may serve as a charge-trapping layer and an O3 (9 nm) layer may serve as the blocking layer in one example. Both N2 and O3 may be fabricated using NROM/NBit technologies.

TABLE 1

| Layer | Approximate Thickness (Angstroms) |
|---|---|
| Bottom Oxide (O1) | 15 |
| Inter Nitride (N1) | 20 |
| Inter Oxide (O2) | 18 |
| Trapping Nitride (N2) | 70 |
| Blocking Oxide (O3) | 90 |

Gate: N+-polysilicon
Channel length: 0.22 μm
Channel width: 0.16 μm

In certain embodiments of the present invention, a gate can comprise a material having a work function greater than that of $N^+$ polysilicon. In certain preferred embodiments of the present invention, such a high work function gate material can comprise a metal such as, for example, platinum, iridium, tungsten, and other noble metals. Preferably, the gate material in such embodiments has a work function greater than or equal to about 4.5 eV. In particularly preferred embodiments, the gate material comprises a high work function metal such as, for example, platinum or iridium. Additionally, preferred high work function materials include, but are not limited to $P^+$ polysilicon, and metal nitrides such as, for example, titanium nitride and tantalum nitride. In particularly preferred embodiments of the present invention, the gate material comprises platinum.

An exemplary device in accordance with an embodiment of the present invention having a high work function gate material may also be fabricated by 0.12 μm NROM/NBit technologies. Table 2 shows the device structure and parameters in one example. The proposed tunnel dielectric with an ultra-thin O/N/O may alter the hole tunneling current. A thicker (7 nm) N2 layer may serve as a charge-trapping layer and an O3 (9 nm) layer may serve as the blocking layer in one example. Both N2 and O3 may be fabricated using NROM/NBit technologies.

TABLE 2

| Layer | Approximate Thickness (Angstroms) |
|---|---|
| Bottom Oxide | 15 |
| Inter Nitride | 20 |
| Inter Oxide | 18 |
| Trapping Nitride (N2) | 70 |
| Blocking Oxide | 90 |

Gate: Platinum
Channel length: 0.22 μm
Channel width: 0.16 μm

Memory cells in accordance with high work function gate material embodiments of the present invention exhibit erase properties which are even more improved over other embodiments. High work function gate materials suppress gate electron injection into the trapping layer. In certain embodiments of the present invention wherein the memory cells comprise an $N^+$ polysilicon gate, hole tunneling into the charge-trapping layer during erase occurs simultaneously with gate electron injection. This self-converging erase effect results in higher threshold voltage levels in the erased state, which can be undesirable in NAND applications. Memory cells in accordance with high work function gate material embodiments of the present invention can be used in various type of memory applications including, for example, NOR- and NAND-type memories. However, the memory cells according to high work function gate material embodiments of the present invention are particularly suitable for use in NAND applications where elevated threshold voltages in the erased/reset state can be undesirable. Memory cells in accordance with high work function gate material embodiments of the present invention can be erased via hole tunneling methods and preferably via −FN erasing operations.

Figure 7A:
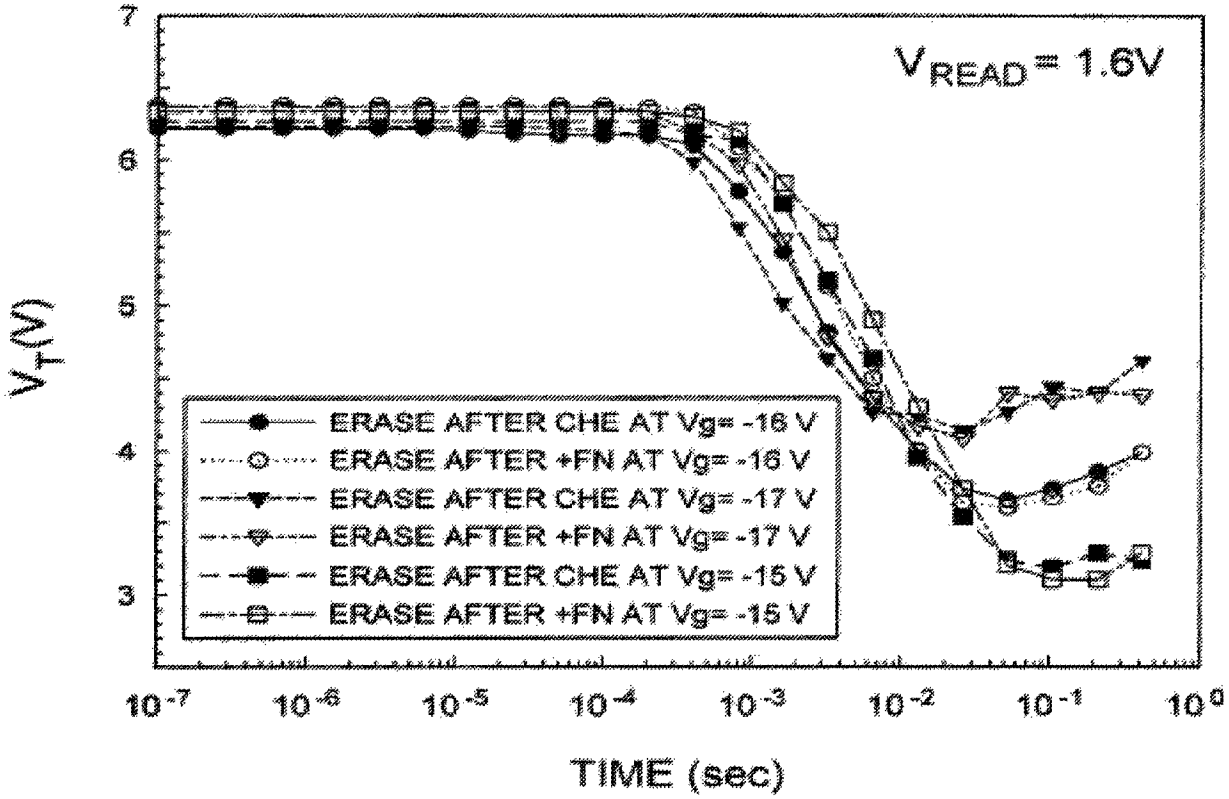
FIG. 7a is a graphical representation of the threshold voltage over time of a memory cell in accordance with one embodiment of the present invention during erase after various types of programming.

An exemplary device having an ONO tunneling dielectric and an N+ polysilicon gate may be programmed by conventional SONOS or NROM method and erased by channel FN hole tunneling. FIG. 7a shows the erase characteristics of an exemplary SONONOS device having an ONO tunneling dielectric in one example. Referring to FIG. 7a, a higher gate voltage results in a faster erase speed. It also has a higher saturation Vt, because gate injection is also stronger and the resulting dynamic balance point (which determines the Vt) is higher. This is shown on the right-hand side of the graph as the threshold voltage reaches a minimum at values of from about 3 to about 5 volts depending upon the erase gate voltage. The hole tunneling current can be extracted by a transient analysis method by differentiating the curves in FIG. 7a. The extracted hole current from the measurement in FIG. 7a is illustrated in FIG. 6 as discussed above. For comparison, there is also plotted simulated hole tunneling current using WKB approximation. The experimental results are in reasonable agreement with our prediction. The tunneling current through the O1/N1/O2 stack approaches that of the ultra-thin O1 under a high electric field, while it is turned-off under a low electric field.

Figure 7B:
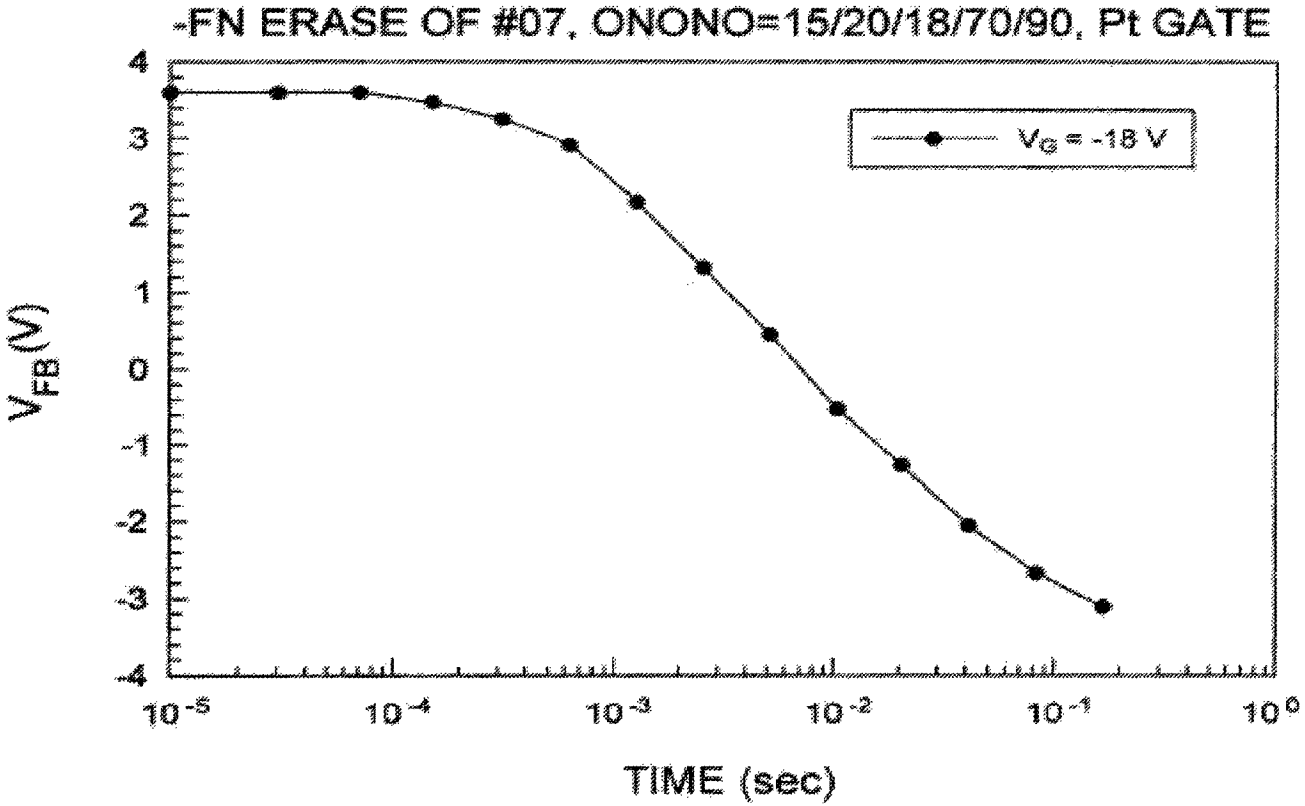
FIG. 7b is a graphical representation of the threshold voltage over time of a memory cell having a platinum gate in accordance with one embodiment of the present invention during erase.
Figure 7C:
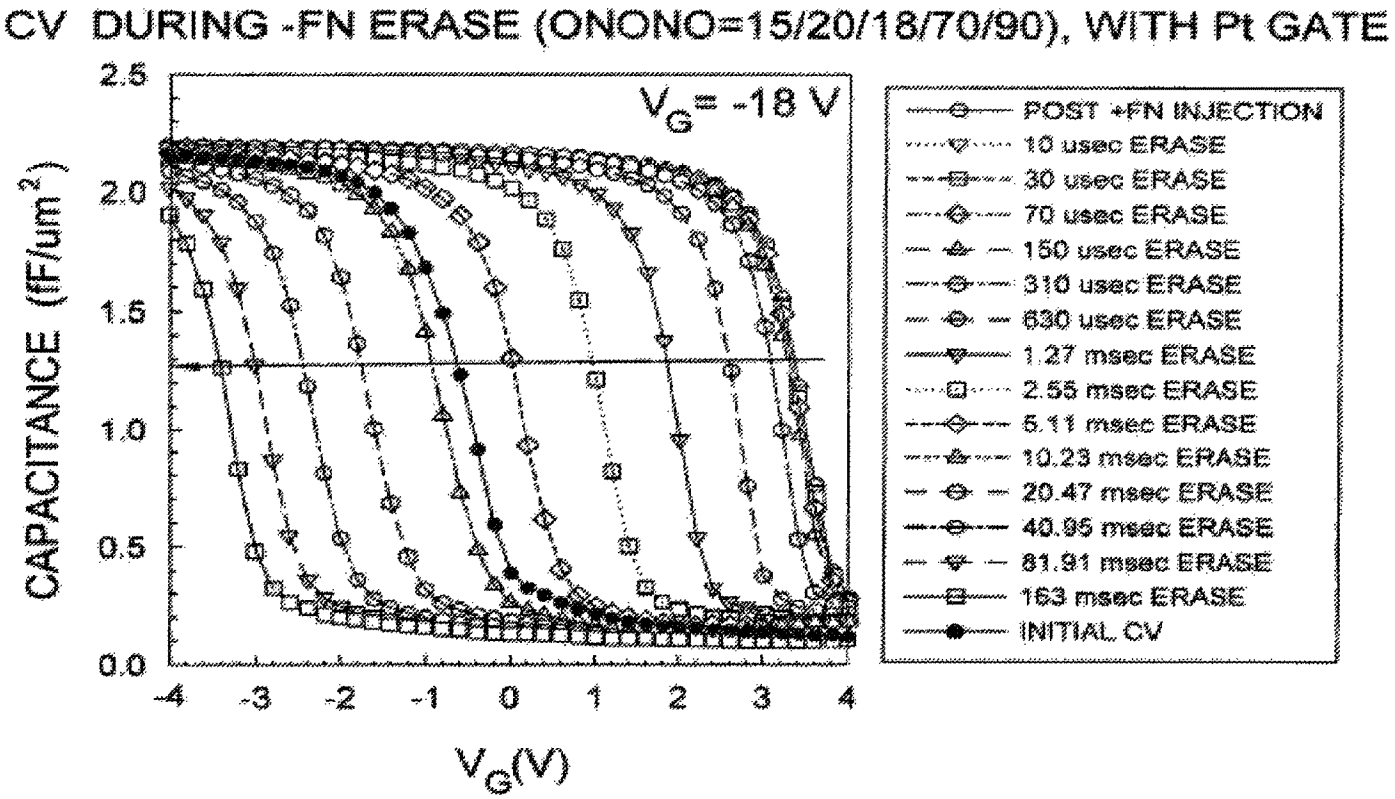
FIGS. 7c and 7d are graphical representations of capacitance versus voltage for the memory cell referred to in FIG. 7b.

In accordance with certain embodiments of memory cells of the present invention having high work function gate materials, wherein the high work function gate suppresses gate electron injection, the threshold voltage of the device in an erased or reset state can be much lower, and even negative, depending upon erase time. The threshold voltage values of a memory device in accordance with one embodiment of the present invention wherein the gate is comprised of platinum and the tunnel dielectric layer comprises a 15/20/18 angstrom ONO structure are shown in FIG. 7b. As shown in FIG. 7b, at a similar gate voltage (−18 V) during a-FN erase operation, the flat band voltage (which correlates with threshold voltage) of the device can be set below −3V. The corresponding capacitance versus gate voltage values for the device are shown in FIG. 7c.

Figure 7D:
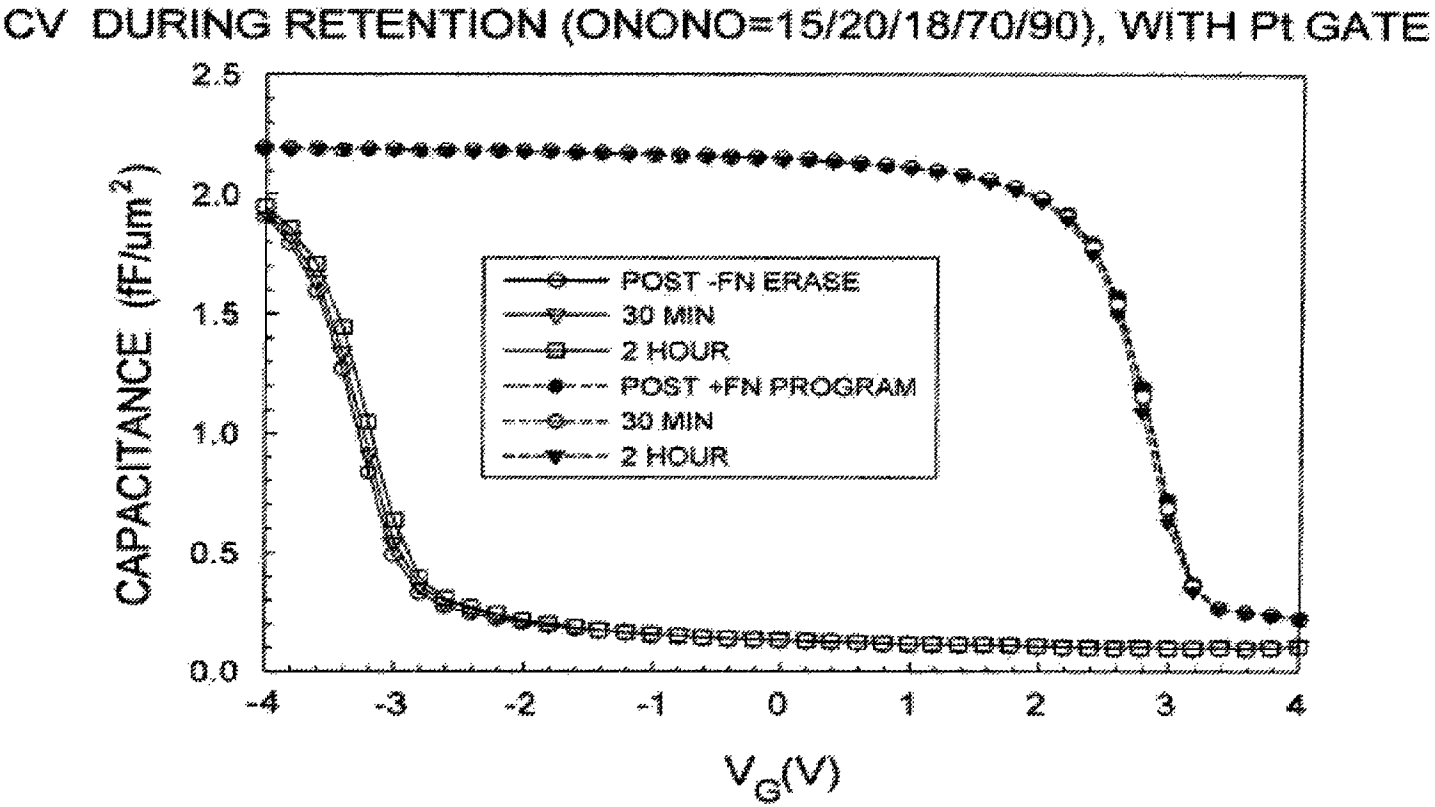

Moreover, retention properties of memory devices in accordance with high work function gate material embodiments the present invention are improved. The retention properties of a memory device having a platinum gate are shown in FIG. 7d wherein the capacitance is graphed as a function of gate voltage following erase and program, and then 30 minutes after each operation and two hours after each operation. Minimal deviation is observed.

Memory cells in accordance with various embodiments of the present invention may be operated with at least two separate schemes. For example, CHE programming with reverse read (mode 1) may be used to perform a 2-bits/cell operation. Additionally, low-power +FN programming (mode 2) may also be used for a 2-bits/cell operation. Both modes can use the same hole tunneling erase method. Mode 1 may preferably be used for a virtual ground array architecture for NOR-type flash memories. Mode 2 may preferably be used for NAND-type flash memories.

Figure 8:
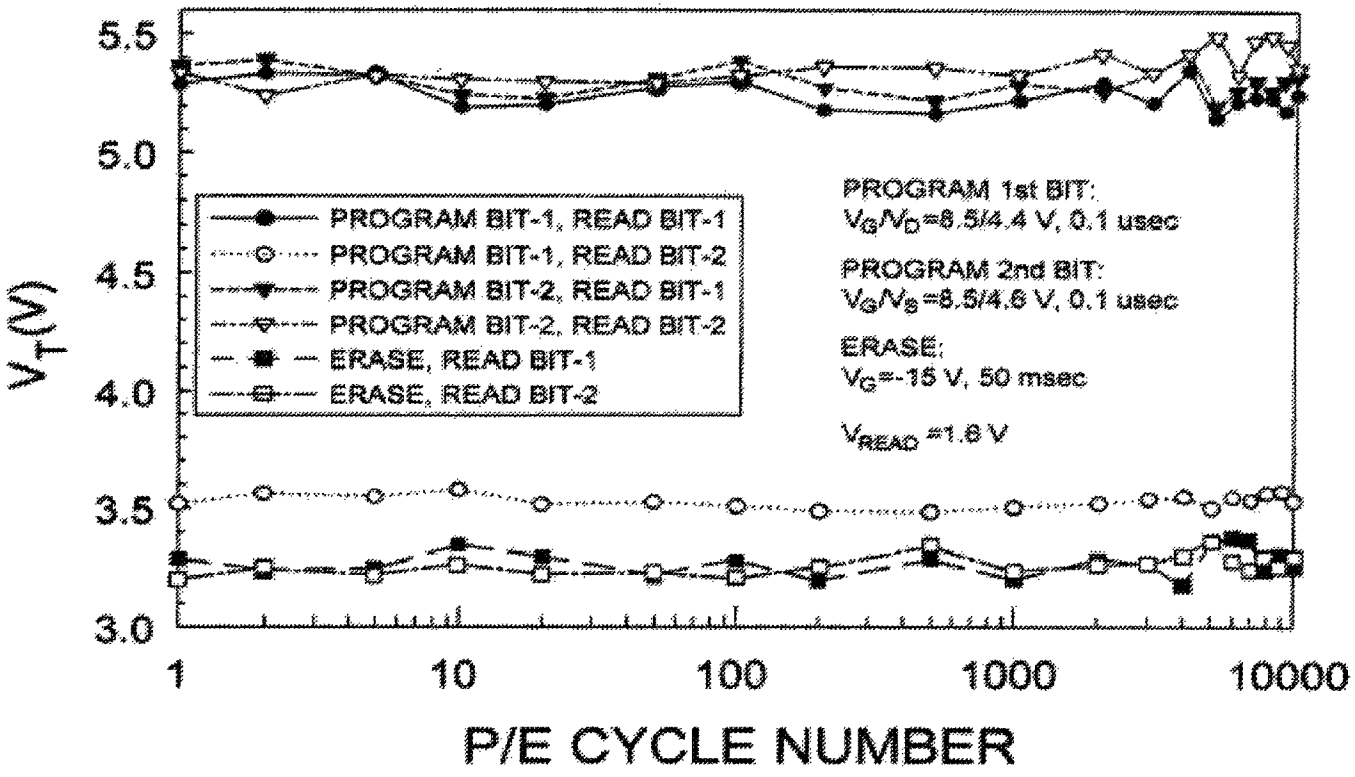
FIG. 8 is a graphical representation of the threshold voltage of a memory cell in accordance with one embodiment of the present invention over the course of numerous programs/erase cycles under various operating conditions.
Figure 9:
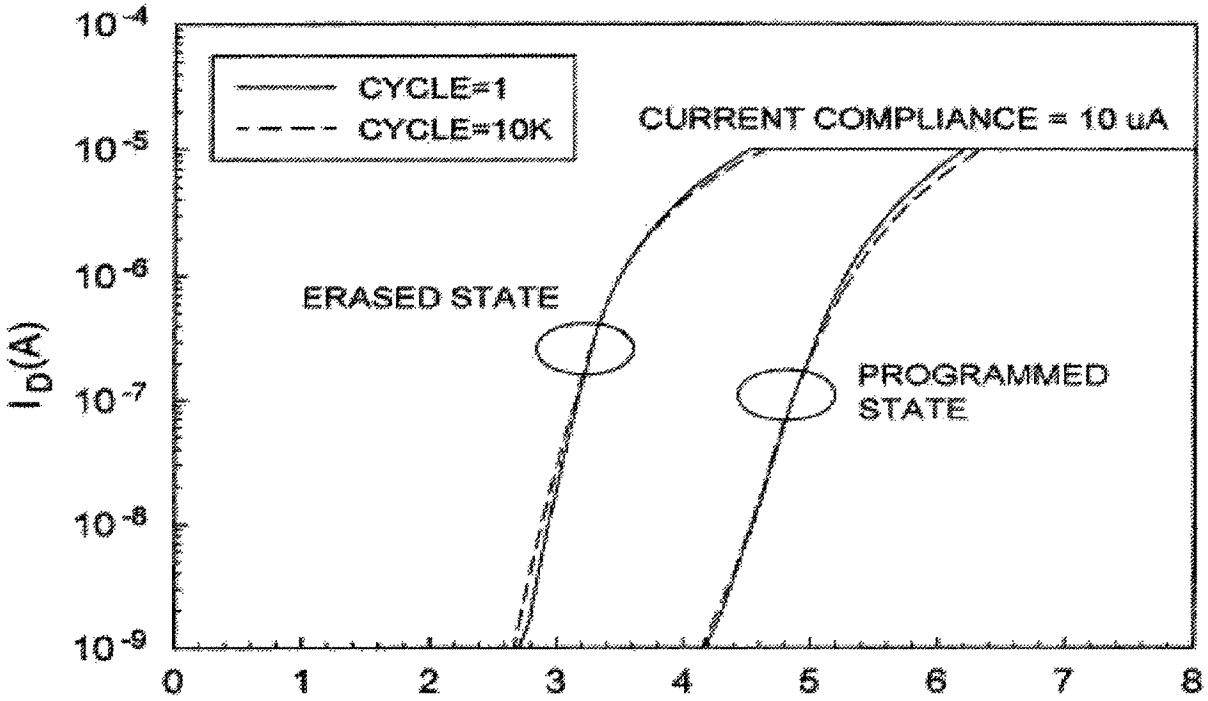
FIG. 9 is a graphical representation of the current-voltage (IV) relationship for a memory cell in accordance with one embodiment of the invention after one cycle and $10^3$ cycles.
Figure 10:
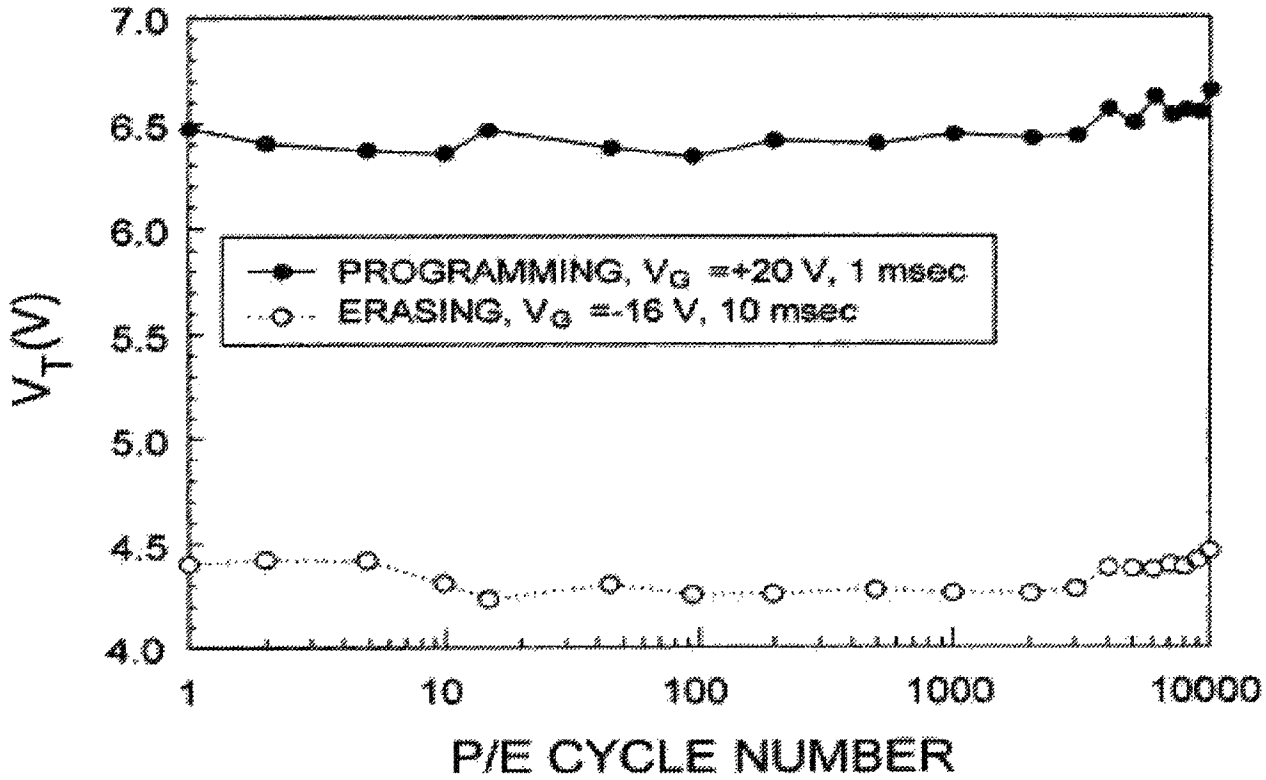
FIG. 10 is a graphical representation of the threshold voltage of a memory cell in accordance with one embodiment of the present invention over the course of numerous programs/erase cycles under one set of programming and erasing conditions.

As an example, FIG. 8 shows the excellent endurance properties of a virtual ground array architecture NOR-type flash memory in accordance with one embodiment of the present invention under mode 1 operation. Erase degradation of such memory devices having a tunnel dielectric structure does not occur, because hole tunneling erase (Vg=−15 V) is a uniform channel erase method. The corresponding IV curves are also shown in FIG. 9, which suggest little degradation of the device after numerous P/E cycles. In one example, this may be because ultra-thin oxide/nitride layers possess good stress immunity properties. Additionally, the memory device is free of hot-hole introduced damages. The endurance properties of a NAND-type flash memory in accordance with one embodiment of the present invention under Mode 2 operation are shown in FIG. 10. For a faster convergent erasing time, one may use a larger bias (Vg=−16 V). Excellent endurance may also be obtained in this example.

Figure 11:
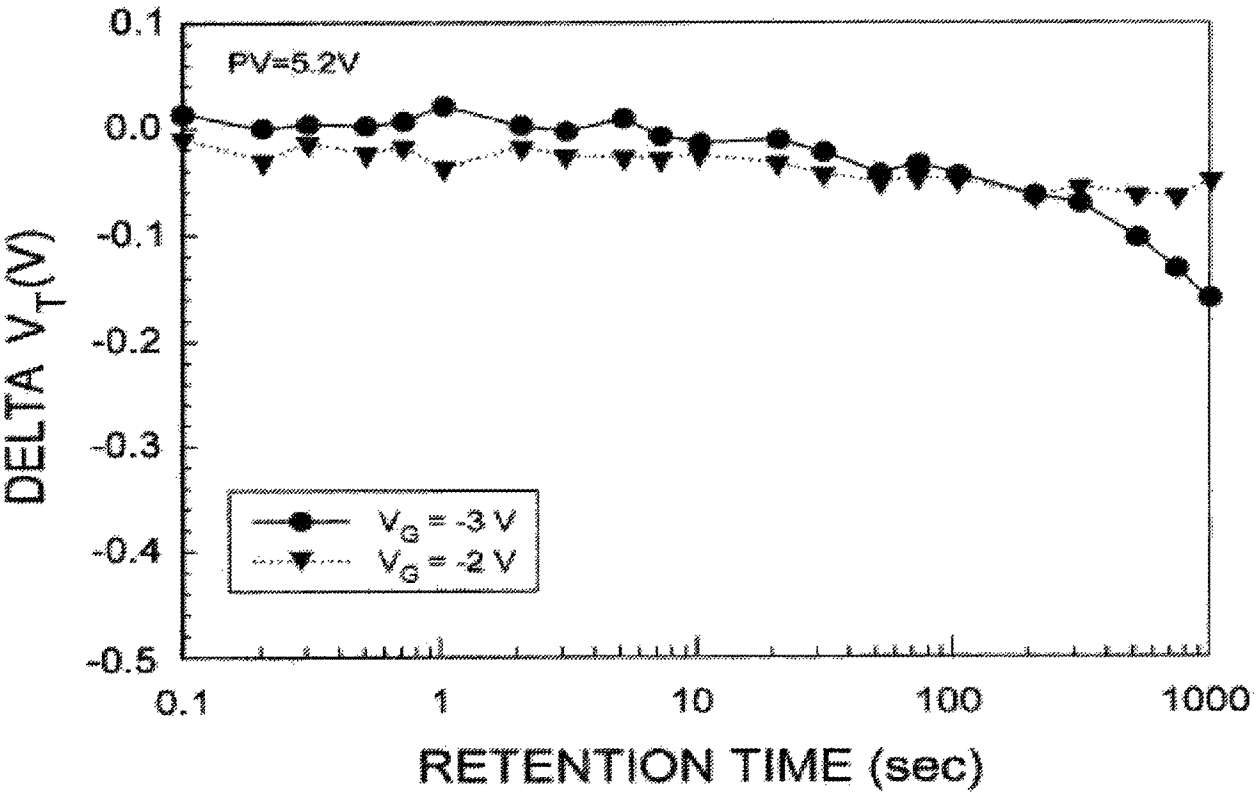
FIG. 11 is a graphical representation of the change in threshold voltage over time in a memory cell according to one embodiment of the present invention under VG-accelerated retention testing.

The charge retention of an exemplary SONONOS device in accordance with one embodiment of the present invention is shown in FIG. 4, where only a 60 mV charge loss is observed after 100 hours. The improvement of retention is many orders of magnitude better than conventional SONOS devices. VG-accelerated retention test also shows that direct tunneling can be suppressed at the low electrical field. FIG. 11 illustrates an example of a VG-accelerated retention test for a 10K P/E cycled device. The charge loss is small at −VG stress after a 1000 sec stress, indicating that the hole direct tunneling at small electrical field can be suppressed.

Accordingly, the SONONOS design identified in the above examples may provide a fast hole tunneling erase with excellent endurance properties. As noted above, the design may be implemented in both NOR and NAND-type nitride-storage flash memories. Additionally, a memory array in accordance with the present invention may include multiple memory devices with similar or different configurations.

In various embodiments of arrays according to the present invention, memory cells according to the present invention may be used in place of conventional NROM or SONOS devices in a virtual ground array architecture. The reliability problems and erase degradations may be solved or mitigated by using FN hole tunneling instead of hot-hole injection. Without limiting the scope of the invention to the specific structures described below, various operation methods in accordance with memory arrays of the present invention are described below for exemplary NOR virtual ground array architectures.

CHE or CHISEL (channel initiated secondary electron) programming and reverse read may be used for 2-bit/cell memory array. And the erase method may be a uniform channel FN hole tunneling erase. In one example, the array architecture may be a virtual ground array or a JTOX array. With reference to FIGS. 12a-20, an O1/N1/O2 tri-layer structure may be used as the tunnel dielectric, the O1 layer having thickness less than 2 nm and the N1 and O2 layers having about 3 nm or less in thickness to provide hole direct tunneling. With reference to FIGS. 12a-20, N2 may be thicker than 5 nm to provide a high trapping efficiency. An insulating layer, O3, may be a silicon oxide layer formed by wet oxidation, such as a wet converted top oxide (silicon oxide), to provide a large density of traps at the interface between O3 and N2. O3 may be about 6 nm or thicker to prevent charge loss from this silicon oxide layer.

Figure 12B:
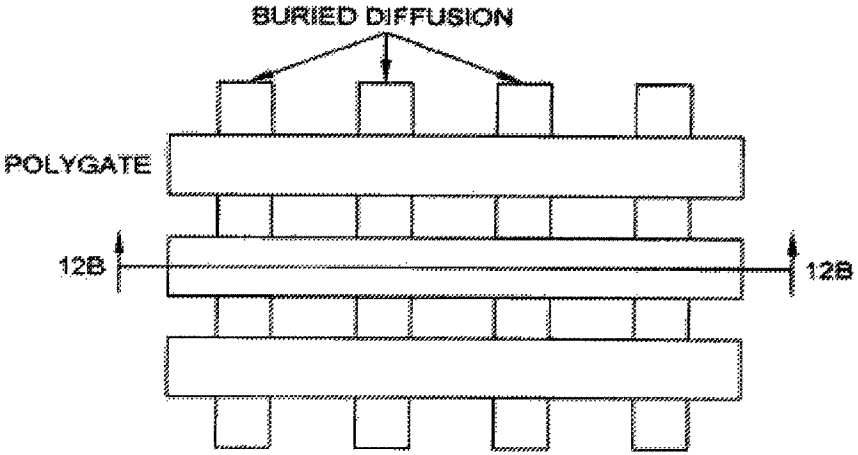
FIGS. 12a and 12b are an equivalent circuit diagram and layout view, respectively, of a virtual ground array of memory cells in accordance with one embodiment of the present invention.
Figure 12A:
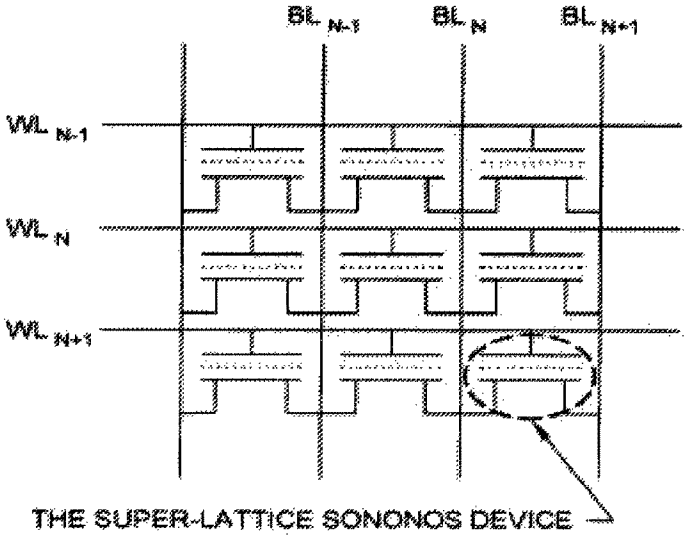

FIGS. 12a and 12b illustrate an example of a virtual ground array architecture incorporating the memory cells discussed above, such as memory cells having a tri-layer ONO tunnel dielectric. In particular, FIG. 12a illustrates an equivalent circuit of a portion of a memory array, and FIG. 12b illustrates an exemplary layout of a portion of the memory array.

Figure 13:
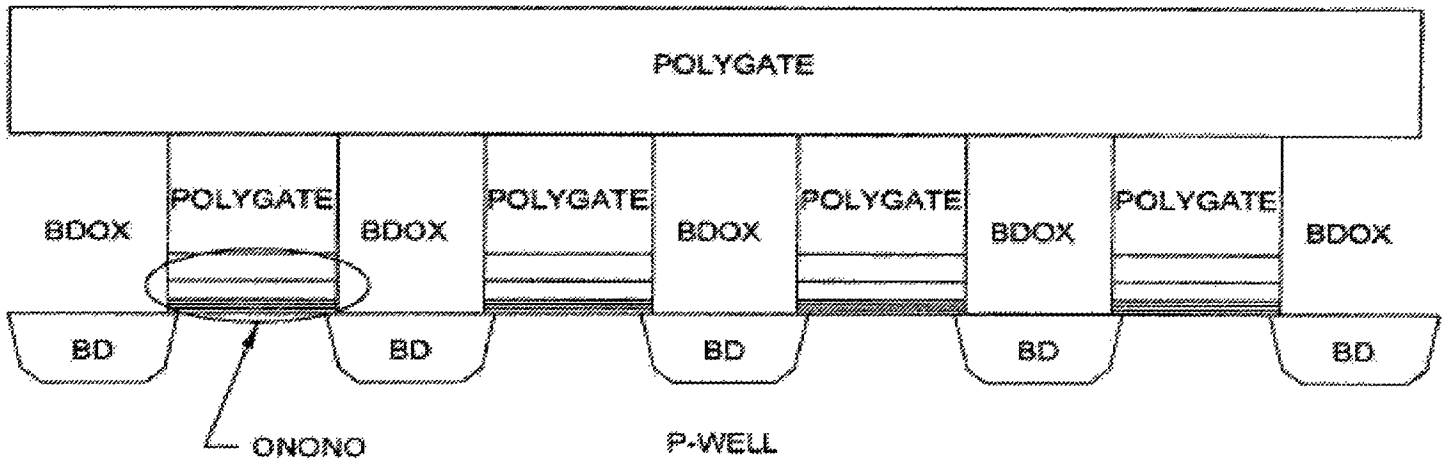
FIG. 13 is a cross-section schematic representation of a virtual ground array of memory cells in accordance with one embodiment of the present invention taken along line 12B-12B as shown in FIG. 12b.

In addition, FIG. 13 illustrates a schematic diagram of the cross-sectional view of several memory cells incorporated in the array. In one example, the buried diffusion (BD) areas may be N+-doped junctions for the source or drain regions of the memory cells. The substrate may be a p-type substrate. In order to avoid possible breakdown of the BDOX areas (oxide above BD) during −FN erase, a thick BDOX (>50 nm) may be used in one example.

Figure 14B:
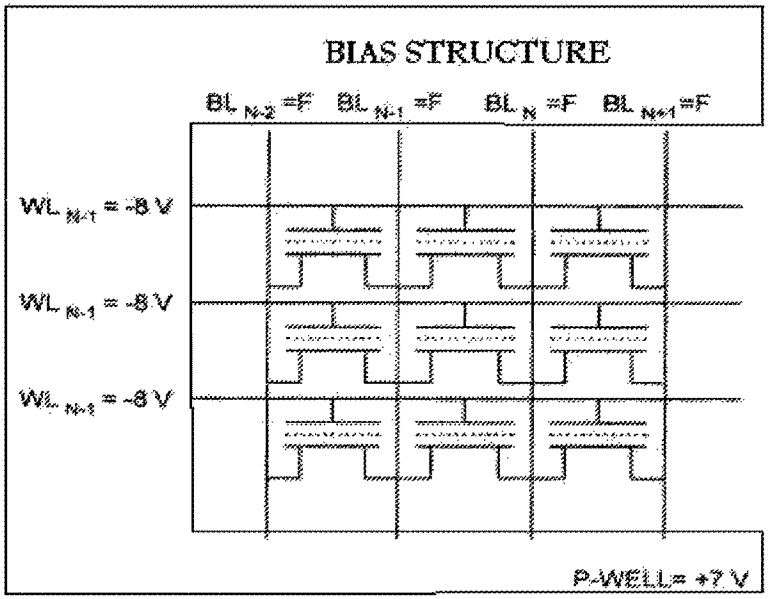
FIGS. 14a and 14b are equivalent circuit diagrams of memory arrays comprising memory cells in accordance with one embodiment of the present invention and depicting suitable reset/erase voltages in accordance with two embodiments of operation in accordance with the present invention.
Figure 14A:
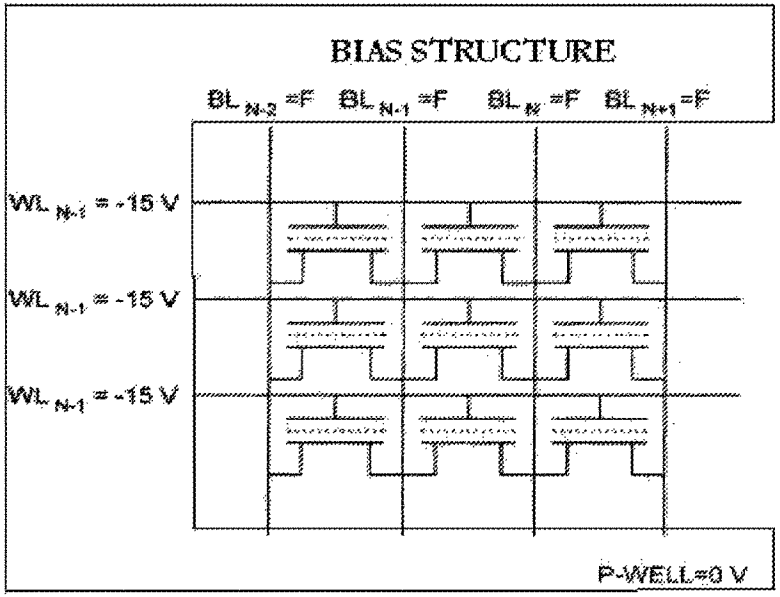

FIGS. 14a and 14b illustrate possible electrical RESET schemes for an exemplary virtual ground array incorporating 2 bits/cell memory cells having a tunnel dielectric design discussed above. Before performing further P/E cycles, all the devices may first undergo an electrical "RESET". A RESET process may ensure the Vt uniformity of memory cells in the same array and raise the device Vt to the convergent erased state. For example, applying Vg=−15 V for 1 sec, as shown in FIG. 14a, may have the effect of injecting some charge into a charge trapping layer of silicon nitride to reach a dynamic balancing condition. With the RESET, even memory cells that are non-uniformly charged due, for example, to the plasma charging effect during their fabrication processes may have their Vt converged. An alternative way for creating a self-converging bias condition is to provide bias for both gate and substrate voltages. For example, referring to FIG. 14b, Vg=−8 V and P-well=+7 V may be applied.

Figure 15B:
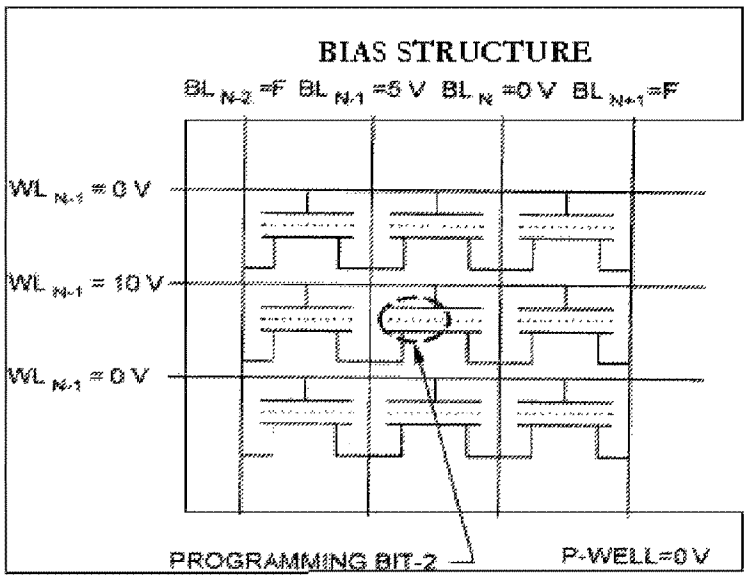
FIGS. 15a and 15b are equivalent circuit diagrams of memory arrays comprising memory cells in accordance with one embodiment of the present invention depicting one method of programming in accordance with the present invention.
Figure 15A:
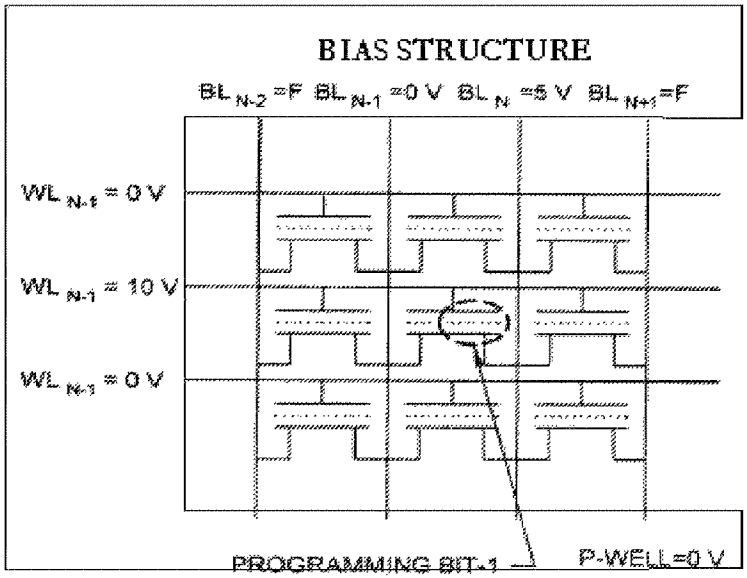

FIGS. 15a and 15b illustrate programming schemes for an exemplary virtual ground array incorporating 2 bits/cell memory cells having a tunnel dielectric design discussed above. Channel hot-electron (CHE) programming may be used to program the device. For Bit-1 programming illustrated in FIG. 15a, the electrons are locally injected into the junction edge above BLN (bit line N). For Bit-2 programming shown in FIG. 15b, the electrons are stored above BLN-1. Typical programming voltage for WL (word line) is around 6 V to 12 V. Typical programming voltage for BL (bit line) is about 3 to 7 V, and the p-well may be kept grounded.

Figure 16B:
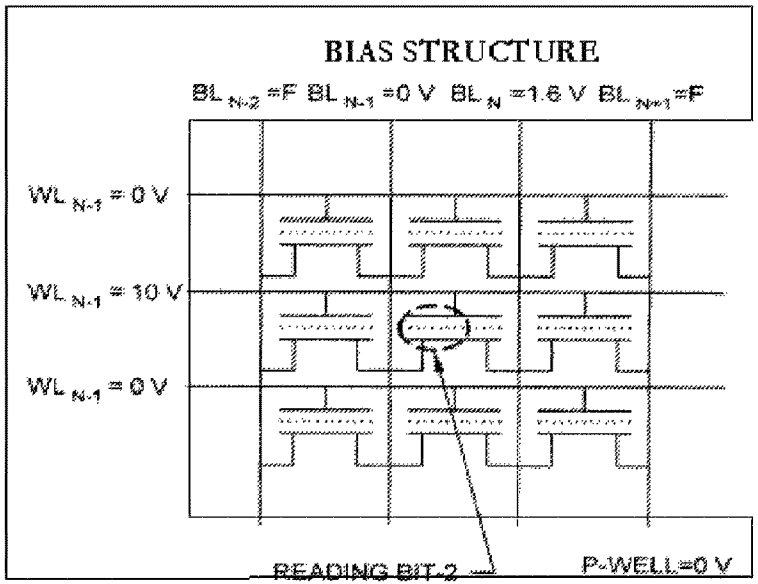
FIGS. 16a and 16b are equivalent circuit diagrams of memory arrays comprising memory cells in accordance with one embodiment of the present invention depicting one method of reading a bit in accordance with the present invention.
Figure 16A:
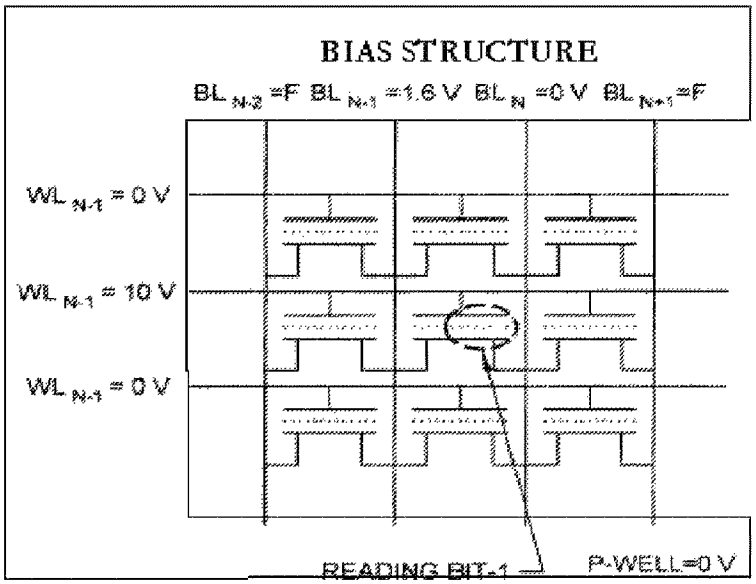

FIGS. 16a and 16b illustrate reading schemes for an exemplary virtual ground array incorporating 2 bits/cell memory cells having a tunnel dielectric design discussed above. In one example, reverse read is used to read the device to perform a 2 bits/cell operation. Referring to FIG. 16a, for reading Bit-1, BLN-1 is applied with a suitable read voltage, such as 1.6 V. Referring to FIG. 16b, for reading bit-2, BLN is applied with a suitable read voltage, such as 1.6V. In one example, the reading voltage may be in the range of about 1 to 2 V. The word lines and the P-well may be kept grounded. However, other modified read schemes, such as a raised-Vs reverse read method can be performed. For example, a raised-Vs reverse read method may use Vd/Vs=1.8/0.2 V for reading Bit-2, and Vd/Vs=0.2/1.8 for reading Bit-1.

FIGS. 14a and 14b also illustrate sector erase schemes for an exemplary virtual ground array incorporating 2 bits/cell memory cells having a tunnel dielectric design discussed above. In one example, sector erase with channel hole tunneling erase may applied to erase the memory cells simultaneously. An ONO tunnel dielectric in a memory cell having the SONONOS structure may offer a fast erase, which may occur in about 10 to 50 msec and a self-convergent channel erase speed. In one example, a sector erase operation condition may be similar to a RESET process. For example, referring to FIG. 14a, applying VG=about −15 V at the WL's simultaneously and leaving all the BL's floating may achieve a sector erase. And the p-well may be kept grounded.

Alternatively, referring to FIG. 14b, applying about −8 V to the WL's and about +7 V to the p-well may also achieve a sector erase. In some examples, a complete sector erase operation may be carried out within 100 msec or less without having any over-erase or hard-to-erase cells. The device design discussed above may facilitate a channel erase providing excellent self-converging properties.

Figure 17:
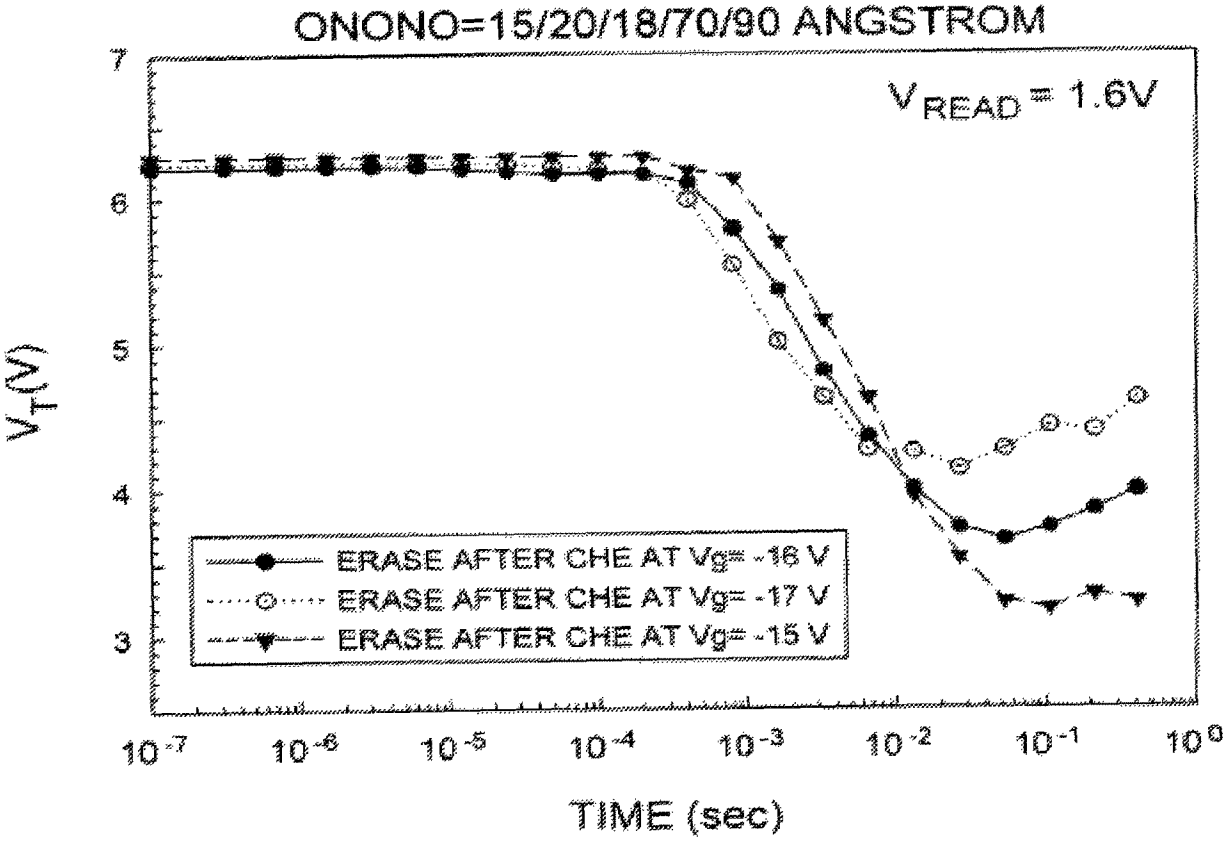
FIG. 17 is a graphical representation of the threshold voltage of a memory cell in accordance with one embodiment of the present invention over time under various erasing conditions.

FIG. 17 illustrates the erase characteristics in one example of using an SONONOS device. An example of an SONONOS device may have the thickness of O1/N1/O2/N2/O3 respectively as about 15/20/18/70/90 Angstroms, with an N+-polysilicon gate and thermally converted top oxide as O3. The erase speeds for various gate voltages are shown. The erase operation on the cell having the O1/N1/O2 tunnel dielectric with layers having thicknesses respectively as about 15/20/18 Angstroms, results in a reduction of the threshold voltage of about 2 volts in less than 50 msec, for example about 10 msec, under the conditions shown for −FN erase voltages between −15 and −17 volts. A higher gate voltage results in a faster erase speed.

However, the convergent Vt is also higher. This is because gate injection is more active under higher gate voltages. To reduce gate injection, P+-polysilicon gate or other metal gate with a high work function may be used alternatively as the gate material to reduce the gate-injected electrons during the erase.

Figure 18:
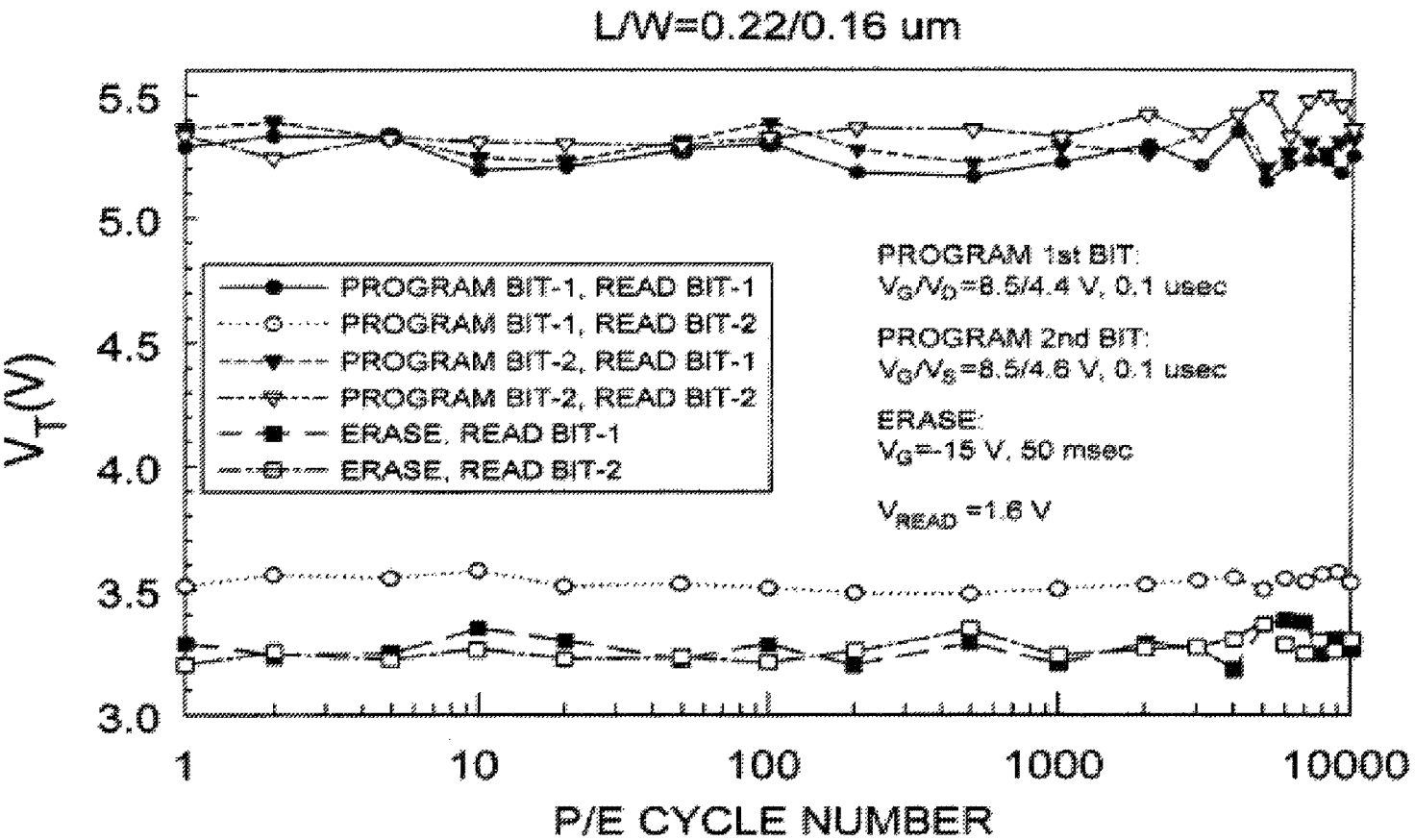
FIG. 18 is a graphical representation of the threshold voltage of a memory cell in accordance with one embodiment of the present invention over the course of numerous programs/erase cycles.

FIG. 18 illustrates the endurance properties of using SONONOS devices in a virtual ground array architecture. The endurance properties of in some examples are excellent. The programming condition is Vg/Vd=8.5/4.4 V, 0.1 μsec for Bit-1 and Vg/Vs=8.5/4.6 V, 0.1 μsec for Bit-2. The FN erase may use Vg=−15 V for about 50 msec to erase the two bits simultaneously. Because the FN erase is self-convergent uniform channel erase, hard-to-erase or over-erase cells usually do not present. In some examples, the devices proposed above show excellent endurance properties even without using a Program/Erase verifying or stepping algorithm.

Figure 19B:
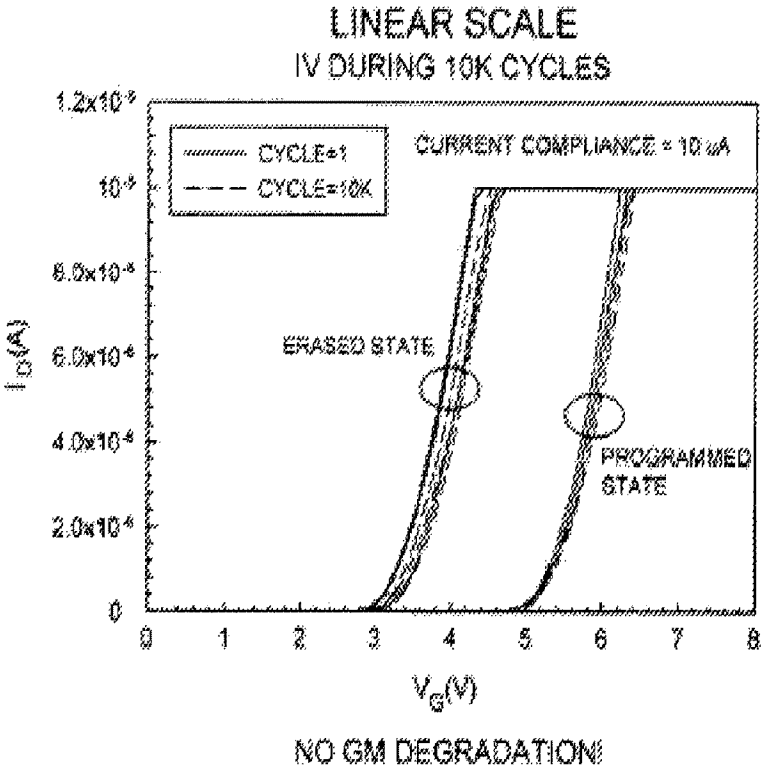
FIGS. 19a and 19b are graphical representations of the current at the drain of a memory cell in accordance with one embodiment under various gate voltages depicted in a logarithmic scale and a linear scale, respectively.
Figure 19A:
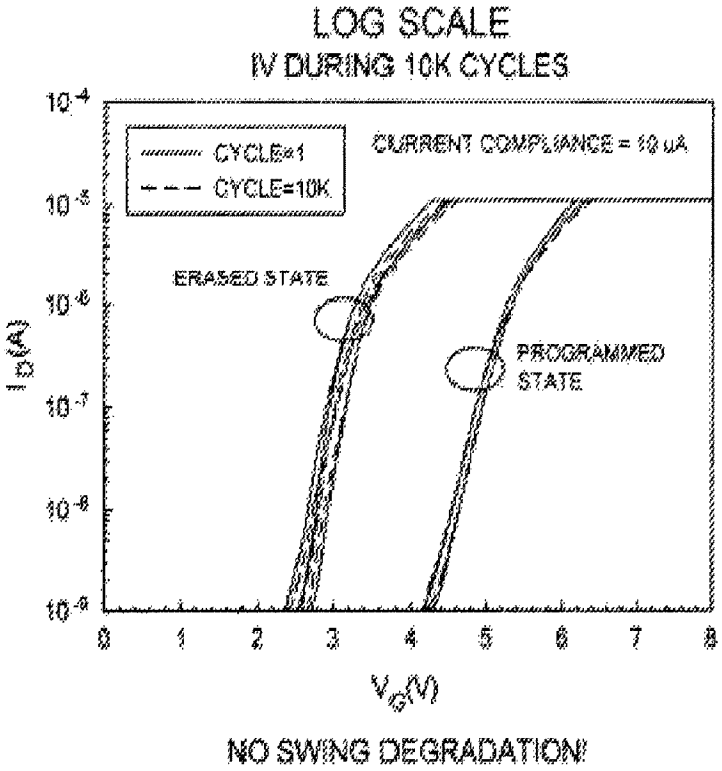

FIGS. 19a and 19b illustrate I-V characteristics during P/E cycles in one example. The corresponding I-V curves in both log scale (FIG. 19a) and linear scale (FIG. 19b) are shown. In one example, an SONONOS device possesses little degradations after numerous P/E cycles, such that both the subthreshold swing (S.S.) and trans-conductance (gm) are almost the same after numerous cycles. This SONONOS device possesses superior endurance properties than NROM device. One reason may be that hot-hole injection is not used. Additionally, an ultra-thin oxide as noted above may possess better stress immunity properties than a thick tunnel oxide.

Figure 20:
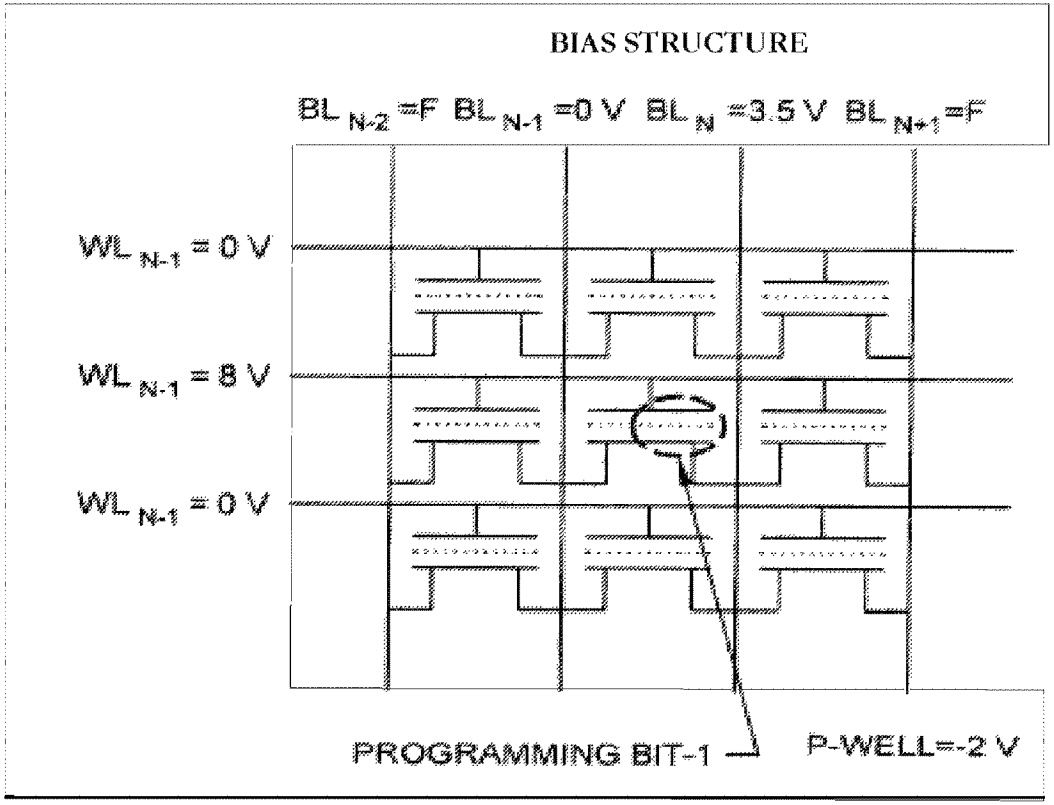
FIG. 20 is an equivalent circuit diagram of an array including memory cells in accordance with one embodiment of the present invention depicting one method of programming a bit in accordance with the present invention.

FIG. 20 illustrates a CHISEL programming scheme in one example. An alternative way to program the device is to use CHISEL programming scheme, which uses negative substrate bias enhanced impact ionization to increase the hot carrier efficiency. The programming current can be also reduced due to the body effect. Typical condition is illustrated in this figure, where substrate is applied with a negative voltage (−2 V), and the junction voltage is reduced to about 3.5 V. For conventional NROM devices and technologies, CHISEL programming is not applicable because it may inject more electrons near the channel center region. And hot-hole erase is inefficient to remove the electrons near the channel center region in the conventional NROM devices.

Figure 21B:
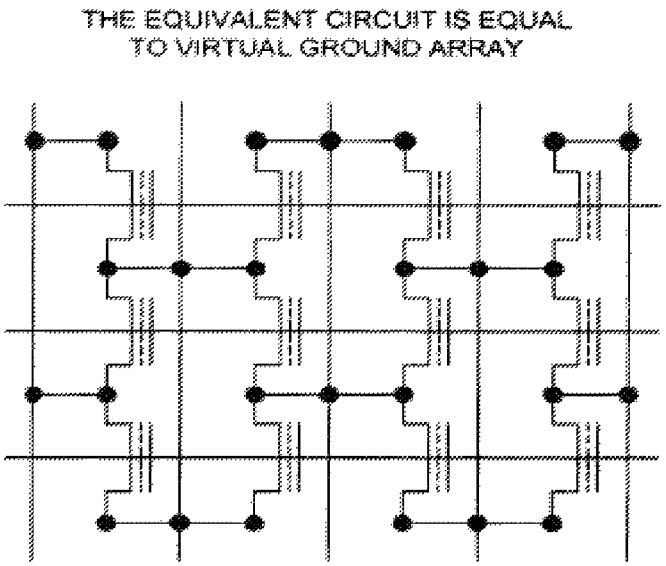
FIGS. 21a and 21b are a layout view and equivalent circuit diagram of a virtual ground array in accordance with one embodiment of the present invention.
Figure 21A:
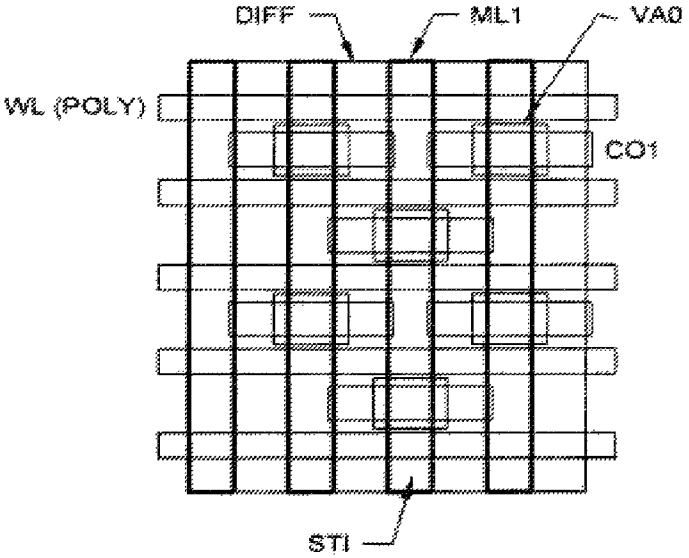

FIGS. 21a and 21b illustrate the design of a JTOX virtual ground array in one example. The JTOX virtual ground array provides an alternative implementation of using SONONOS memory cells in a memory array. In one example, one difference between the JTOX structure and a virtual ground array is that the devices in the JTOX structure that are isolated by STI processes. A typical layout example is illustrated in FIG. 21a. FIG. 21b illustrates a corresponding equivalent circuit, which is the same as that of a virtual ground array.

As noted above, memory cell structures in accordance with the present invention are suitable for both NOR- and NAND-type flash memories. The following will describe additional examples of memory array designs and their operation methods. Without limiting the scope of the invention to the specific structures described below, various operation methods in accordance with memory arrays of the present invention are described below for exemplary NAND architectures.

Figure 22B:
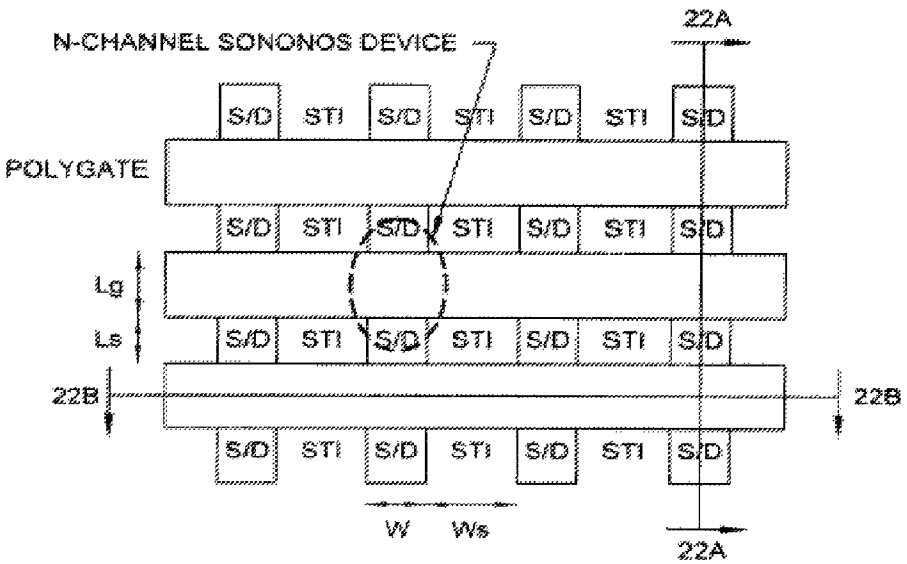
FIGS. 22a and 22b are an equivalent circuit diagram and layout view, respectively, of a NAND array of memory cells in accordance with one embodiment of the present invention.
Figure 22A:
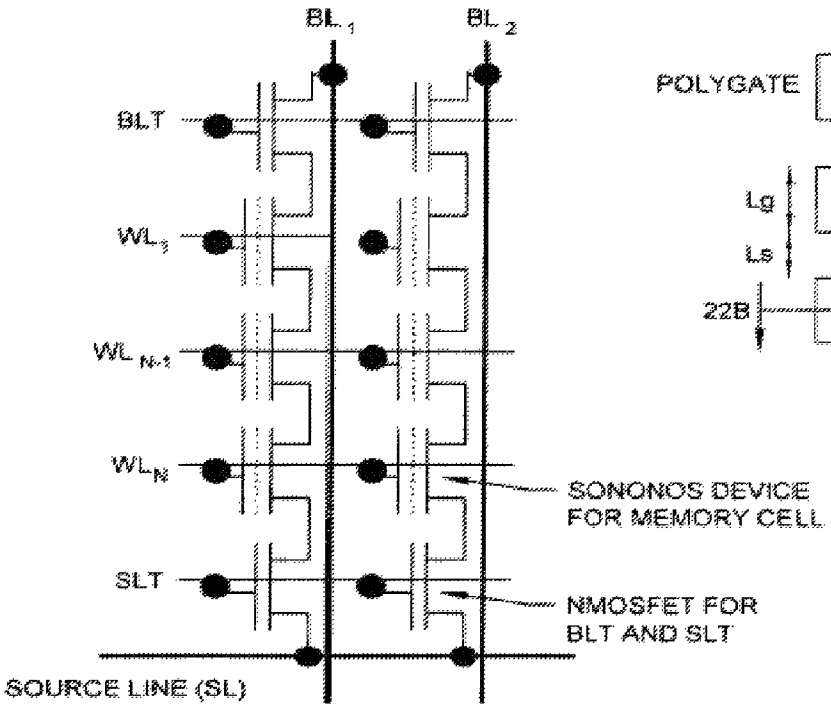
Figure 23A:
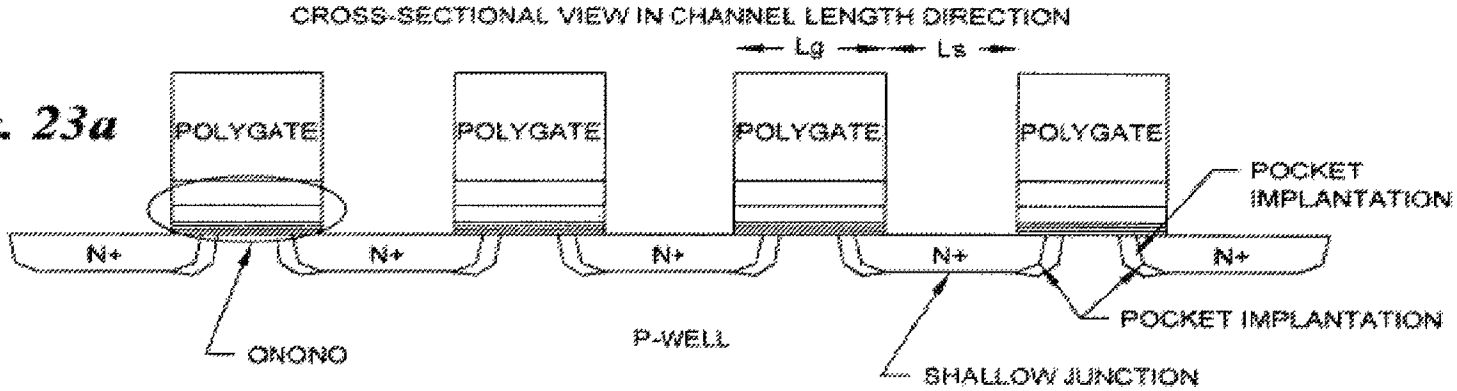
FIGS. 23a and 23b are cross-sectional schematic representations of a NAND array of memory cells in accordance with one embodiment of the present invention taken along lines 22A-22A and 22B-22B, respectively, as shown in FIG. 22b.
Figure 23B:
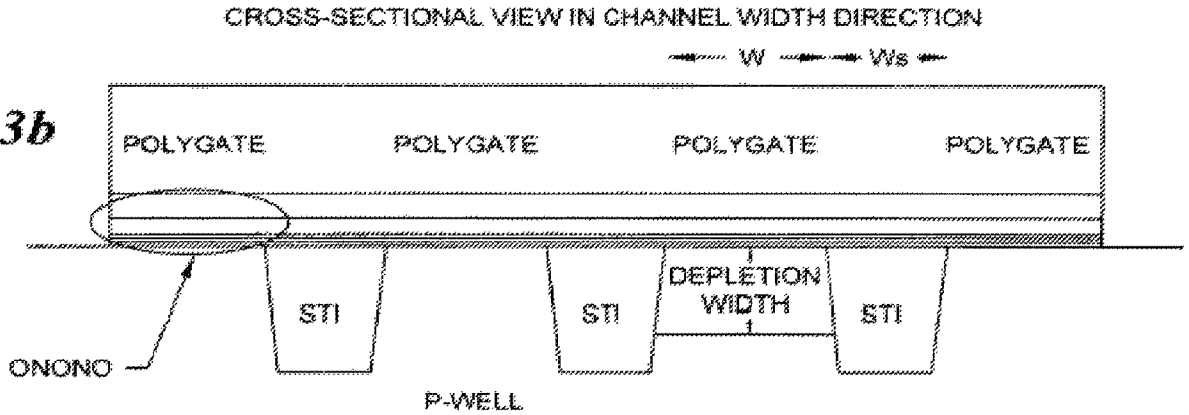

As noted above, n-channel SONONOS memory devices having an ONO tunneling dielectric may be used in a memory device. FIGS. 22a and 22b illustrate an example of a NAND array architecture. FIGS. 23a and 23b illustrate the cross-sectional views of an exemplary memory array design from two different directions. In some examples, the operation methods of a memory array may include +FN programming, −FN erase, and reading methods. Additionally, circuit operation methods may be included to avoid program disturb in some examples.

In addition to the single-block gate structure design, a split-gate array, such as a NAND array using SONONOS devices positioned between two transistor gates which are located next to the source/drain regions, may also be used. In some examples, a split-gate design may scale down device dimension to F=30 nm or below. Furthermore, the devices may be designed to obtain good reliability, to reduce or eliminate the inter-floating-gate coupling effect, or to achieve both. As discussed above, an SONONOS memory device may provide excellent self-converging, or high speed erase, which may help sector-erase operations and Vt distribution control. Furthermore, a tightened erased state distribution may facilitate multi-level applications (MLC).

By using certain designs for a memory array structure, the effective channel length (Leff) may be enlarged to reduce or eliminate short-channel effects. Some examples may be designed to use no diffusion junctions, thereby avoiding the challenges in providing shallow junctions or using pocket implantations during the manufacturing processes of memory devices.

FIG. 1 illustrates an example of a memory device having an SONONOS design. In addition, Table 1 noted above illustrates an example of materials used for different layers and their thicknesses. In some examples, P+-polysilicon gate may be used to provide a lower saturated Reset/Erase Vt, which may be achieved by reducing gate injection.

FIGS. 22a and 22b illustrate an example of a memory array, such as an SONONOS-NAND array having memory cells in accordance with embodiment described in Table 1, with diffusion junctions. In one example, separate devices may be isolated from each other by various isolation techniques, such as by using shallow-trench isolation (STI) or the isolation technique of silicon-on-insulator (SOI). Referring to FIG. 22a, a memory array may include multiple bit lines, such as BL1 and BL2, and multiple word lines, such as WL1, WLN-1, and WLN. Additionally, the array may include source line transistor(s) (or source-line-selecting transistor(s) or SLTs) and bit line transistor(s) (or bit-line-selecting transistor(s) or BLTs). As illustrated, the memory cells in the array may use an SONONOS design, and the SLT and BLT may include n-type metal-oxide-semiconductor field-effect transistors (NMOSFETs).

FIG. 22b illustrates an exemplary layout of a memory array, such as a NAND array. Referring to FIG. 22b, Lg is the channel length of memory cells, and Ls is the space between each separate lines of memory devices. Additionally, W is the channel width of memory cells, and Ws is the width of isolation areas between separate bit lines or source/drain areas, which may be the STI width in one example.

Referring again to FIGS. 22a and 22b, the memory devices may be connected in series and form a NAND array. For example, a string of memory devices may include 16 or 32 memory devices, providing a string number of 16 or 32. The BLTs and SLTs may be used as selecting transistors to control the corresponding NAND strings. In one example, the gate dielectric for BLTs and SLTs may be a silicon oxide layer that does not include a silicon nitride trapping layer. Such configuration, although not necessarily required in every case, may avoid possible Vt shift of BLTs and SLTs during the operations of the memory array in some examples. Alternatively, the BLTs and SLTs may use the combination of ONONO layers as their gate dielectric layers.

In some examples, the gate voltages applied to BLTs and SLTs may be less than 10 V, which may cause less gate disturb. In cases where the gate dielectric layer of BLTs and SLTs may be charged or trapped with charges, additional −Vg erase can be applied to the gates of BLT or SLT to discharge their gate dielectric layers.

Referring again to FIG. 22a, each BLT may be coupled to a bit-line (BL). In one example, a BL may be a metal line having the same or approximately the same pitch to that of STI. Also, each SLT is connected to a source line (SL). The source line is parallel to the WL and connected to the sense amplifier for read sensing. The source line may be a metal, such as tungsten, or polysilicon line, or a diffusion N+-doped line.

FIG. 23a illustrates a cross-sectional view of an exemplary memory array, such as an SONONOS-NAND memory array, along the channel-length direction. Typically, Lg and Ls is approximately equal to F, which generally represents the critical dimension of a device (or node). The critical dimension may vary with the technologies used for fabrication. For example, F=50 nm stands for using a 50 nm node. FIG. 23b illustrates a cross-sectional view of an exemplary memory array, such as an SONONOS-NAND memory array, along the channel-width direction. Referring to FIG. 23b, the pitch in the channel-width direction is approximately equal or slightly larger than that in the channel length direction. Therefore, the size of a memory cell is approximately $4F^2$/cell.

In examples of manufacturing a memory array, such as the arrays noted above, the processes may involve using only two primary masks or lithography processes, such as one for the polysilicon (word line) and another for STI (bit lines). In contrast, the manufacturing of NAND-type floating gate devices may require at least two-poly processing and another inter-poly ONO processing. Accordingly, the structure and manufacturing processes of the proposed devices may be simpler than those of NAND-type floating gate memories.

Referring to FIG. 23a, in one example, the spaces (Ls) between word lines (WLs) may be formed with shallow junctions, such as shallow junctions of N+-doped regions, which may serve as source or drain regions of the memory devices. As illustrated in FIG. 23A, additional implantation and/or diffusion process, such as a tilt-angle pocket implantation, may be carried out to provide one or more "pocket" regions or pocket extensions of junctions that neighbor one or more of the shallow junction regions. In some examples, such configuration may provide better device characteristics.

In examples where STI is used of isolating separate memory devices, the trench depth of STI regions may be larger than the depletion width in p-well, especially when the junction bias used is raised higher. For example, the junction bias may be as high as about 7V for program inhibited bit line(s) (unselected bit line(s) during programming). In one example, the depth of STI regions may be in the range of about 200 to 400 nm.

Figure 24B:
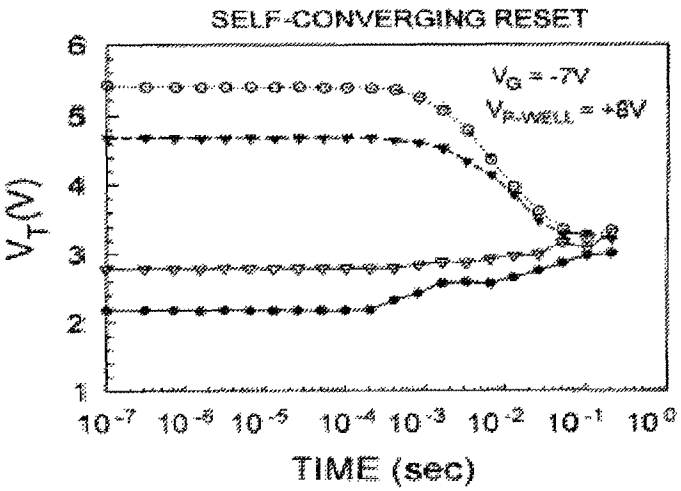
FIG. 24b is a graphical representation of threshold voltages over time during a reset operation in accordance with one embodiment of the present invention for two memory cells having different initial threshold voltages.
Figure 24A:
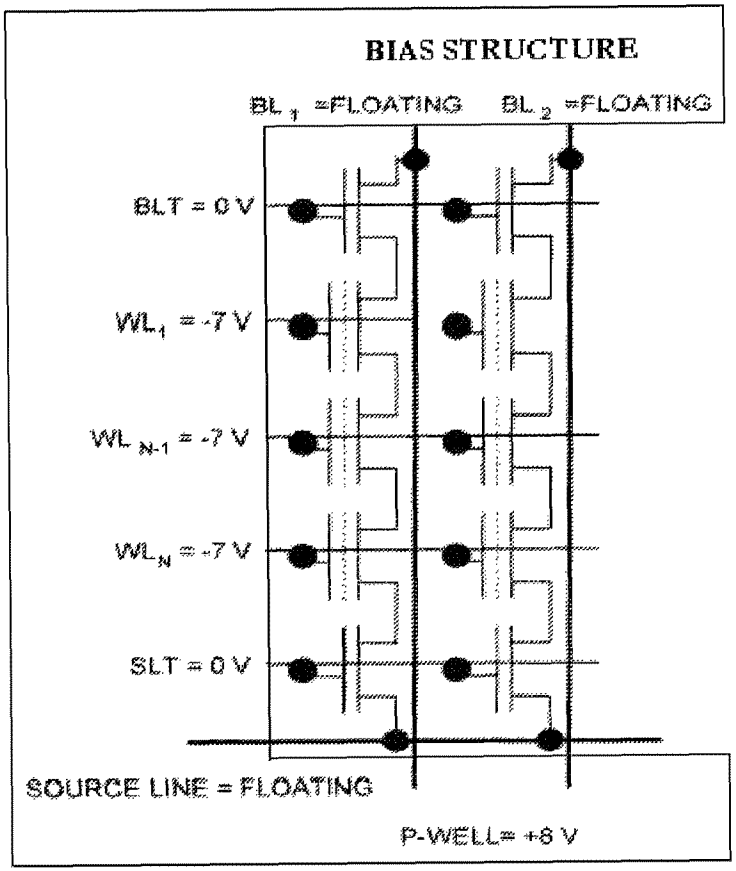
FIG. 24a is an equivalent circuit diagram of a NAND array in accordance with one embodiment of the present invention depicting one method of operation in accordance with the present invention.

After a memory array is manufactured, a reset operation may be performed to tighten the Vt distribution first before other operations of the memory array. FIG. 24a illustrates an example of such operation. In one example, before other operations start, one may first apply VG=about −7 V and VP-well=+8 V to reset the array (The voltage drop of VG and VP-Well can be partitioned into the gate voltage into each WL and p-well). During RESET, the BL's can be floating, or raised to the same voltage as the P-Well. As illustrated in FIG. 24b, the reset operation may provide excellent self-convergent properties. In one example, even SONONOS devices are initially charged to various Vts, the reset operation can "tighten" them to a Reset/Erase state. In one example, the reset time is about 100 msec. In that example, the memory array may use n-channel SONONOS devices with ONONO=15/20/18/70/90 angstroms having an N+-polysilicon gate with Lg/W=0.22/0.16 μm.

Generally, traditionally floating-gate devices are not capable of providing self-converging erase. In contrast, SONONOS devices may be operated with converging Reset/Erase methods. In some examples, this operation may become essential because the initial Vt distribution is often in a wide range due to certain process issues, such as process non-uniformity or plasma charging effects. The exemplary self-converging "Reset" may help to tighten, or narrow the range of, the initial Vt distribution of memory devices.

In one example of programming operations, the selected WL may be applied with a high voltage, such as a voltage of about +16 V to +20 V, to induce channel +FN injection. Other PASS gates (other unselected WL's) may be turned on to induce the inversion layer in a NAND string. +FN programming may be a low-power method in some examples. In one example, parallel programming methods such as page programming with 4K Bytes cells in parallel can burst the programming throughput to more than 10 MB/sec, while the total current consumption can be controlled within 1 mA. In some examples, to avoid program disturb in other BLs, a high voltage, such as a voltage of about 7 V may be applied to other BLs so that the inversion layer potential is raised higher to suppress the voltage drop in the unselected BLs (such as cell B in FIG. 25).

In examples of read operations, the selected WL may be raised to a voltage that is between an erased state level (EV) and a programmed state level (PV). Other WLs may serve as the "PASS gates" so that their gate voltages may be raised a voltage higher than PV. In some examples, erase operations may be similar to the reset operation noted above, which may allow self-convergence to the same or similar reset Vt.

Figure 25:
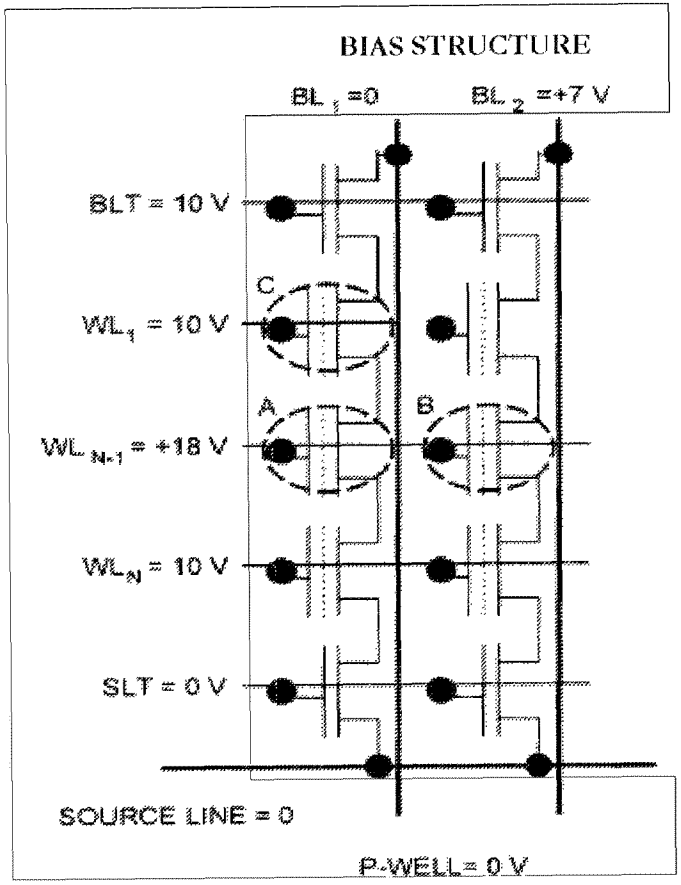
FIG. 25 is an equivalent circuit diagram depicting a method of operation in accordance with one embodiment of the present invention.

FIG. 25 illustrates an example of operating a memory array. Programming may include channel +FN injection of electrons into an SONONOS nitride trapping layer. Some examples may include applying Vg=about +18 V to the selected WLN-1, and applying VG=about +10 V to other WLs, as well as the BLT. The SLT can be turned off to avoid channel hot electron injection in cell B. In this example, because all the transistors in the NAND string are turned-on, the inversion layer passes through the strings. Furthermore, because BL1 is grounded, the inversion layer in BL1 has zero potential. On the other hand, other BLs are raised to a high potential, such as a voltage of about +7 V, so that the inversion layer of other BLs are higher.

In particular, for cell A, which is the cell selected for programming, the voltage drop is about +18 V, which causes +FN injection. And the Vt may be raised to PV. For cell B, the voltage drop is +11 V, causing much less +FN injection, as FN injection is sensitive to Vg. For cell C, only +10 V is applied, causing no or negligible +FN injection. In some examples, a programming operation is not limited to the technique illustrated. In other words, other adequate program inhibit techniques may be applied.

Figure 26:
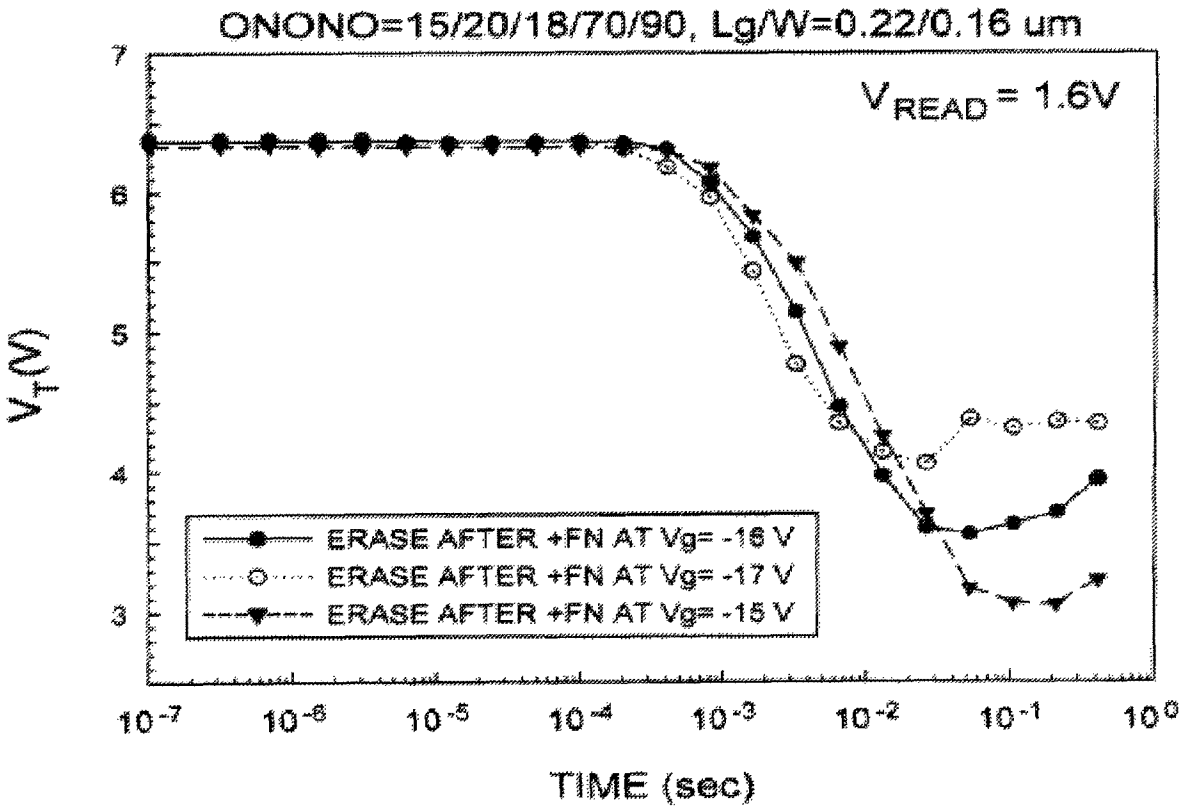
FIG. 26 is a graphical representation of the threshold voltage of a memory cell in accordance with one embodiment of the present invention over time under various erasing conditions.
Figure 27:
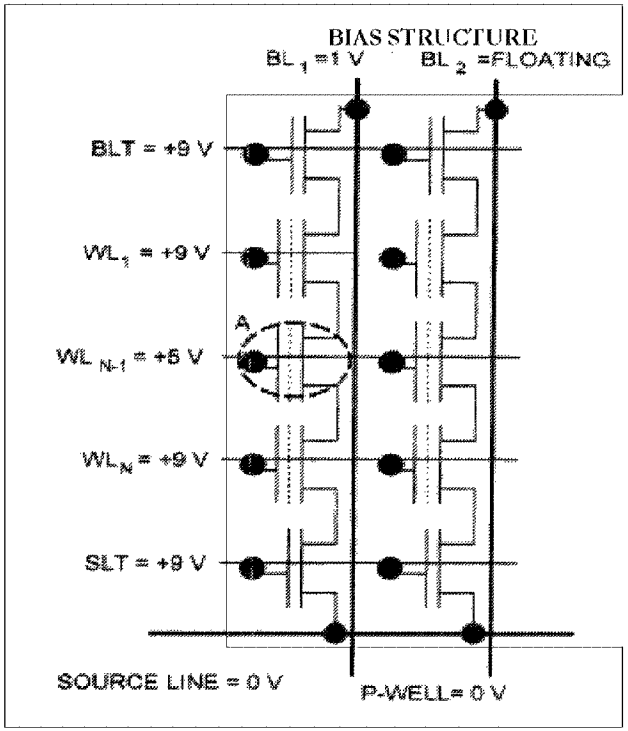
FIG. 27 is an equivalent circuit diagram depicting a method of operation in accordance with one embodiment of the present invention.

FIGS. 24a, 26, and 27 further illustrate some examples of array operations and illustrate the endurance and retention properties of some examples. As illustrated, the device degradation after a number of operation cycles may remain very small. FIG. 24A illustrates an exemplary erase operation, which may be similar to a reset operation. In one example, the erase is performed by sector or block. As noted above, the memory devices may have good self-converging erase property. In some examples, the erase saturation Vt may be dependent on Vg. For example, a higher Vg may cause a higher saturated Vt. As illustrated in FIG. 26, the convergent time may be around 10 to 100 msec.

FIG. 27 illustrates an exemplary reading operation. In one example, reading may be performed by applying a gate voltage that is between an erased state Vt (EV) and a programmed state Vt (PV). For example, the gate voltage may be about 5 V. On the other hand, other WLs and BLT and SLT are applied with a higher gate voltage, such as a voltage of about +9 V, to turn-on all the other memory cells. In one example, if Vt of cell A is higher than 5 V, the read current may be very small (<0.1 uA). If Vt of cell A is lower than 5 V, the read current may be higher (>0.1 uA). As a result, the memory state, i.e. the stored information, can be identified.

In some examples, the pass gate voltage for other WLs should be higher than the high-Vt state or the programmed state Vt, but not too high to trigger gate disturb. In one example, the PASS voltage is in the range of about 7 to 10 V. The applied voltage at the BL may be about 1 V. Although a larger read voltage may induce more current, the read disturb may become more apparent in some examples. In some examples, the sensing amplifier can be either placed on a source line (source sensing) or on a bit line (drain sensing).

Some examples of NAND strings may have 8, 16, or 32 memory devices per string. A larger NAND string may save more overhead and increase array efficiency. However, in some examples, the read current may be smaller and disturb may become more apparent. Therefore, adequate numbers of NAND string should be chosen based on various design, manufacture, and operation factors.

Figure 28:
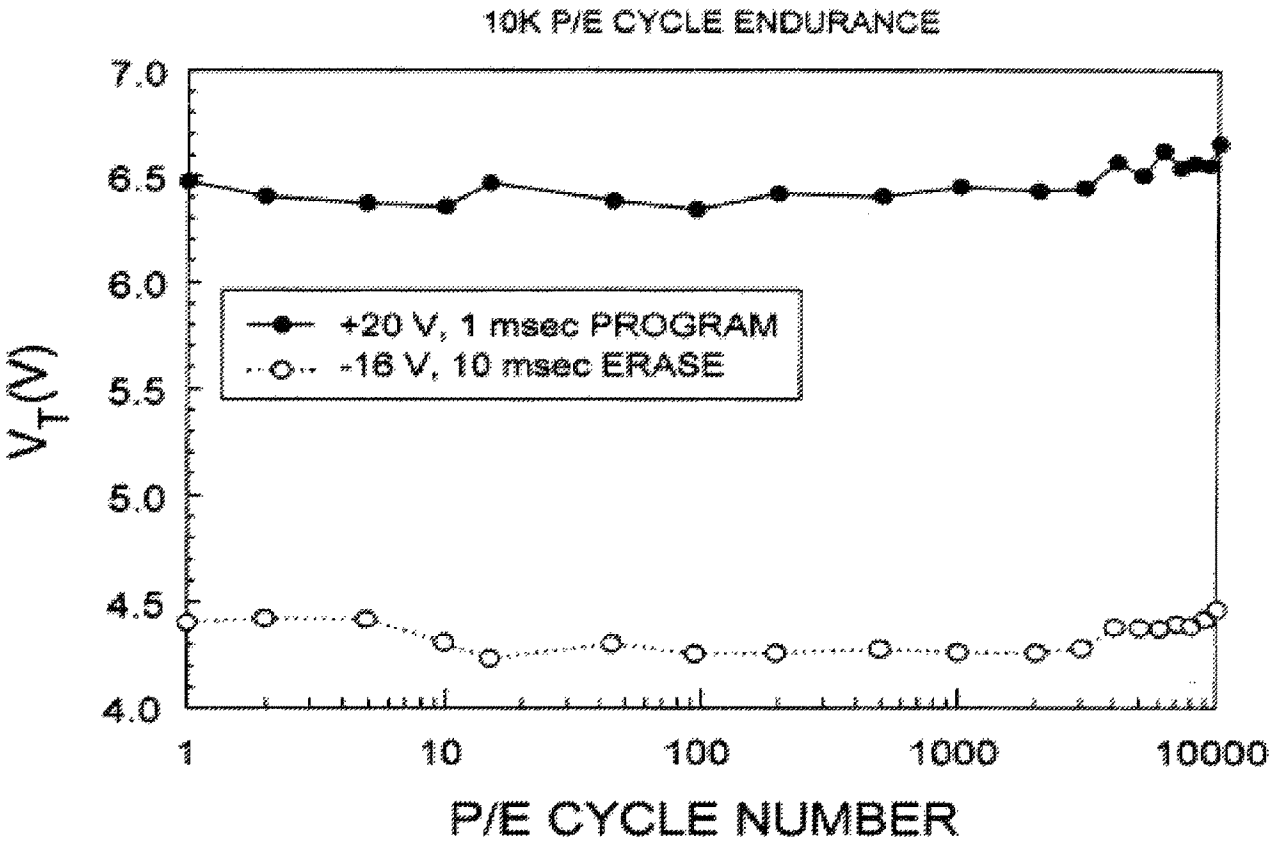
FIG. 28 is a graphical representation of the threshold voltage of a memory cell in accordance with one embodiment of the present invention over the course of numerous programs/erase cycles under one set of programming and erasing conditions

FIG. 28 illustrates the cycle endurance of certain exemplary devices. Referring to FIG. 28, P/E cycles with +FN program and −FN erase may be carried out, and the results suggest good endurance characteristics. In this example, the erase condition is Vg=about −16 V for 10 msec. In some examples, only single shot of erase is needed and verification of status is not necessary. The memory Vt window is good without degradation.

Figure 29B:
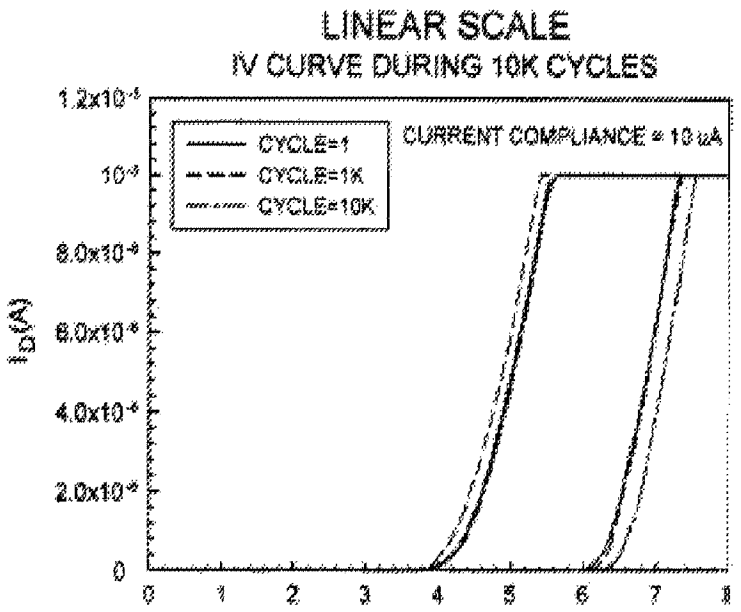
FIGS. 29a and 29b are graphical representations of the current at the drain of a memory cell in accordance with one embodiment under various gate voltages at three different cycle numbers depicted in a logarithmic scale and a linear scale, respectively
Figure 29A:
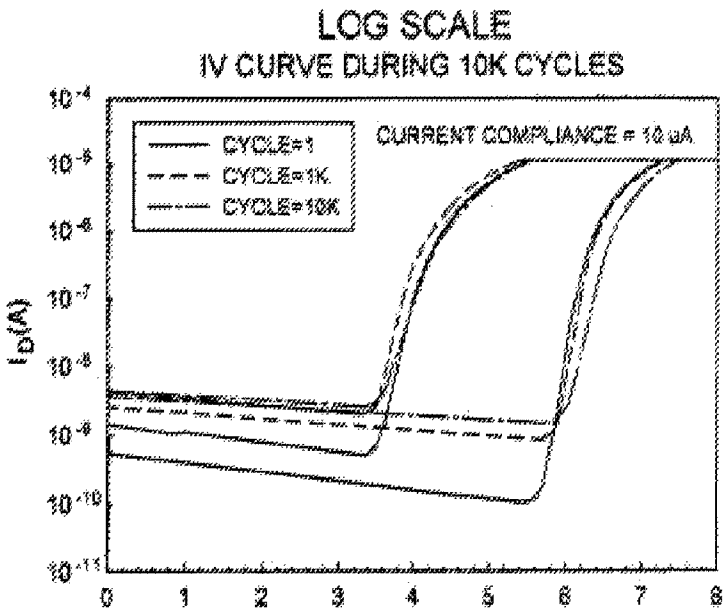
Figure 30:
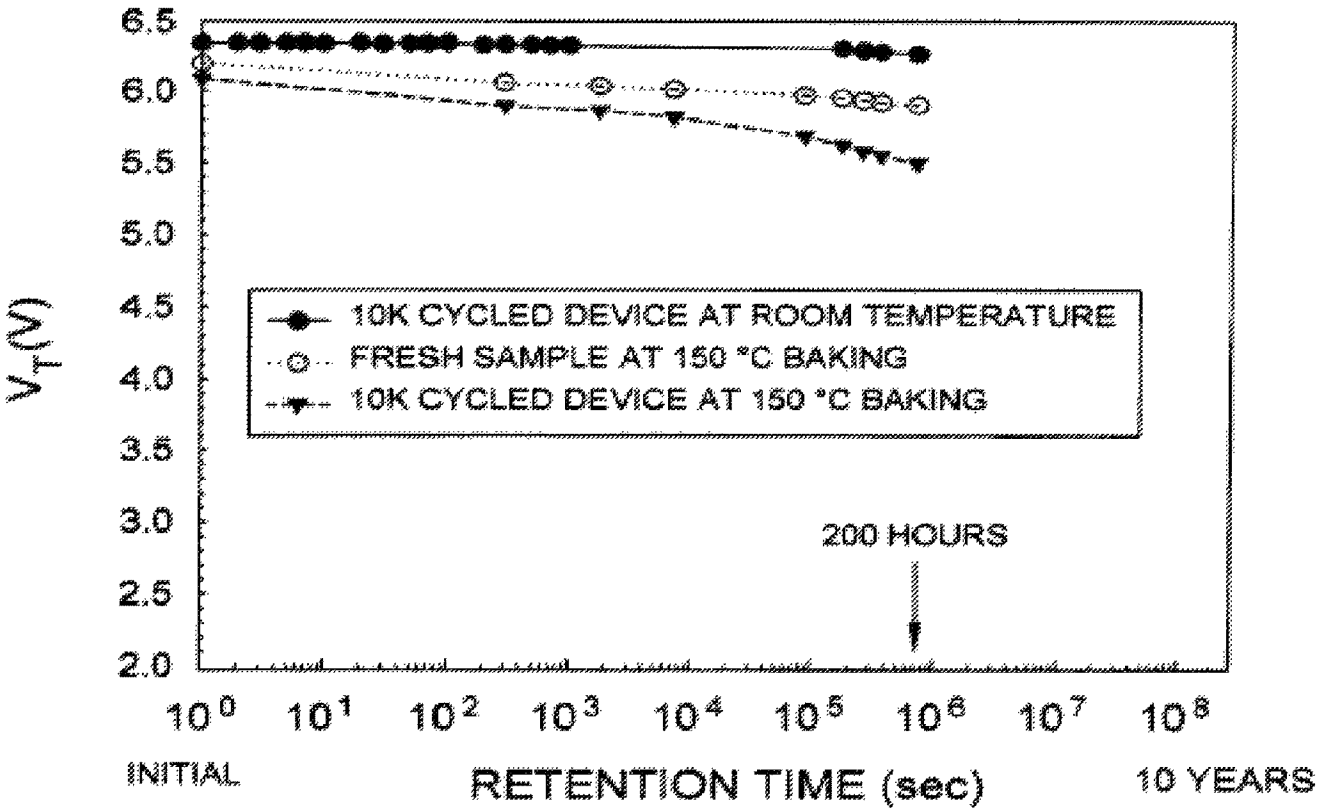
FIG. 30 is a graphical representation of the threshold voltage of memory cells in accordance with one embodiment of the present invention over time during retention at three different temperature and cycle conditions.

FIGS. 29a and 29b illustrate the IV characteristics of exemplary memory devices using different scales. In particular, FIG. 29a illustrates a small swing degradation of the device, and FIG. 29b illustrates a small gm degradation of the device. FIG. 30 illustrates the retention characteristics of an exemplary SONONOS device. Referring to FIG. 30, a good retention is provided by having less than 100 mV charge loss for device operated after 10K cycles and after leaving for 200 hours at room temperature. FIG. 30 also illustrates an acceptable charge loss at high temperatures.

Figure 31:
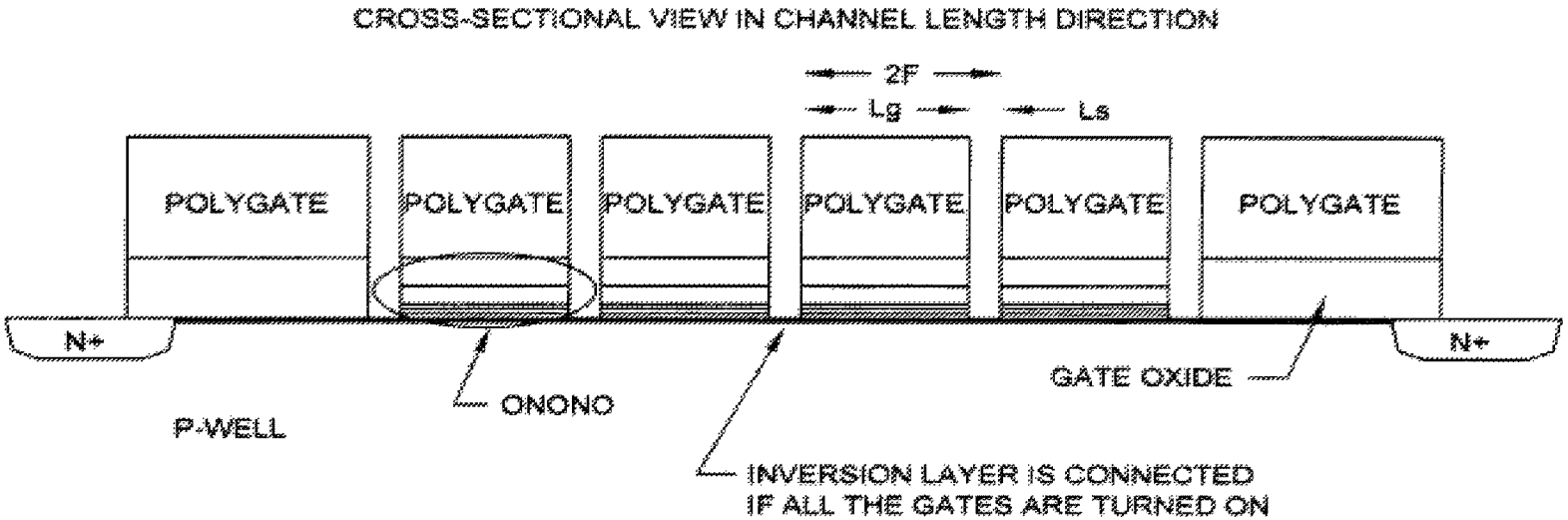
FIG. 31 is a cross-sectional schematic representation of a NAND array wordline in accordance with one embodiment of the present invention.

In some examples, a split-gate design, such as a split-gate SONONOS-NAND design, may be used to achieve a more aggressive down-scaling of a memory array. FIG. 31 illustrates an example of using such design. Referring to FIG. 31, the spaces (Ls) between each word line, or between two neighboring memory devices sharing the same bit line, may be reduced. In one example, Ls may be shrunk to about or less than 30 nm. As illustrated, the memory devices using a split-gate design along the same bit line may share only one source region and one drain region. In other words, a split-gate SONONOS-NAND array may use no diffusion regions or junctions, such as N+-doped regions, for some of the memory devices. In one example, the design may also reduce or eliminate the need for shallow junctions and neighboring "pockets", which in some examples may involve a more complicated manufacturing process. Furthermore, in some examples, the design is less affected by short-channel effects, because the channel length has been increased, such as increased to Lg=2F−Ls in one example.

Figure 32:
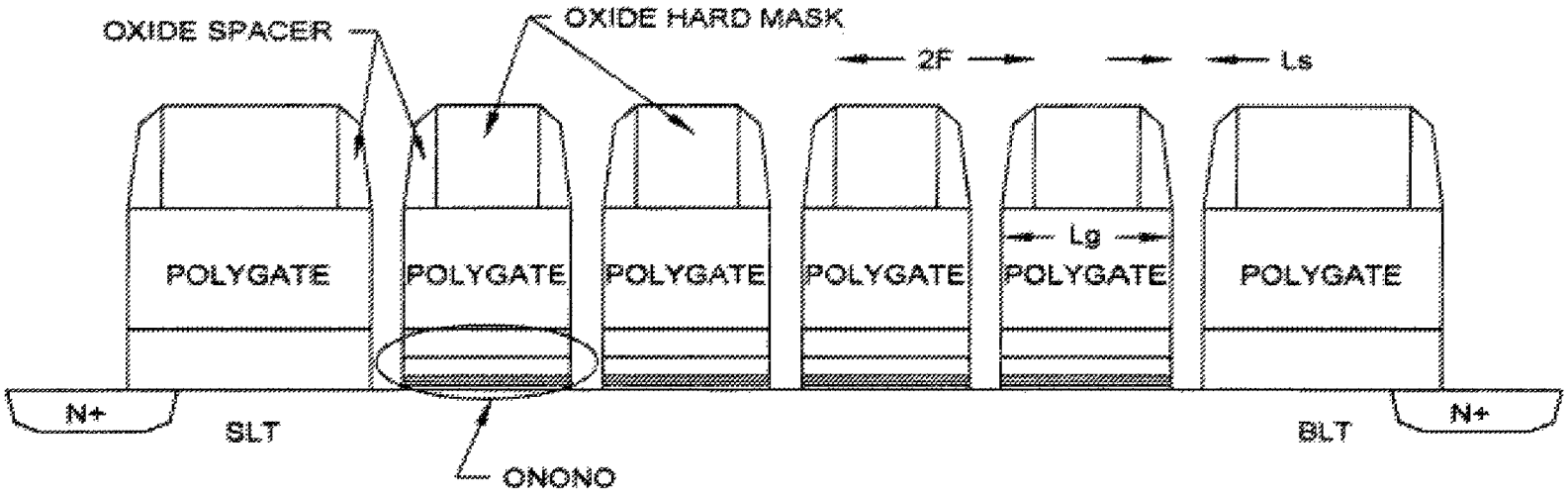
FIG. 32 is a cross-sectional schematic representation of a NAND array wordline formation technique in accordance with one embodiment of the present invention.

FIG. 32 illustrates an exemplary manufacturing process of a memory array using a split-gate design. The schematic diagram is merely an illustrative example, and the memory array may be designed and manufactured in various different ways. Referring to FIG. 32, after multiple layers of materials for providing the memory devices are formed, those layers may be patterned using a silicon oxide structure as a hard mask formed over those layers. For example, the silicon oxide regions may be defined by lithography and etching processes. In one example, the pattern used for defining the initial silicon oxide regions may have a width of about F and the space between the silicon oxide regions of about F, resulting a pitch of about 2F. After the initial silicon oxide regions are patterned, silicon oxide spacers may then be formed surrounding the patterned regions to enlarge each silicon oxide region and narrow their spacing.

Referring again to FIG. 32, after the silicon oxide regions are formed, they are used as a hard mask to define or pattern their underlying layers to provide one or more memory devices, such as multiple NAND strings. In addition, insulating materials, such as silicon oxide, may be used to fill in the spaces, such as Ls spaces shown in FIG. 32, between the neighboring memory devices.

In one example, the space Ls between neighboring memory devices along the same bit line may be in the range of about 15 nm to about 30 nm. As noted above, the effective channel length may be enlarged to 2F−Ls in this example. In one example, if F is about 30 nm and Ls is about 15 nm, Leff is about 45 nm. For the operation of those exemplary memory devices, the gate voltage may be reduced to below 15 V. In addition, the inter-polysilicon voltage drop between word lines may be designed to be no larger than 7V to avoid breakdown of the spacers in the Ls spaces. In one example, this may be achieved by having an electric field of less than 5 MV/cm between neighboring word lines.

The Leff with diffusion junctions for conventional NAND floating-gate devices is about half of the their gate length. In contrast, if F is about 50 nm and Leff is about 30 nm, Leff is about 80 nm for the proposed design (the split-gate NAND) in one example. The longer Leff can provide better device characteristics by reducing or eliminating the impact of short-channel effects.

As illustrated above, a split-gate NAND design may further shrink the space (Ls) between neighboring memory cells of the same bit line. In contrast, traditional NAND-type floating-gate devices may not provide a small spacing, because inter-floating-gate coupling effect may lose the memory window The inter-floating gate coupling is the interference between adjacent memory cells when the coupling capacitance between adjacent floating gate is high (the space between the floating gates is small so that the coupling capacitance between the adjacent floating gates becomes very high such that read disturb happens). As noted above, the design may eliminate the need to fabricate certain diffusion junctions, and the inversion layer can be directly connected if all the word lines are turned on. Therefore, the design may simplify the manufacturing process of memory devices.

A multi-layer SONOS device is described using and ultra-thin ONO tunneling dielectric. With an n+ polysilicon gate, a self-convergent positive erase threshold voltage of for example about +3 V is achieved suitable for a NOR architecture, in which channel hot electron programming can be applied for storing two-bits per cell, read using the standard reverse read method, and erased with hole tunneling erase apply electric field assisted FN tunneling with a gate voltage of for example −15 volts. With a p+ polysilicon (or other high work function material) gate, a depletion mode device can be obtained having an erase threshold voltage less than zero, with a very large memory window with a program threshold voltage over about 6 volts can be achieved, suitable for NAND architecture using electric field assisted FN electron tunneling for program and electric field assisted FN hole tunneling for erase operations, with a gate voltage during erasing of for example −18 Volts.

Figure 33:
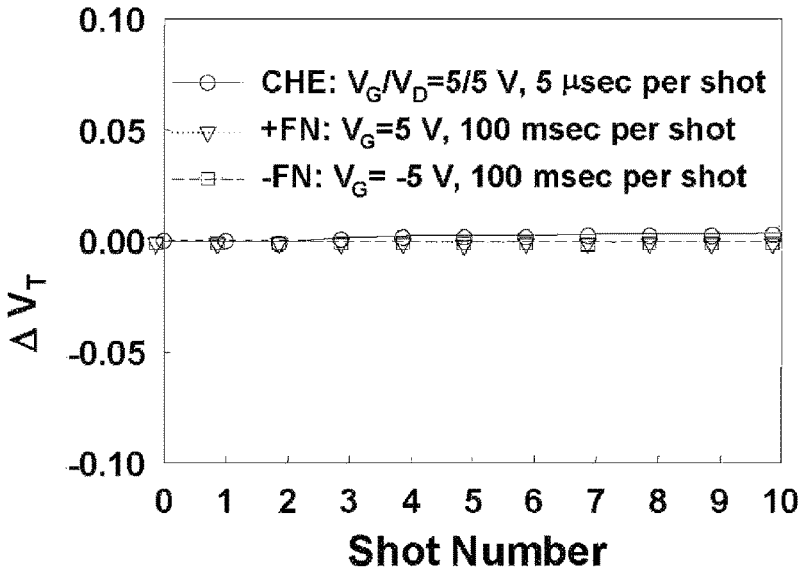
FIG. 33 is a graph of the change in threshold voltage versus the number of programming pulses for an nMOSFET having an ONO tunneling dielectric for a number of programming bias arrangements.

FIG. 33 is a graph of change in threshold voltage of a MOSFET having an ultra-thin multi layer gate dielectric (O1/N1/O2=15/20/18 Angstroms) versus an number of shots of program disturb bias pulses or erase disturb bias pulses showing negligible charge trapping in the ONO gate dielectric regardless of the injection mode CHE, +FN, −FN in an exemplary device with a tunneling dielectric.

Figure 34:
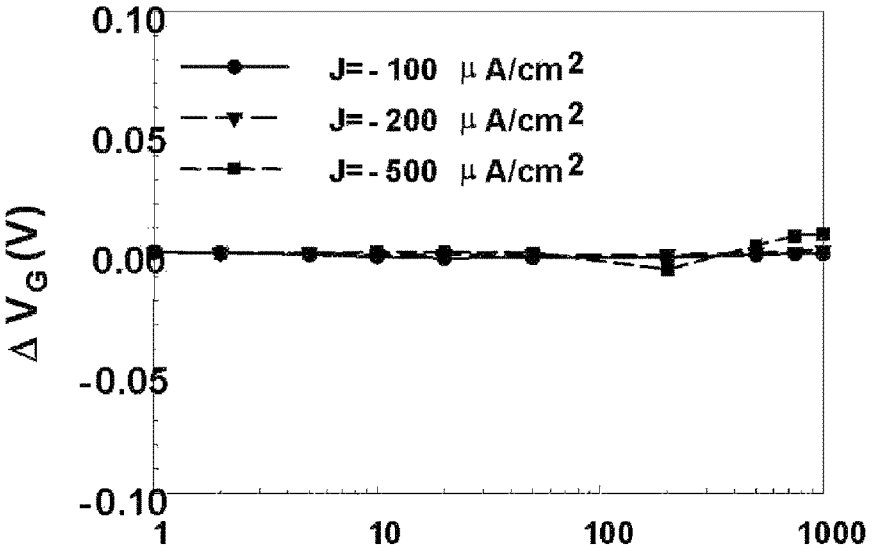
FIG. 34 a graph of the change in voltage versus time under negative current stress for a capacitor having an ONO tunneling dielectric insulator.

FIG. 34 is a graph of change in gate voltage versus time under constant current stress in an ultra-thin ONO dielectric capacitor, demonstrating small charge trapping under negative gate current stress and indicating excellent stress tolerance. The small trapping efficiency may be due to that the capture mean free path is much longer than the nitride thickness of about 20 Angstroms. This suggests that the N1 layer less than 20 Angstroms is desirable. In addition, no interfacial traps between O1/N1 and N1/O2 are introduced during processing in preferred embodiments.

Figure 35:
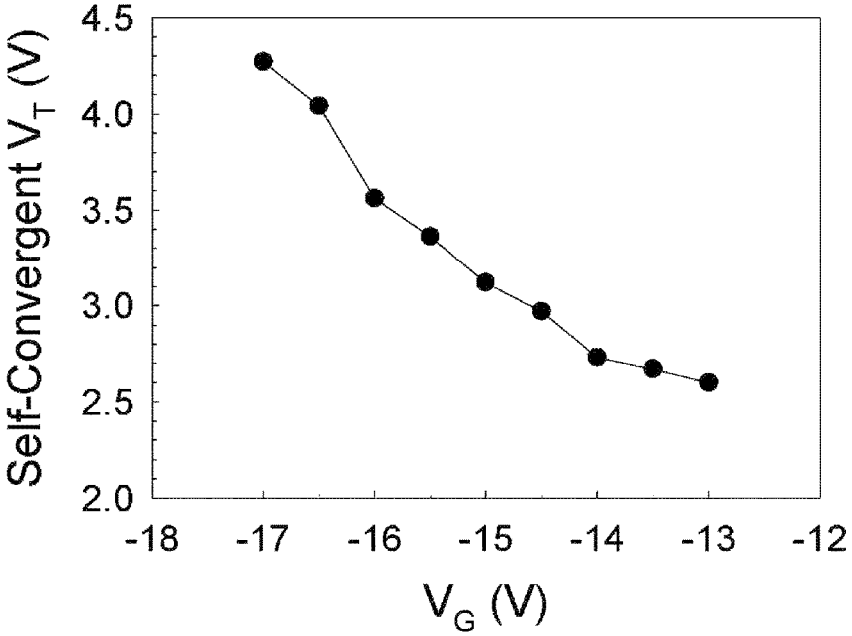
FIG. 35 is a graph of the self-convergent threshold voltage versus of erase gate voltage.

FIG. 35 is a graph of the self-convergent threshold voltage $V_T$ as a function of erase gate voltage $V_G$ during the erase process of a device having an ultra-thin multi layer tunnel dielectric (O1/N1/O2=15/20/18 Angstroms) and having an N+-poly gate. A larger magnitude gate voltage $V_G$ results in a higher saturation value of $V_T$ because gate injection is stronger. A high self-convergent erase is desirable in NOR architectures, because it avoids over-erase problems.

Figure 36:
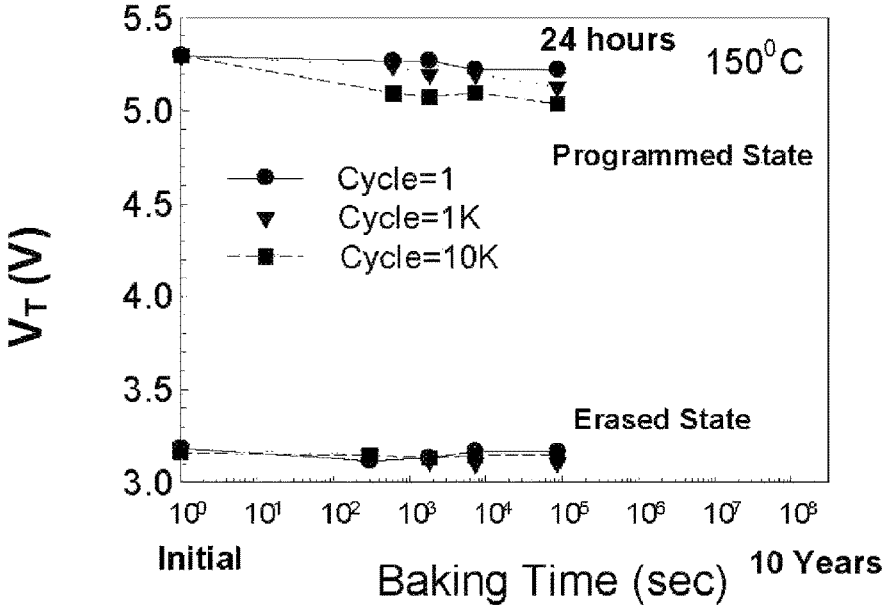
FIG. 36 illustrates endurance of a memory cell as described herein, with high-temperature baking of a device in accordance with an embodiment.

FIG. 36 is a graph of threshold voltage versus baking time, for the exemplary device having an N+-poly gate at various P/E cycle counts, for both erase state and programmed state cells, showing excellent electron retention for the multi-layer BE-SONOS device.

Figure 37:
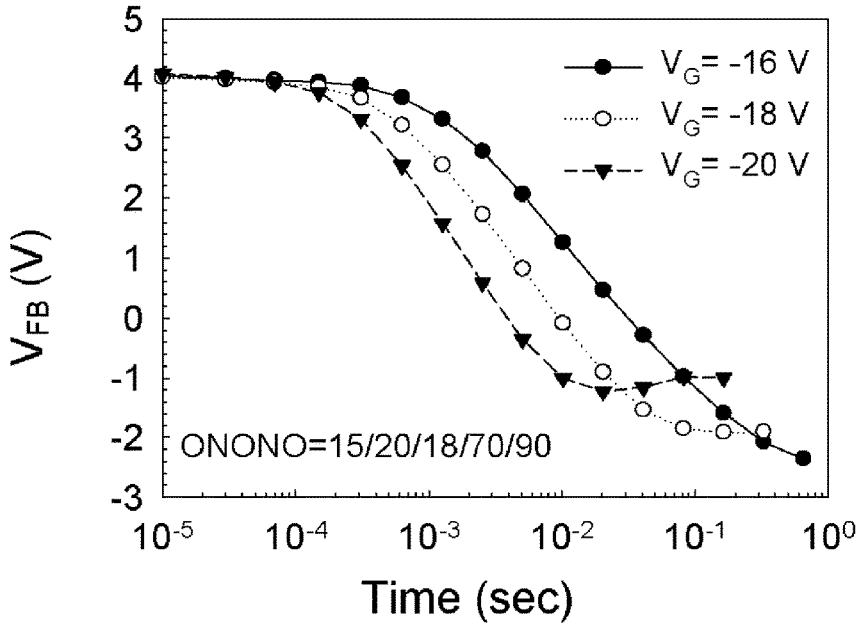
FIG. 37 illustrates change in flat band voltage versus erase time for −FN programming bias levels in a device in accordance with an embodiment.

For NAND applications, a depletion mode device ($V_T$<0) for the erased state is desired. By using a P+-poly gate, the gate injection is reduced and the device can be erased into depletion mode as shown in FIG. 37. FIG. 37 is a graph of flat band voltage versus time for a multi-layer cell (ONONO=15/20/18/70/90 Angstroms) showing that the erase time decreases with a higher magnitude negative gate voltage. FIG. 37 also illustrates that at larger $V_G$ (e.g. about −20 volts), gate injection becomes significant, resulting in erase saturation at around −1 Volts.

Figure 38:
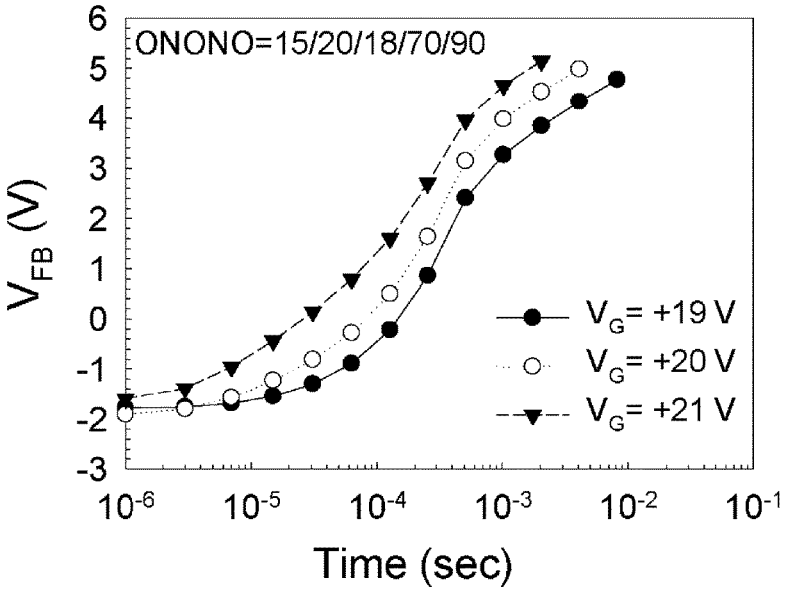
FIG. 38 illustrates change in flat band voltage versus program time for +FN programming bias levels in a device in accordance with an embodiment.

FIG. 38 is a graph of flat band voltage versus time for +FN programming characteristics at $V_G$ equal to +19, +20 and +21 volts, for an exemplary device having a P+-poly gate and an ONONO=15/20/18/70/90 Angstroms. As illustrated in FIG. 38, a large memory window (as much as about 7 V in this graph) can be obtained within 10 msec and a 3 V memory window can be achieved in less than 200 μsec.

Figure 39:
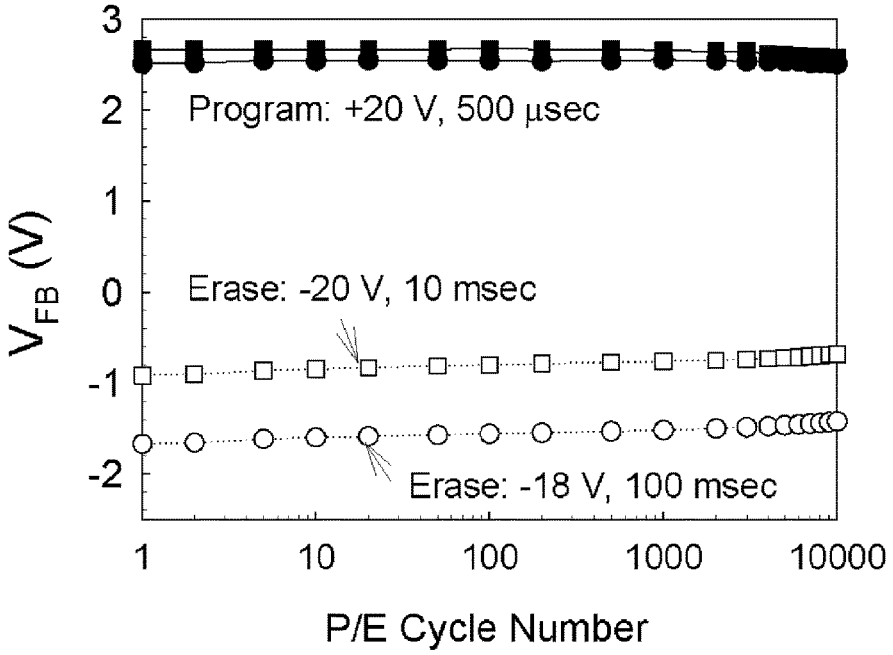
FIG. 39 illustrates the P/E cycle endurance of a device in accordance with an embodiment.

FIG. 39 is a graph of flat band voltage versus program/erase cycle number, for a program pulse of +20 volts for 500 micro seconds per cycle, and erase pulse of −20 volts for 10 msec per cycle or −18 volts for 100 msec per cycle, illustrating the P/E cycle endurance of an exemplary device having a P+-poly gate, showing excellent cycling endurance. In FIG. 39 a one-shot program and a one-shot erase was used during each P/E cycle.

Figure 40:
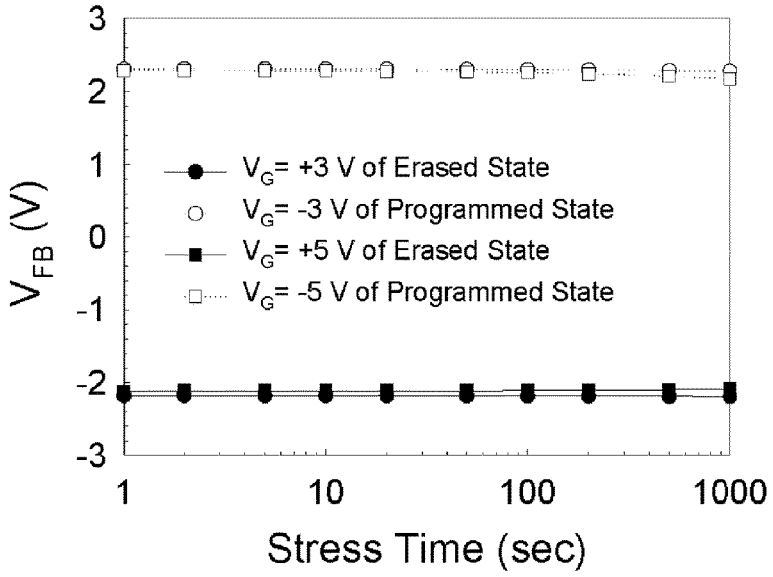
FIG. 40 illustrates an accelerated retention test of a device in accordance with an embodiment.

FIG. 40 is a graph of flat band voltage versus stress time, illustrating a $V_G$ accelerated retention test with $-V_G$ applied for programmed state and $+V_G$ for erased state of the exemplary device having a P+-poly gate. As illustrated in FIG. 40, the small charge loss and small charge gain indicate that the direct tunneling is suppressed at medium electric field (<4 MV/cm).

Figure 41:
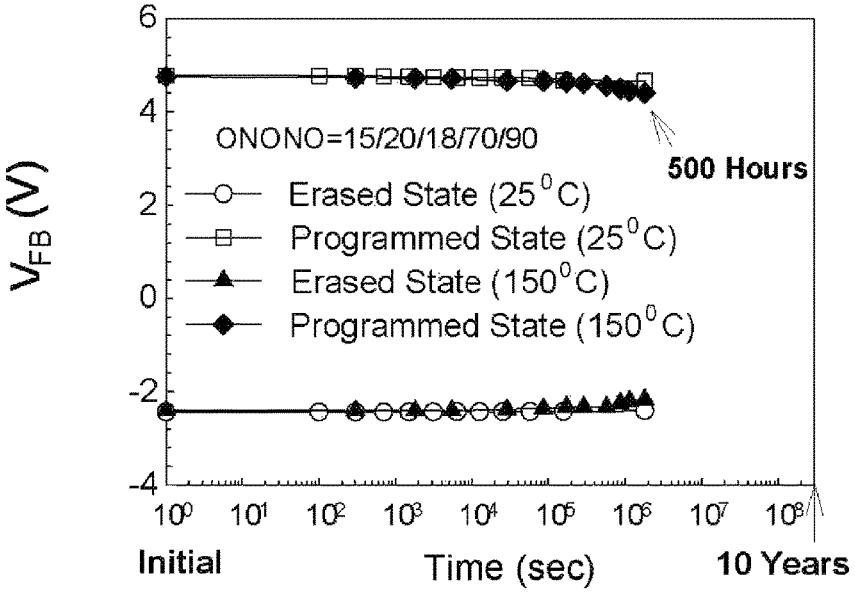
FIG. 41 illustrates the charge retention in the charge trapping nitride N2 at room temperature and high temperature of a device in accordance with an embodiment.

FIG. 41 is a graph of flat band voltage versus time, illustrating charge retention in the charge trapping nitride N2 at room temperature and at high temperature of an exemplary device having a P+-poly gate in accordance with an embodiment. As can be seen in FIG. 41, the charge loss and charge gain are negligible at room temperature. Additionally, more than a 6 V memory window can be preserved even after 500 hours of 150 baking. The large memory window greater than 6 volts, and the excellent retention are very good results for SONOS type devices.

Figure 42:
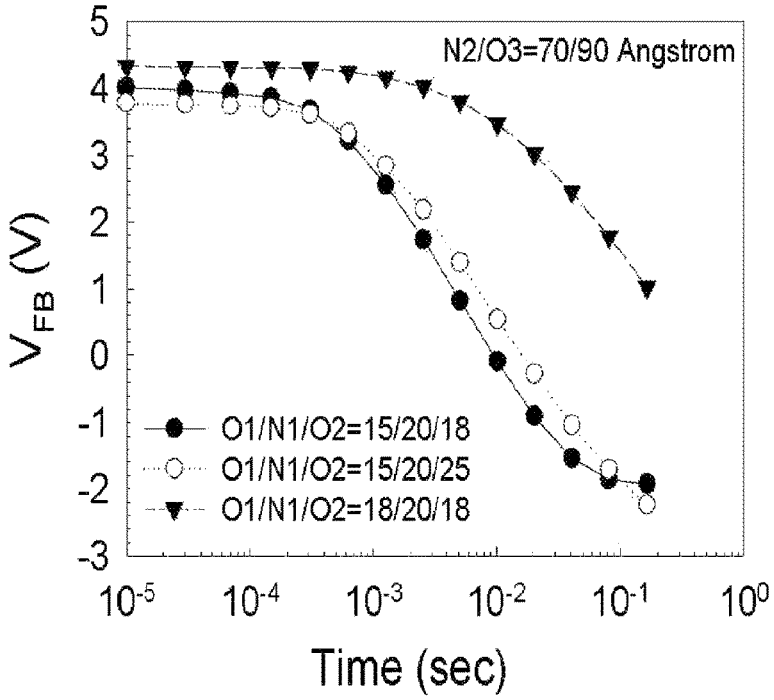
FIG. 42 illustrates the erase characteristics of devices of varying dimensions in accordance with embodiments.

FIG. 42 is a graph of flat band voltage versus time for an erase process in a ONONO device with N2 and O3 layers at 70 and 90 Angstroms respectively, and the O1, N1 and O2 layers at 15/20/18, 15/20/25 and 18/20/18, illustrating that the erase speed of BE-SONOS devices improves significantly with the O1 layer thicknesses less than 20 Angstroms, specifically in this example at 18 Angstroms or 15 Angstroms. In fact, with O1 at 15 Angstroms, the erase speed improves substantially, making erase speeds less than 100 milliseconds and less than 10 milliseconds achievable. For a 15 Angstrom O1 layer, more than 3 volts reduction in flat band voltage (which correlates closely with change in threshold voltage) is accomplished in less than 10 milliseconds. As can be seen in FIG. 42, the erase speed is very sensitive to changes in O1. As can be seen in FIG. 42, a decrease in O1 thickness from 18 Angstroms to 15 Angstroms results in a dramatic decrease in erase time. Changes in the thickness of O2 generally have a much smaller effect on erase speed. This is because the ONO tunneling is dominated by the O1 layer, while the O2 layer is either almost screened (as shown in FIG. 5c) or is completely screened (as shown in FIG. 5d) during an erase bias operation.

Figure 43:
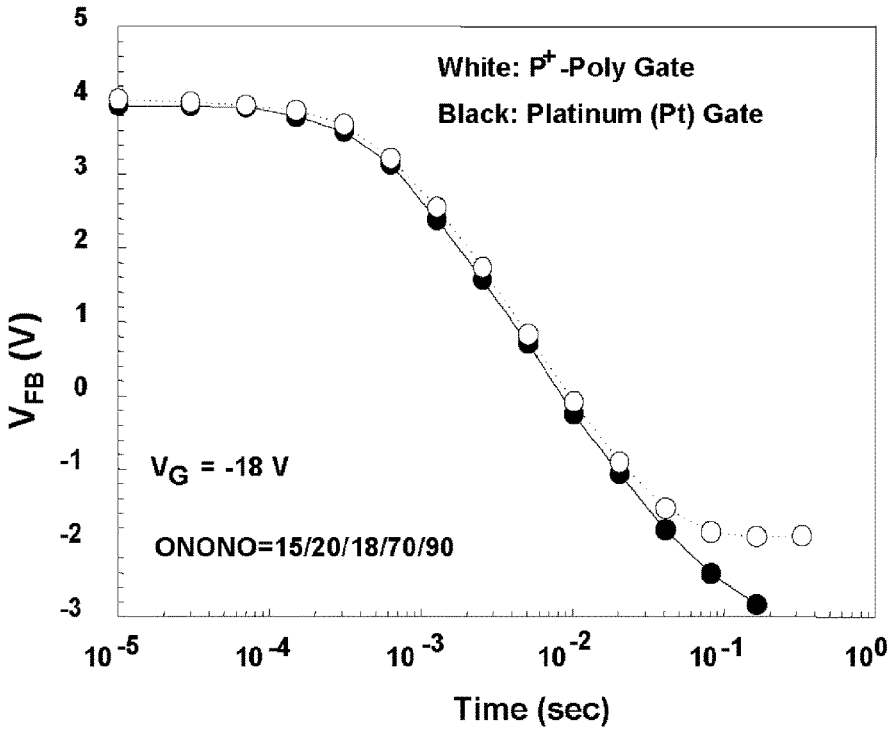
FIG. 43 illustrates the erase characteristics of devices of various gate material in accordance with embodiments.

FIG. 43 is a graph of flat band voltage versus time for an erase bias of −18 volts, in a device having BE-SONOS structure with ONONO=15/20/18/70/90 Angstroms. FIG. 43 is a comparison of the erase characteristic of the exemplary device having a P+-poly gate and the exemplary device having a Platinum (Pt) gate. Pt has a higher work function than P+ polysilicon, that is sufficient to lead to a non-saturated erase as is shown in FIG. 43. The high work function gate material can be patterned, for example, by a lift-off process.

As illustrated, some examples noted above, including the structural design, array design, and operation of memory devices, may provide desirable array dimension, good reliability, good performance, or the combination of any of them. Some examples noted may be applicable for downscaling the dimensions of non-volatile flash memories, such as NAND flash memories and flash memory for data applications. Some examples may provide SONONOS devices with uniform and high speed channel hole-tunneling erase. Some examples also may provide good endurance of memory devices and reduce certain no hard-to-erase or over-erase issues. Also, good device characteristics, such as small degradations after P/E cycles and good charge retention, may be provided. Device uniformity within a memory array may be provided without having erratic bits or cells. Furthermore, some examples may provide good short-channel device characteristics via a split-gate NAND design, which may offer a better sense margin during the operations of the memory devices.

Figure 44:
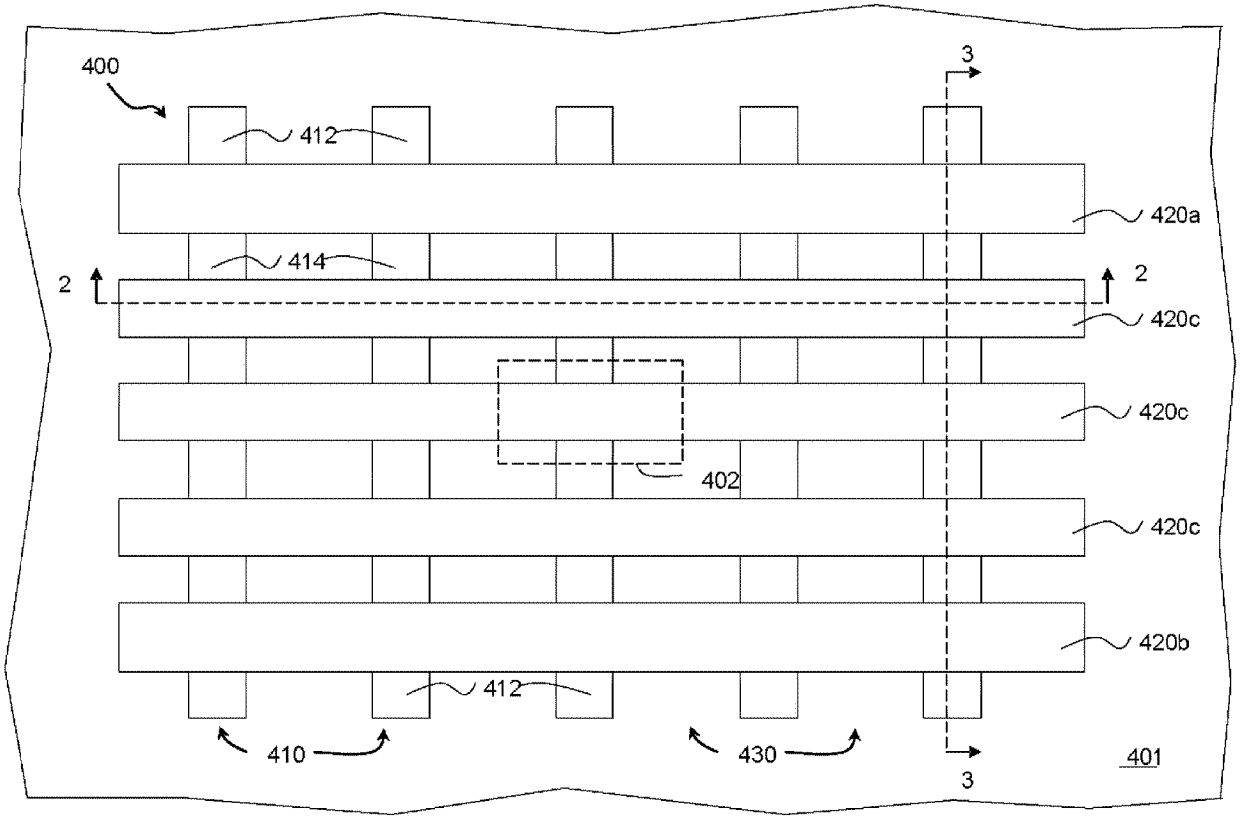
FIG. 44 is a schematic top view showing a portion of an exemplary memory array for a thin-film transistor, charge trapping memory array.

FIG. 44 is a schematic top view showing a portion of an exemplary memory array implemented using thin film transistor structures on an insulating substrate. Referring to FIG. 44, a portion of a memory array 400 is formed over an insulating substrate 401. The portion of the memory array 400 includes a plurality of parallel semiconductor body regions 410 formed within an insulating layer in the substrate 401 and a plurality of parallel word lines 420c between select lines 420a and 420b. The select lines 420a and 420b and the word lines 420c may be over and substantially perpendicular to the semiconductor body regions 410. The number of the word lines 420c is not limited to number shown in FIG. 44. The number of the word lines 420c may be 8, 16, 32, 64, 128 or other number that is desired to be configured for a memory array.

The substrate 401 may be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. For silicon on insulator SOI embodiments, the substrate 401 includes at least one insulating dielectric layer such as dielectric layer 405 (shown in FIG. 46A) formed over a bulk material 401, such as a semiconductor chip.

Referring again to the embodiment shown in FIG. 44, each of the semiconductor body regions 410 includes at least one junction region such as the junction regions 412 adjacent to the select lines 420a and 420b on opposite ends of a continuous, junction-free channel region. The semiconductor body regions 410 include at least one region such as regions 414 between two neighboring word lines. The select line 420a may be referred to as a block select line and the select line 420b may be referred to as a source select line. The junction regions 412 are coupled to global bit lines or source lines, by contact vias or otherwise (not shown). The select lines 420a and 420b are configured to couple a selected block or band of memory cells to the bit lines and source lines, when voltages are applied to the select lines 420a and 420b.

In the illustrated embodiment, the portion of the memory array 400 includes a plurality of parallel isolation trench structures 430 adjacent to the semiconductor body regions 410, and between two neighboring semiconductor body regions 410.

Referring again to FIG. 44, the rectangle 402 indicates a cell size of a memory cell, which is basically about twice the width of a wordline 420c, times the sum of the width of a trench 430 and the width of a well 410.

Figure 45:
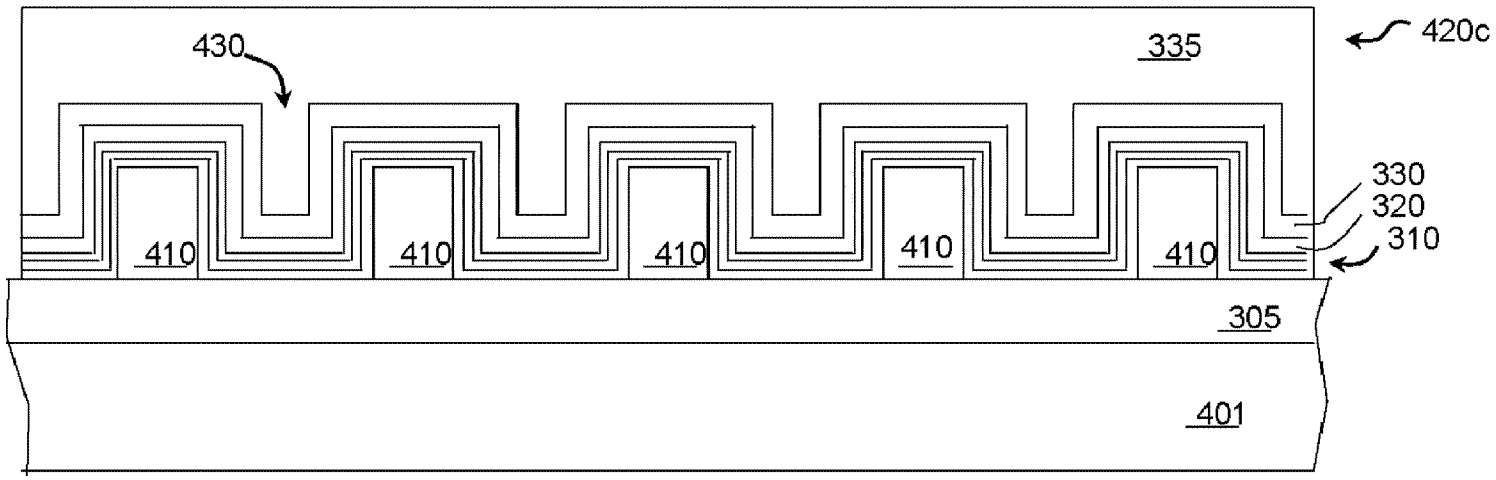
FIG. 45 is a schematic cross-sectional view of a portion of an exemplary array taken along the section line 2-2 of FIG. 44 for a thin-film transistor, charge trapping memory.

FIG. 45 is a schematic cross-sectional view of a portion of an exemplary array taken along the section line 2-2 through a word line 420c of FIG. 44, showing a perspective crossing the columns of cells in the array. In FIG. 45, the trench structures 430 are formed between two adjacent semiconductor body regions 410. A tunneling barrier 310, a charge storage layer 320, a dielectric insulating layer 330 and a conductive layer 335 overly and may be substantially conformal over the structure of the semiconductor body regions 410 and the trench structures 430. Detailed descriptions of the tunneling barrier 310, the charge storage layer 320, the dielectric layer 330 and the conductive layer 335 are described below in conjunction with FIG. 46A.

Figure 46A:
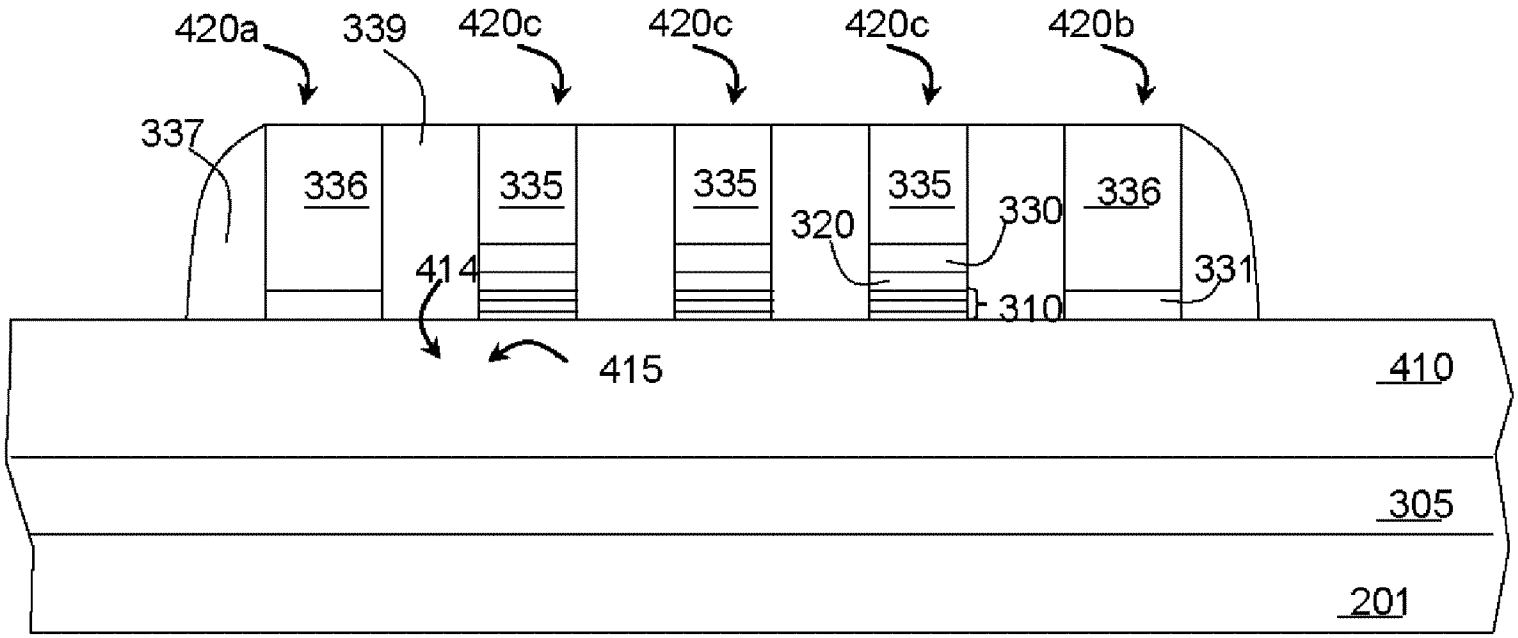
FIGS. 46A and 46B are schematic cross-sectional view showing an exemplary semiconductor structure taken along section line 3-3 of FIG. 44 for a thin-film transistor, charge trapping memory.
Figure 46B:
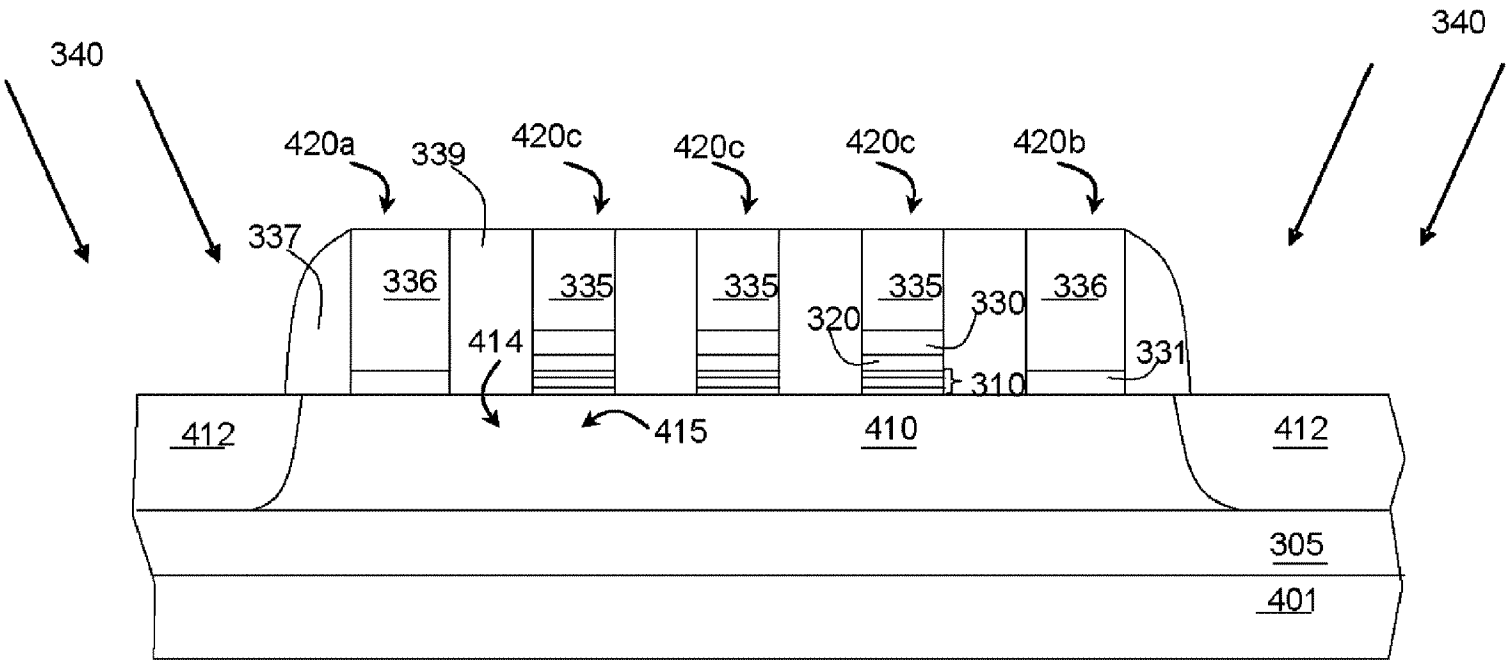

FIGS. 46A and 46B are schematic cross-sectional views showing stages in an exemplary method for forming an exemplary semiconductor structure taken along section line 3-3 of FIG. 44.

FIG. 46A is a cross-section taken along the line 3-3 of FIG. 44, showing a single column of cells in an junction-free NAND configuration. As shown in FIG. 46A, the dielectric layer 305 overlies the substrate 401. The body region 410 is formed over the dielectric layer 305. The dielectric layer 305 may be, for example, an oxide layer, a nitride layer, an oxynitride layer, other dielectric layer or various combinations thereof. In some embodiments, the dielectric layer 305 may be referred to as a buried oxide layer as known from silicon-on-insulator (SOI) structures. The body region 410 may be a silicon layer, a polysilicon layer, an amorphous silicon layer, a silicon-germanium layer, an epitaxial layer, other semiconductor material layer or various combinations thereof. In some embodiments for forming a p-type semiconductor body region, the semiconductor body region 410 may have dopants such as boron, gallium, aluminum and/or other group III element. In some embodiments, the semiconductor body region 410 and the dielectric layer 305 may be formed by a silicon-on-insulator (SOI) process. In other embodiments, the dielectric layer 305 may be formed by a chemical vapor deposition (CVD) process, an ultra high vacuum chemical vapor deposition (UHVCVD) process, an atomic layer chemical vapor deposition (ALCVD) process, a metal organic chemical vapor deposition (MOCVD) process or other CVD process. The semiconductor body region 410 may be formed by, for example, an epitaxial process, a CVD process, a crystallization process, or various combinations thereof. In one embodiment, the TFT device has a 60 nm thick poly silicon channel over the buried oxide. The poly silicon is an amorphous silicon (a-Si) layer deposited by low-pressure chemical vapor deposition (LPCVD) process, followed by a low-temperature thermal annealing (600) for crystallization. A multi-layer O1/N1/O2 tunneling dielectric is used to achieve easy hole tunneling during erase, while eliminating the direct tunneling leakage during retention. Next, SiN trapping layer (N2) and top blocking oxide (O3) are grown. A heavily doped P+-poly gate is adopted to suppress the gate injection during –FN erase. The device has a tri-gate structure as shown in FIG. 45, having in effect, 3 channel surfaces, one on each side and one on the top of the body 410.

The top oxide process has the largest thermal budget. Two top oxide (O3) formation processes are representative, including an LPCVD oxide (HTO) with rapid thermal annealing, and an in-situ steam generation (ISSG) oxidation to convert a portion of the trapping nitride (N2) into oxide. Lower thermal budget processes are preferred to reduce dopant diffusion from the select gate junctions. However, the ISSG process may result in better endurance characteristics, as we reported in Lai, et al. "A Multi-Layer Stackable Thin-Film Transistor (TFT) NAND-Type Flash Memory", International Electron Devices Meeting, IEDM, December, 2006, which article is incorporated by reference as if fully set forth herein. Planarization is then carried out by, for example, HDP oxide deposition and Chemical Mechanical Polishing. After forming the bottom-layer TFT devices, the processes are repeated to form a second and subsequent layers of TFT devices. Contact etching for the multiple layers can be performed independently to avoid over etching.

Referring again to FIG. 46A, the semiconductor body region 410 includes a continuous, junction-free channel region 414 between the select lines 420a, 420b, underlying the word lines 420c and between the word lines 420c. The semiconductor body region 410 includes at least one continuous, junction-free channel region such as regions 415 under the select lines 420a, 420b and the word lines 420c.

Each of the select lines 420a, 420b includes a gate insulator 331 and a conductive layer 336. The gate insulator 331 may be an oxide layer, a nitride layer, an oxynitride layer, high-k dielectric layer, other dielectric material layer or various combinations thereof. The conductive layer 336 may be, for example, a polysilicon layer, an amorphous silicon layer, a metal-containing layer, a tungsten silicide layer, a copper layer, an aluminum layer or other conductive material layer. The conductive layer 335 may be formed by, for example, a CVD process, a physical vapor deposition (PVD) process, an electroplating process and/or an electroless plating process.

Each of the word lines 420c may include the tunneling barrier 310, the charge storage layer 320, the dielectric layer 330 and the conductive layer 335. In some embodiments, the tunneling barrier 310, the charge storage layer 320, the dielectric layer 330 and the conductive layer 335 may be sequentially formed over the semiconductor body region 410.

The tunneling barrier 310 may allow charges, i.e., holes or electrons, tunneling from the semiconductor body regions 410 to the charge storage layer 320 during an erase operation and/or a reset operation. The tunneling barrier 310 may be an oxide layer, a nitride layer, an oxynitride layer, other dielectric layer, or various combinations thereof. In some embodiments, the tunneling barrier 310 may include a first oxide layer (not labeled), a nitride layer (not labeled) and a second oxide layer (not labeled) which are referred to as an ONO structure. In some embodiments, the first oxide layer may be an ultra-thin oxide which may have a thickness of about 2 nm or less. In another embodiment, the first oxide layer may have a thickness of about 1.5 nm or less. In other embodiments, the first oxide layer may have a thickness between about 0.5 nm and about 2 nm. The ultra-thin oxide layer may be formed, for example, by an in-situ steam generation (ISSG) process. The process for forming the nitride layer may use, for example, DCS and NH3 as precursors with a processing temperature at about 680. In some embodiments, the nitride layer may have a thickness of about 3 nm or less. In other embodiments, the nitride layer may have a thickness between about 1 nm and about 2 nm. The second oxide layer may be formed by, for example, a LPCVD process. In some embodiments, the second oxide layer may have a thickness of about 3.5 nm or less. In another embodiment, the second oxide layer may have a thickness of about 2.5 nm or less. In other embodiments, the second oxide layer may have a thickness between about 2.0 nm and about 3.5 nm.

The charge storage layer 320 may store charges such as electrons or holes therein. The charge storage layer 320 may be, for example, a nitride layer, an oxynitride layer, a polysilicon layer or other material layer that may desirably store charges. In some embodiments for forming a nitride charge storage layer, the process may use, for example, dichlorosilane DCS and $NH_3$ as precursors with a processing temperature at about 680. In other embodiments for forming an oxynitride charge storage layer, the process may use, for example, DCS, $NH_3$ and $N_2O$ as precursors. In some embodiments, the charge storage layer 320 may have a thickness of about 5 nm or more, for example, about 7 nm.

The dielectric layer 330 may isolate the conductive layer 335 from the charge storage layer 330. The dielectric layer 330 may be, for example, an oxide layer, a nitride layer, an oxynitride layer, an aluminum oxide layer, other dielectric materials or various combinations thereof. In some embodiments, the process for forming the dielectric layer 330 may convert a portion of the charge storage layer 320 such as a nitride layer so as to form the dielectric layer 330. The process may be a wet conversion process using O2 and $H_2O$ gas in furnace at a temperature between about 950 and about 1,000 For example, a nitride layer having a thickness of about 13 nm may be converted into the dielectric layer 330 having a thickness of about 9 nm and the remaining nitride layer, i.e., the charge storage layer 320, having a thickness of about 7 nm. The wet conversion process is applied for a small initial part of the layer, followed by deposition of the balance of the layer by lower thermal budget processes for deposition of silicon dioxide, such as a high temperature oxide HTO process or an in situ steam generation ISSG process. In still other embodiments, the dielectric layer 330 is formed over the charge storage layer 320 without a wet conversion process. Various thicknesses of the tunneling barrier 310, the charge storage layer 320 and the dielectric layer 330 may be used to form a desired structure.

The conductive layer 335 may be, for example, a polysilicon layer, an amorphous silicon layer, a metal-containing layer, a tungsten silicide layer, a copper layer, an aluminum layer or other conductive material layer, and combinations of layers of materials. The conductive layer 335 may be formed by, for example, a CVD process, a physical vapor deposition (PVD) process, an electroplating process and/or an electroless plating process. In some embodiments, the conductive layers 335 and 336 can be formed by the same process. In some embodiments, the structure including the tunneling barrier 310, the charge storage layer 320 and the dielectric layer 330 may be referred to as a bandgap engineered SONOS (BE-SONOS) structure.

Referring again to FIG. 46A, dielectric materials 339 are formed between the select lines 420a, 420b and the word lines 420c, and between the word lines 420c. The dielectric materials 339 may include, for example, oxide, nitride, oxynitride and/or other dielectric material. The dielectric materials 339 may be formed by, for example, a CVD process. At least one dielectric spacer such as dielectric spacers 337 are formed on sidewalls of the select lines 420a and 420b. The dielectric spacers 337 may include, for example, oxide, nitride, oxynitride and/or other dielectric material. In some embodiments, the dielectric spacers 337 and the dielectric material 339 are made of the same material and formed by the same process.

Referring to FIG. 46B, an implantation process 340 implants dopants into the semiconductor body region 410 by using the dielectric spacers 337 and/or dielectric materials 339 as an implantation mask so as to form at least one doped region such as the regions 412 to form junctions within the semiconductor body region 410. The regions 412 may be referred to as source/drain (S/D) regions of the select lines 420a and 420b. In some embodiments, the implantation process 340 may be a tilt implantation process, such that the regions 412 may be desirably formed within the semiconductor body region 410. In other embodiments, the implantation process 340 may have an implantation direction substantially perpendicular to the surface of the substrate 401 over which transistors are formed. In some embodiments for forming n-channel transistors, the implantation process 340 may use n-type dopants such as phosphorus, arsenic and/or other group V element.

Referring again to FIG. 46B, the implantation process 340 does not implant dopants such as n-type dopants into the semiconductor body region 410 such as a p-type semiconductor body region, because the dielectric spacers 337 and the dielectric materials 339 block the implantation process 340. Therefore, the implantation process 340 does not form source/drain regions at the regions 214 between the select lines 420a, 420b and word lines 420c. It is also noted that no implantation process is carried out to form common source/drain regions at the regions 414 of the semiconductor body region 410 in FIG. 46A. Accordingly, the regions 414 of the semiconductor body region 410 are junction-free. The dopant concentration of the regions 414 is thus substantially equal to that of the regions 415, providing a junction-free, continuous channel region under the select lines 420a, 420b and word lines 420c.

Figure 46C:
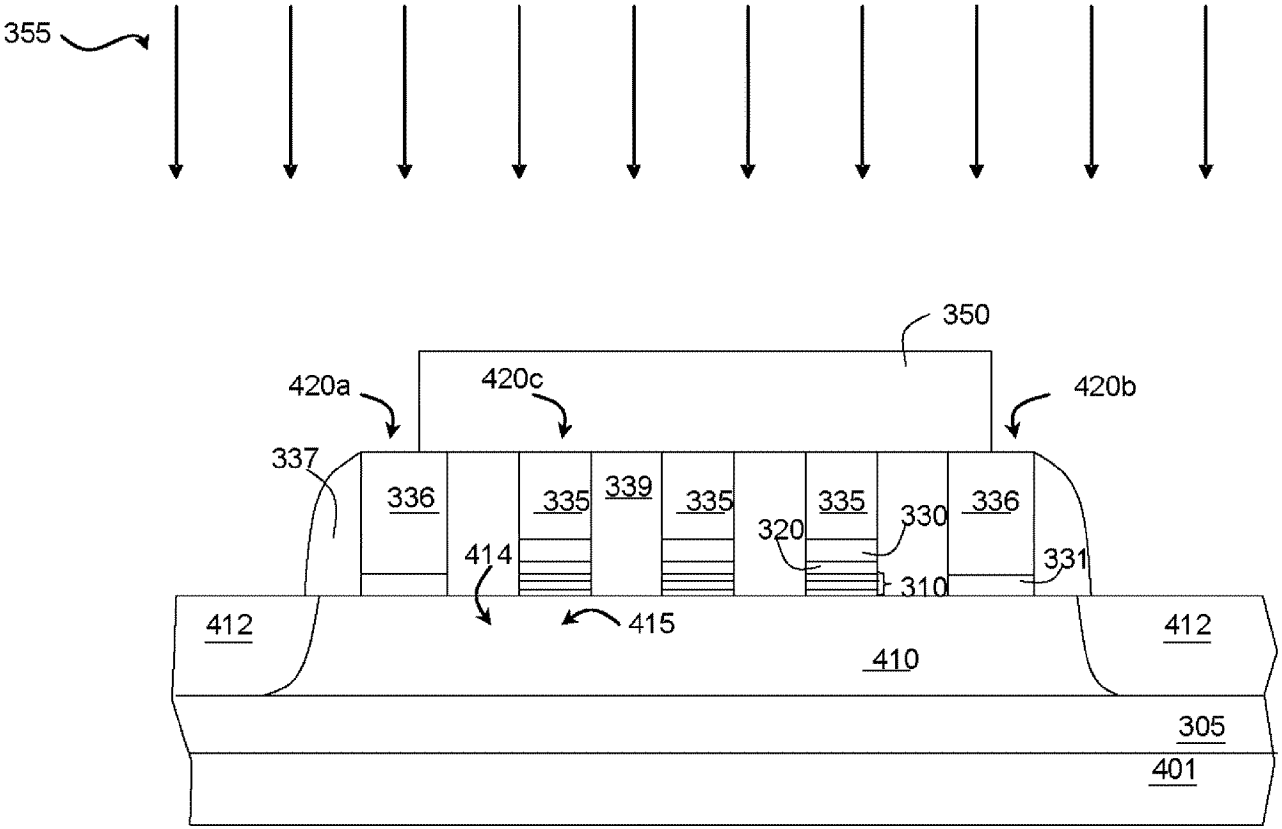
FIG. 46C is a schematic cross-sectional view showing an exemplary process for implanting dopants within semiconductor body regions for a thin-film transistor, charge trapping memory.

FIG. 46C is a schematic cross-sectional view showing an exemplary process for implanting dopants within semiconductor body regions. In FIG. 46C, a patterned mask layer 350 is formed over the select lines 420a, 420b and word lines 420c. The patterned mask layer 350 covers at least portions of the select lines 420a, 420b and the word lines 420c. The patterned mask layer 350 protects the regions 414 of the semiconductor body region 410 from being implanted with dopants of the implantation process 355. The patterned mask layer 350 may be, for example, a patterned photoresist layer, a patterned dielectric layer, a patterned material layer that is adapted to be an etch mask and various combinations thereof. After the implantation process 355, the patterned mask layer 350 may be removed. The implantation process 355 may be a tilt implantation process or an implantation process with a direction substantially perpendicular to the substrate 401.

Figure 47:
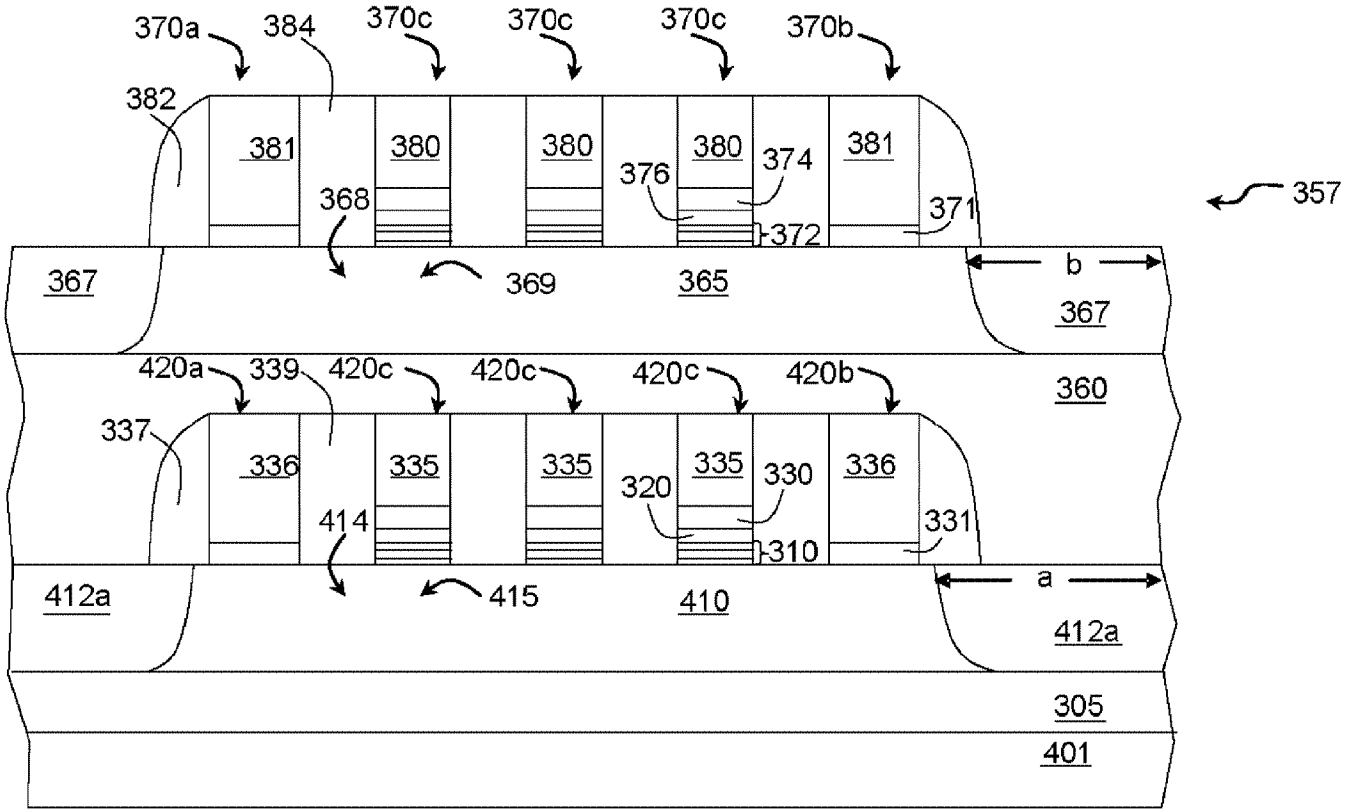
FIG. 47 is a schematic cross-sectional views showing a portion of an exemplary stacked structure for a thin-film transistor, charge trapping memory.

FIG. 47 is a schematic cross-sectional view showing a portion of an exemplary stacked array structure. In FIG. 47, another array structure layer 357 may be formed over the structure of FIG. 46B. The array structure layer 357 may include, for example, a dielectric layer 360 formed over the select lines 420a, 420b and word lines 420c. The dielectric layer 360 may be an oxide layer, a nitride layer, an oxynitride layer, a low-k dielectric layer, an ultra-low-k dielectric layer, other dielectric material layer, or various combinations thereof. The dielectric layer 360 may be formed by, for example, a CVD process, a spin-on-glass process and/or other process that is adequate to form a dielectric layer.

Referring again to FIG. 47, the array structure 357 may further include at least one semiconductor body region such as a semiconductor body region 365 including regions 367, 368, 369, select lines 370a, 370b, word lines 370c, gate insulators 371, tunneling barriers 372, charge storage layers 374, dielectric layers 376, conductive layers 380, 381, dielectric spacers 382 and dielectric materials 384, which are similar to the semiconductor body region 410 including the regions 412, 414, 415, the select lines 420a, 420b, the word lines 420c, the gate insulators 331, the tunneling barriers 310, the charge storage layers 320, the dielectric layers 330, the conductive layers 335, 336, the dielectric spacers 337 and the dielectric materials 339, respectively, described above in conjunction with FIG. 46B. It is noted that the array structure layer 357 is formed over the structure of FIG. 46B. The doped regions 412 (shown in FIG. 44) are subjected to the same thermal cycle for forming, for example, the dielectric layer 360, the semiconductor body region 365, the select lines 370a, 370b, the word lines 370c, the tunneling barrier 372, the charge storage layer 374, the dielectric layer 376, the conductive layer 380, the dielectric spacers 382 and/or the dielectric materials 384 described above in conjunction with FIG. 47. The doped regions 412 may extend toward the select lines 420a, 420b so as to form the doped regions 412a. The extending regions 412a may have a dimension "a" larger than dimension "b" of the regions 367.

It is noted that the exemplary structure of FIG. 47 does not have common source/drain regions formed between the select lines 420a, 420b and word lines 420c and between the word lines 420c. Even after more than one thermal cycle, the regions 412a may not extended and be adjacent to other junctions or doped source/drain regions. Accordingly, the issues of the short channel effect and the leakage current within the memory array may be desirably prevented.

FIG. 47 merely shows an exemplary embodiment including 2 stacked array structures. The number of the array structures, e.g., the array structure 357, is not limited to two. Two or more array structures may be formed over the structure of FIG. 47 in order to achieve a desired memory capacity.

Figure 48:
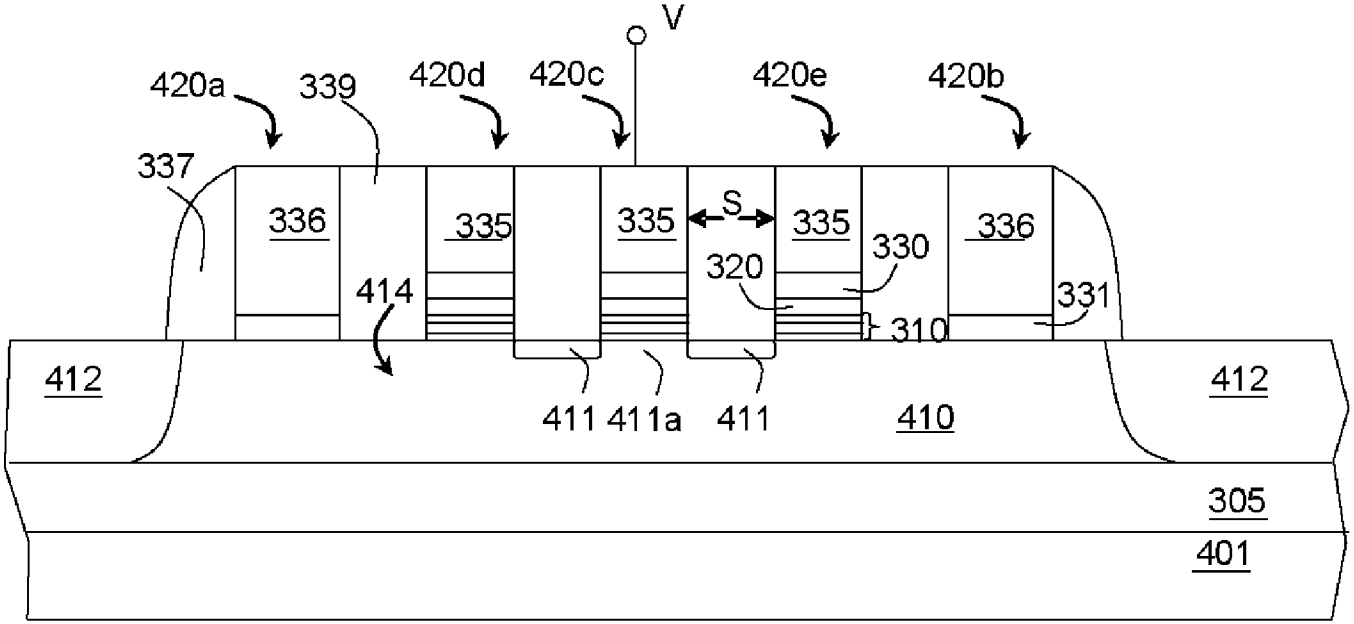
FIG. 48 is a schematic cross-sectional view showing an exemplary process for generating an inversion layer in a semiconductor body region for a thin-film transistor, charge trapping memory.

FIG. 48 is a schematic cross-sectional view showing an exemplary process for generating an inversion layer in a semiconductor body region. Referring to FIG. 48, a voltage "V" may be coupled to the selected word line 420c. In some embodiments, a space "S" between two neighboring word lines, such as 420c and 420d, or 420c and 420e, may be about 75 nm or less. In exemplary embodiments, the space S is 30 nm or less. Due to the small space, the voltage "V" applied to the word line 420c may be coupled to and generate an inversion layer in the regions 411 within the semiconductor body region 410 between two adjacent word lines, such as 420c and 420d, or 420c and 420e, and in the region 411a beneath the word line 420c. The inversion layers 411, 411a may serve as S/D terminals of array transistors. In some embodiments using NAND-type structures, voltages are applied to each of the word lines 420c-420e and may invert and/or generate the inversion layers between two adjacent word lines 420c-420e and select lines 420a, 420b. Therefore, the array transistors may desirably function without heavily doped S/D junctions within semiconductor body region 410.

Reset

In some embodiments, a reset operation may be performed to tighten the Vt distribution first before other operations of the memory array. For example, voltages are applied to and turn on the select lines 420a and 420b. Prior to other operations, a voltage of about −7 V may be applied to the word lines 420c-420e and a voltage of about +8 V may be applied to the semiconductor body region 410 as shown in FIG. 48. The voltages applied to select lines 420a and 420b are higher than the voltage applied to word lines 420c-420e. The voltage drop of the word lines 420c-420e and the semiconductor body region 410 may be desirably portioned into the gate voltage into each word line and semiconductor body region. In some embodiments, the memory array may be charged with various voltages. The reset operation may desirably reset the cells of the memory array. In some embodiments, the reset time is about 100 millisecond. In some embodiments for resetting the memory array, the memory array may include n-channel BE-SONOS devices with ONONO.apprxeq.15/20/18/70/90 angstroms and have an N+ polysilicon gate with Lg/W 0.22/0.16 μm.

Programming

In some embodiments for programming cells of the memory array, a high voltage, e.g. between about +16 V and about +20 V, may be applied to word line 420c to induced channel +FN injection. In some embodiments, the high voltage is about +18 V. A voltage, such as about +10 V, may be applied to other pass gates, i.e., unselected word lines 420d and 420e to induce inversion layers in the NAND string. Semiconductor body region 410 is substantially grounded. Charges, such as electrons, can be injected into the charge storage layer of word line 420c. In some embodiments, the +FN programming may be a low-power programming. In some embodiments, parallel programming methods, such as page programming method with 4 K Bytes cells may desirably increase the programming throughput to more than 10 MB/sec. The total current consumption can be about 1 mA or less. In some embodiments, a voltage, such as about 7 V, may be applied to other bit lines to avoid program disturb. The voltage applied to the bit lines may raise the potential of the inversion layer to suppress the voltage drop in the unselected bit lines.

Erasing

In some embodiments, the erasing operation may be similar to the reset operation. A voltage of about −7 V may be applied to the word lines 420c and a voltage of about +8 V may be applied to the semiconductor body region 410 as shown in FIG. 48. The voltage drop of the word lines 420c and the semiconductor body region 410 may be desirably portioned into the gate voltage into each word line and semiconductor body region.

Read

In some embodiments for reading the memory array, the selected word line may be raised to a voltage, such as about +5 V that is between an erased state level (EV) and a programmed state level (PV) of a memory cell. Other unselected word lines may serve as the "PASS gates" so that their gate voltages may be raised a voltage higher than PV. In some embodiments, the voltage applied to the pass gates is about +9 V. In some embodiments, a voltage of about +1 V is applied to the semiconductor body region 410.

The structures and methods for forming the structures described above in conjunction with FIGS. 44, 45, 46A-46C and 47 may be applied in any NAND-type flash memories with various cell structures such as flash memory with polysilicon floating gate.

Exemplary Embodiments

Following are descriptions of exemplary junction-free BE-SONOS devices. In some embodiments, the device has a poly pitch of about 0.15 um. After patterning the hard mask of poly, an oxide liner can be formed to fill-in the poly space, e.g., about 70 nm or more, followed by the poly etching to define the final poly space. It is found that the device may be free from abnormal poly short or line-end breaking. The narrow space (S) between the sidewalls of the oxide liner can be accurately controlled by the liner oxide thickness.

The conventional junction implantation can be performed after the poly etching. In embodiments of junction-free devices, shallow junction can be saved and spacers can be kept. Oxide spacer can be fill-in the narrow space between word lines. A tilt-angle implantation can be carried out to form the junction outside and adjacent to the array. Due to the thick poly gate blocking the implantation, the array center is not subjected to the tilt-angle implantation and is junction-free. It is noted that this process is desirably compatible with conventional NAND process. No additional mask is required.

Following are the descriptions of electrical characteristics of junction-free devices. The devices are configured with a 16-WL NAND array. The ONONO structure, e.g., O1/N1/O2/N2/O3, has dimensions of about are 13/20/25/60/60 Å, respectively. Å

Figure 49A:
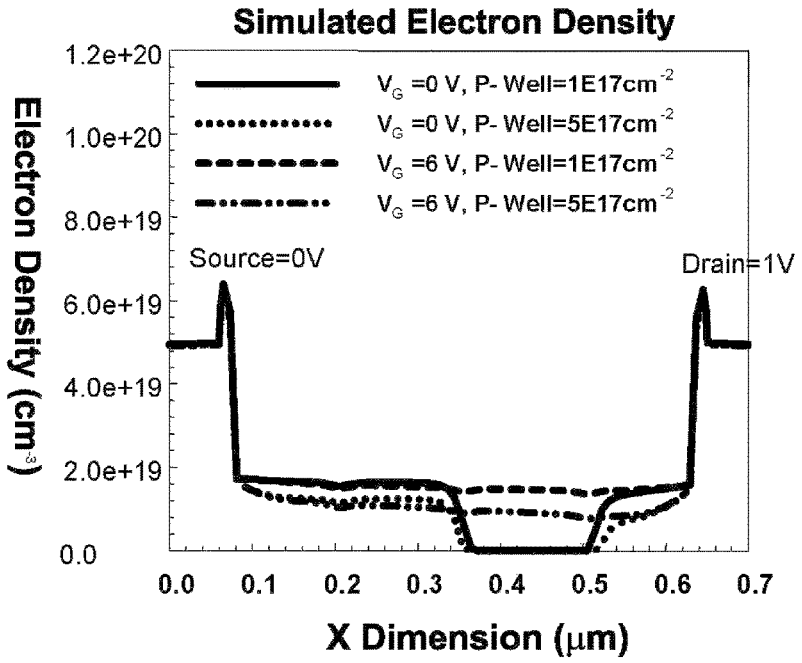
FIGS. 49A-49B are drawings showing simulations of electron density of exemplary junction-free BE-SONOS NAND implemented with a thin-film transistor, charge trapping memory.
Figure 49B:
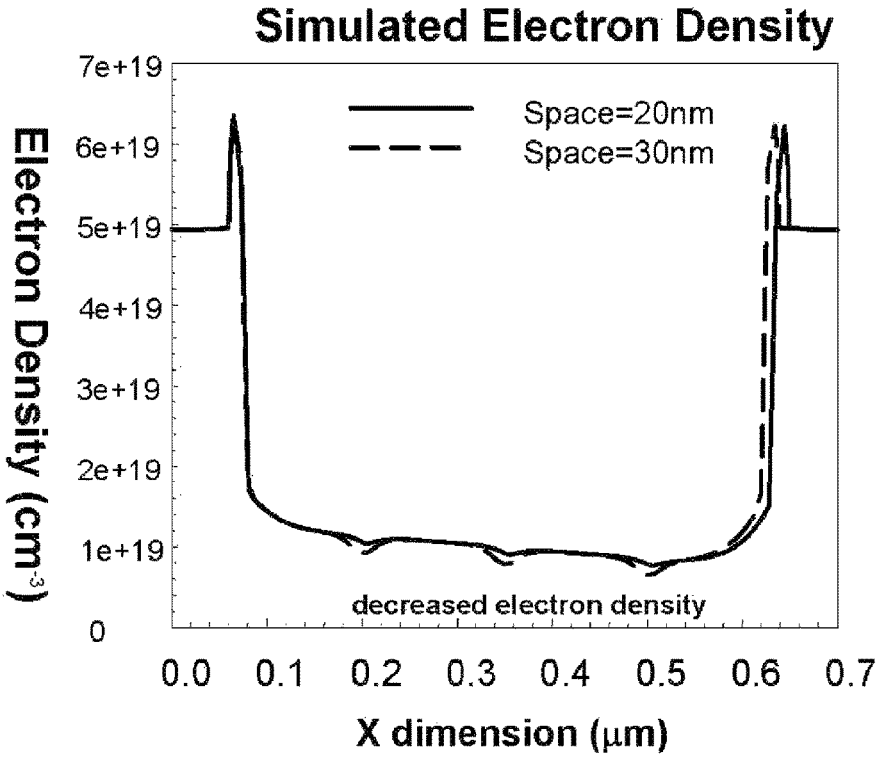

FIG. 49A illustrates the effect of various p-well doping. A lighter well doping provides larger electron density, enabling more current flow. FIG. 49B illustrates the effect of space (S). When S is increased, the electron density is slightly decreased at the space, leading to lower current.

Figure 50:
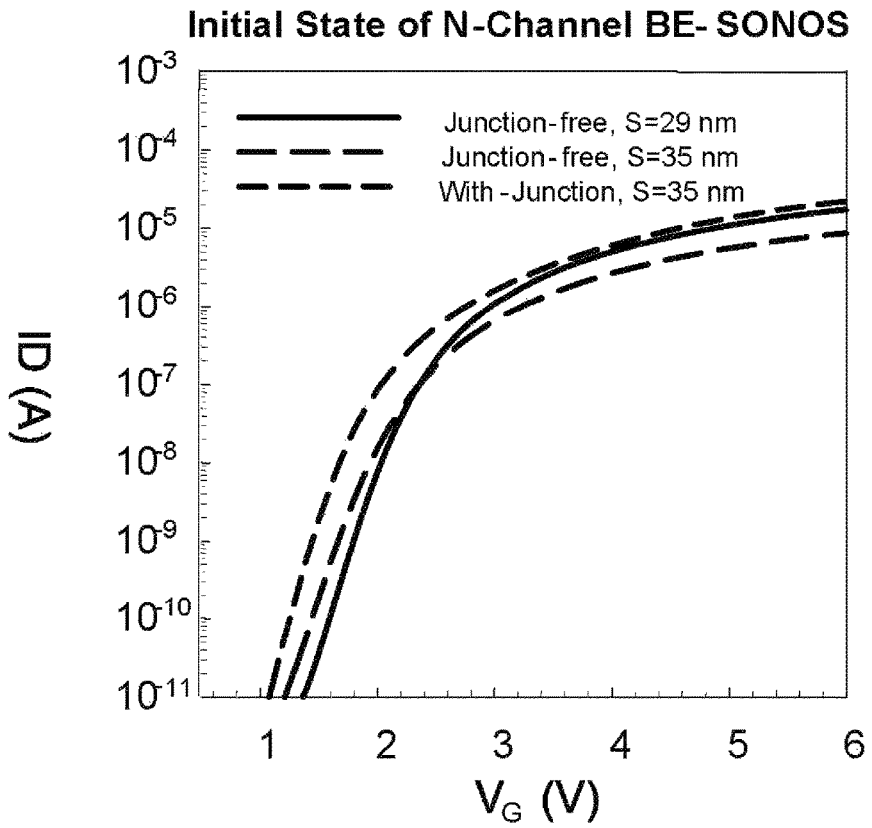
FIG. 50 is a figure showing the measured initial IV curve of exemplary n-channel devices for a thin-film transistor, charge trapping memory.
Figure 51:
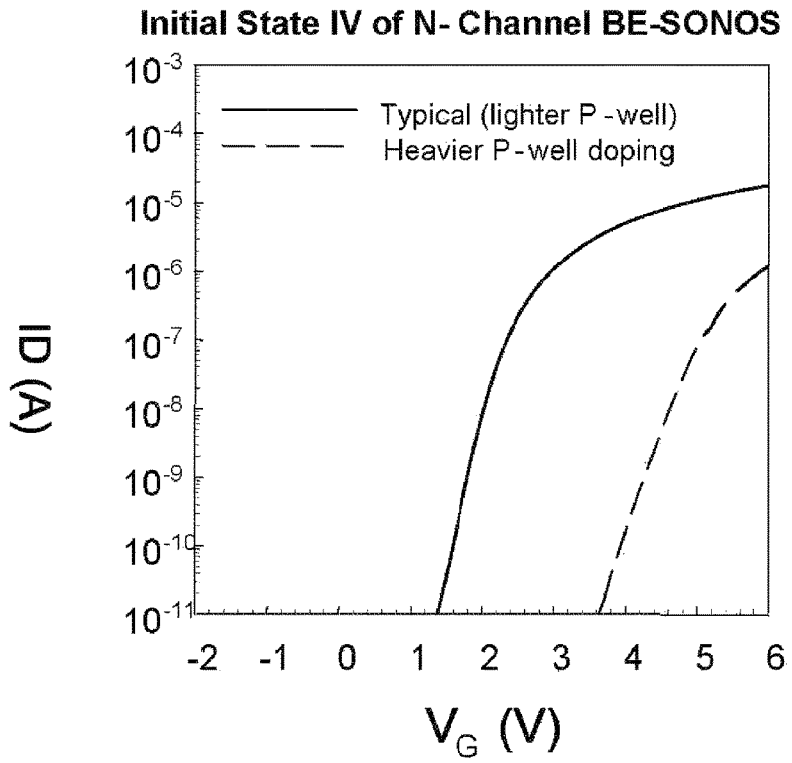
FIG. 51 shows that a heavier well dopant concentration can increase the Vt of the junction-free device.

FIG. 50 is a figure showing the measured initial W curve of exemplary n-channel devices. Junction-free devices can have similar subthreshold behavior as conventional junction devices. It is found that the drain current is slightly lower of the junction-free device than that of the conventional junction device. It is also found that larger space (S) shows slightly lower current. FIG. 51 shows that a heavier well dopant concentration can increase the Vt of the junction-free device, which is consistent with the simulation shown in FIG. 49A.

Figure 52A:
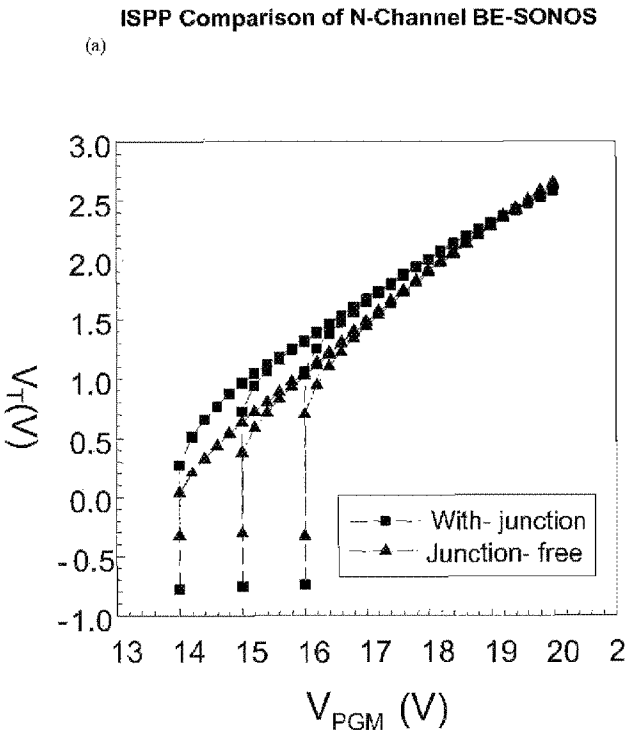
FIGS. 52A-52B are drawings showing +FN ISPP programming and −FN erasing, respectively, for a thin-film transistor, charge trapping memory.
Figure 52B:
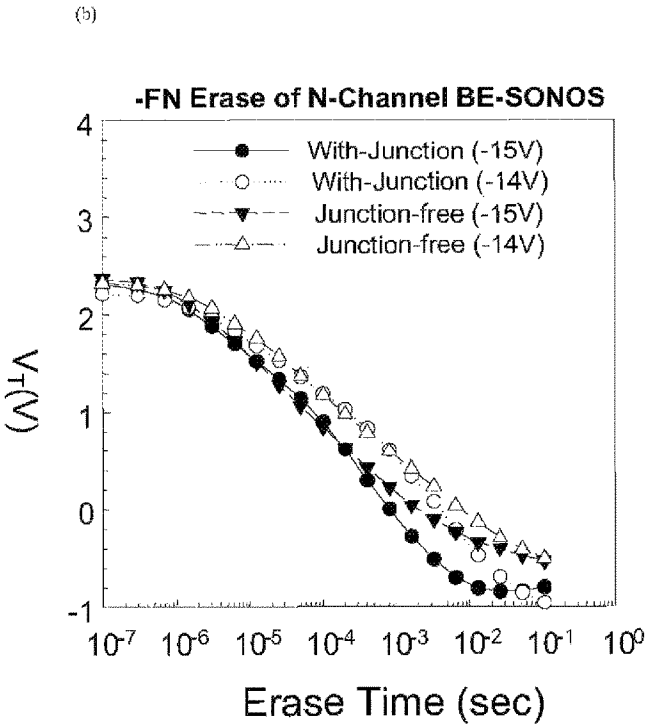

FIGS. 52A-52B are drawings showing +FN ISPP programming and −FN erasing, respectively. Junction-free devices can have similar electrical characteristics as conventional junction devices. The reason may be attributed to +/−FN injection being governed by the intrinsic ONONO property, and irrelevant with junctions.

Figure 53:
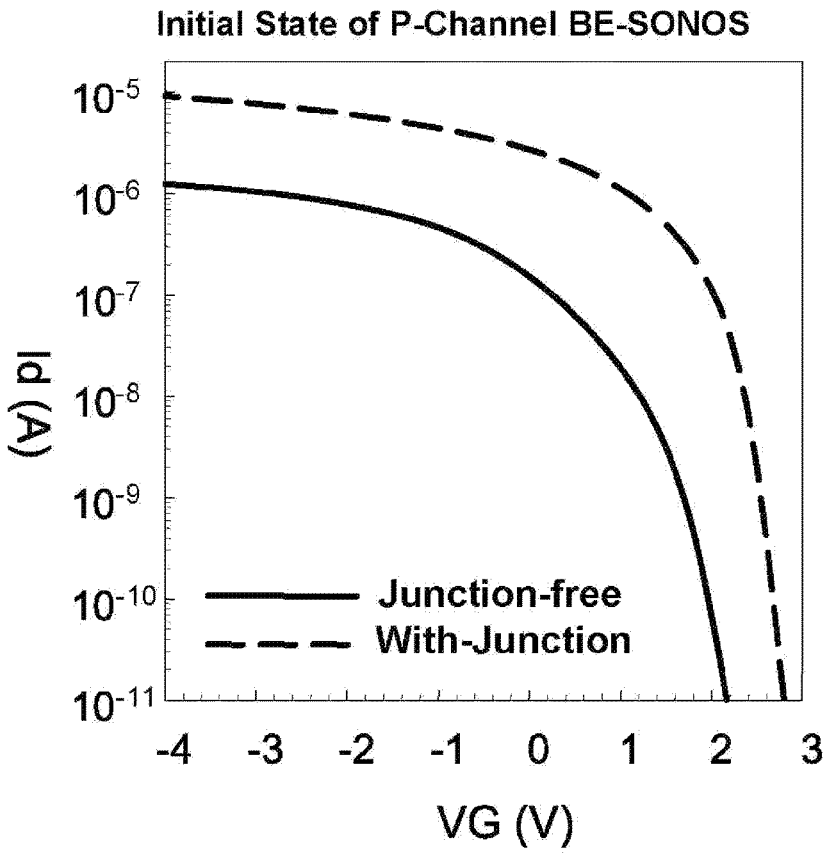
FIG. 53 is a drawing showing electrical characteristics of an exemplary P-channel BE-SONOS NAND having a stack structure similar to the N-channel BE-SONOS NAND described above in conjunction with FIG. 50.

FIG. 53 is a drawing showing electrical characteristics of an exemplary P-channel BE-SONOS NAND having a stack structure similar to the N-channel BE-SONOS NAND described above in conjunction with FIG. 50. In FIG. 53, it is found that the junction-free device has larger Vt difference and smaller current than those of the conventional junction device. The reason can be that the conventional junction device is not desirably optimized and has large Vt roll-off effect.

Figures 54A, 54B:
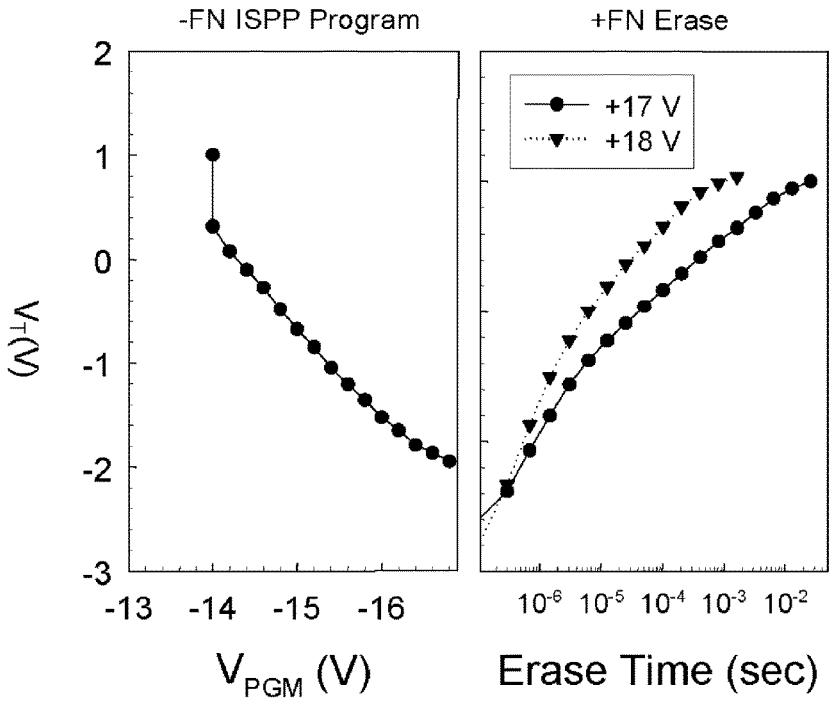
FIG. 54A is a graph of threshold voltage versus program voltage for a −FN ISPP programming.
FIG. 54B is a graph showing erase time versus threshold voltage for a +FN erase.

For the p-channel NAND, the program/erase voltage polarity should be opposite to that of the n-channel NAND. FIGS. 54A-54B are drawings showing −FN ISPP programming and +FN erase of an exemplary p-channel BE-SONOS NAND. From FIGS. 54A-54B, it is found that −FN ISPP programming and +FN erase of an exemplary p-channel BE-SONOS NAND can be performed.

Figure 55:
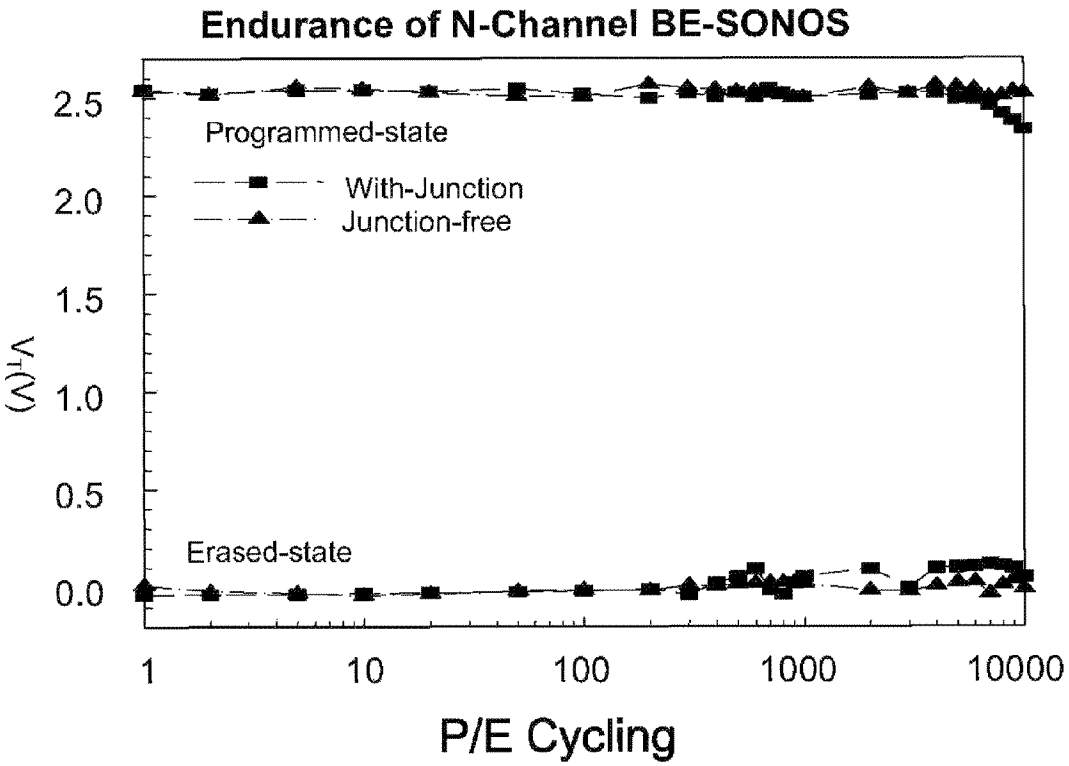
FIG. 55 is a drawing showing endurance of exemplary n-channel devices for a thin-film transistor, charge trapping memory.

FIG. 55 is a drawing showing endurance of exemplary n-channel devices. In FIG. 55, the junction-free device does not have substantial reliability degradation, whereas the conventional junction device does.

Figure 56:
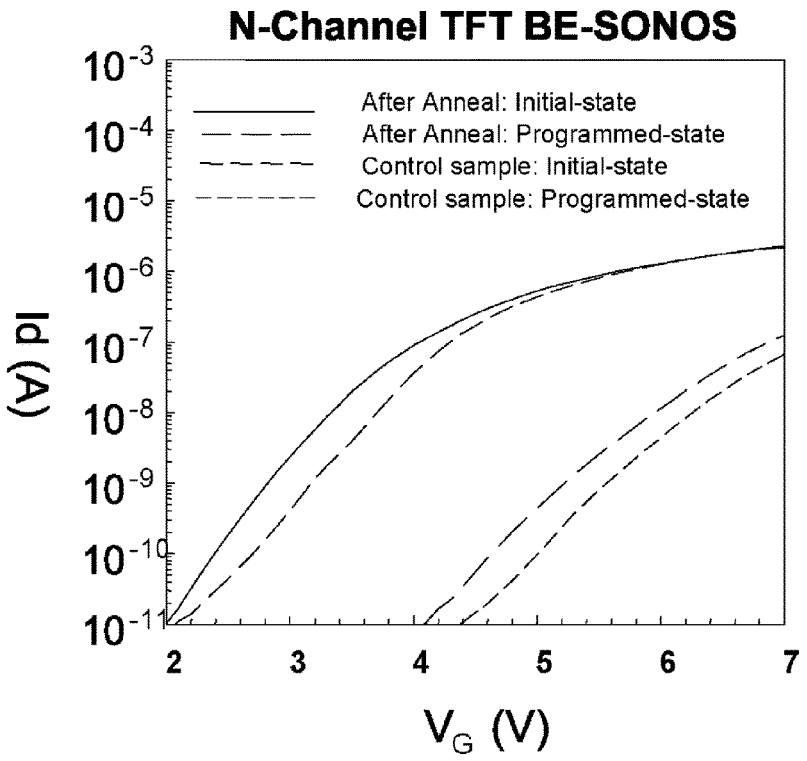
FIG. 56 is a drawing showing IV curve of exemplary TFT BE-SONOS devices for a thin-film transistor, charge trapping memory.

FIG. 56 is a drawing showing IV curve of exemplary TFT BE-SONOS devices. To understand the impact of thermal budget, a post thermal anneal with 850 for 20 minutes to simulate the thermal budget during 3D integration. In FIG. 56, the TFT device shows similar electrical characteristics as those after thermal anneal. This result is desired for 3D integration processes, since junction-free are much less sensitive to thermal budget.

Figure 57:
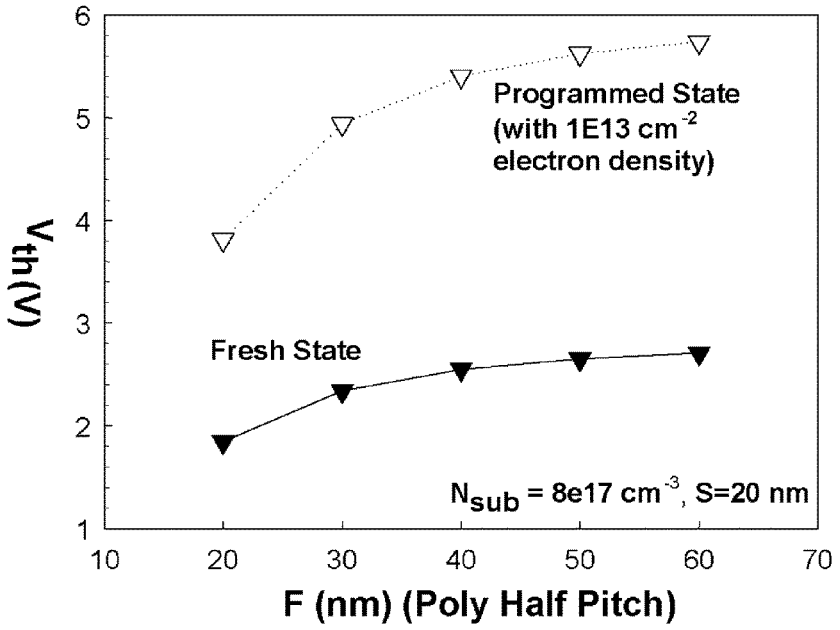
FIG. 57 is a drawing showing simulations of exemplary junction-free devices having various technology nodes (F=half pitch of poly), and having same spaces (S=20 nm) for a thin-film transistor, charge trapping memory.

FIG. 57 is a drawing showing simulations of exemplary junction-free devices having various technology nodes (F=half pitch of poly), and having same spaces (S=20 nm). In FIG. 57, it is found that the junction-free devices Vt-roll-off can be desirably controlled. This may be attributed to the larger effective channel length in the junction-free devices than in conventional junction devices. In FIG. 57, the effect of programmed states are also simulated. For devices having small F, the programmed Vt shift is reduced. The reason can be that the device channel length is short such that fringing field degrades the gate control capability. It should be noted that the junction-free devices are desired for charge-trapping devices. For embodiments of floating-gate devices, the small space (S) can induce more FG-FG interference.

The foregoing disclosure of the preferred embodiments of the present invention has been presented for purposes of illustration and description. It is not intended to be exhaustive or to limit the invention to the precise forms disclosed. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method for forming a semiconductor structure, comprising:

forming a plurality of first parallel semiconductor [body regions] *bodies* with a first dopant type over a substrate;

forming a plurality of first parallel word lines between a first select line and a second select line, the first word lines, the first select line and the second select line being over and intersecting the first semiconductor [body regions] *bodies* in an array of cross points;

forming a first tunneling barrier, a first charge storage layer and a first dielectric layer between the first semiconductor [body regions] *bodies* and the first word lines;

forming first dielectric spacers on a sidewall of the first select line and a sidewall of the second select line;

forming first source/drain (S/D) junctions with a second dopant type adjacent to the first select line and the second select line;

forming a second dielectric layer over the first word lines;

forming a plurality of second parallel semiconductor [body regions] *bodies* with the first dopant type over the second dielectric layer;

forming a plurality of second parallel word lines between a third select line and a fourth select line, the second parallel word lines, the third select line and the fourth select line being over and substantially perpendicular to the second semiconductor [body regions] *bodies*;

forming a second tunneling barrier, a second charge storage layer and a third dielectric layer between the second semiconductor [body regions] *bodies* and the second word lines;

forming second dielectric spacers on a sidewall of the third select line and a sidewall of the fourth select line; and forming second source/drain (S/D) [regions] *junctions* with the second dopant type adjacent to the third select line and the fourth select line;

wherein [the] regions in the first semiconductor [body regions] *bodies* between two neighboring first word lines and [the] regions in the second semiconductor[body regions] *bodies* between two neighboring second word lines are junction-free.

2. The method of claim 1, wherein forming *the* first dielectric spacers includes forming first dielectric materials between two neighboring first word lines.

3. The method of claim 1, wherein forming *the* first source/drain (S/D) [regions] *junctions* includes using the first dielectric spacers as an implantation mask.

4. The method of claim 1, further comprising forming a plurality of trench structures adjacent to and parallel with the first semiconductor [body regions] *bodies*.

5. The method of claim 1, wherein forming the [S/D] *first source/drain* (*S/D*) junctions comprises:

forming a patterned mask layer overlying at least portions of the first and second select lines and the first word lines; and implanting dopants of the second dopant type into the first semiconductor [body regions] *bodies* by using the patterned mask layer as an implantation mask.

6. The method of claim 1, wherein forming the first tunneling barrier comprises forming a tunnel dielectric structure having multilayer or composite composition with a first hole tunneling barrier height at [an interface] *interfaces* with the *first* semiconductor [body] *bodies*, and a second hole tunneling barrier height spaced away from the [interface] *interfaces* that is less than the first hole tunneling barrier height at the [interface] *interfaces*.

7. The method of claim 1, further comprising forming an oxide layer between the substrate and the first semiconductor [body regions] *bodies*.

8. The method of claim 1, wherein forming *the* second dielectric spacers includes forming a second dielectric material between two neighboring second word lines.

9. The method of claim 1, wherein forming *the* second source/drain (S/D) [regions] *junctions* includes using the second dielectric spacers as an implantation mask.

10. The method of claim 1, wherein forming the first [S/D regions] *source/drain* (*S/D*) *junctions* comprises implanting dopants with the second dopant type into the first semiconductor [body regions] *bodies* by using first dielectric materials as an implantation stop layer so as to prevent implanting the dopants within the first semiconductor [body regions] *bodies* between two neighboring first word lines.

11. The method of claim 1, wherein the method does not include an implantation process for forming common source/drain [regions] (*S/D*) *junctions* within the first semiconductor [body regions] *bodies* between the first word lines.

12. A method for forming a semiconductor structure, comprising:

forming a plurality of first semiconductor [body regions] *bodies*;

forming a plurality of first word lines, each of the plurality of first word lines [overlying] *crossing over* a channel region in each of the first semiconductor [body regions] *bodies*;

forming a first tunneling barrier, a first charge storage layer, and a first dielectric layer between each of the first word lines and a corresponding channel region in each of the first semiconductor [body regions] *bodies*, wherein *regions in* the first semiconductor [body regions] *bodies* between one of the first word lines and another one of the first word lines are junction-free;

forming an inter-dielectric layer over the first word lines;

forming a plurality of second semiconductor [body regions] *bodies* overlying the inter-dielectric layer;

forming a plurality of second word lines [over] *crossing over channel regions in each of* the second semiconductor [body regions] *bodies*; and forming a second tunneling barrier, a second charge storage layer and a second dielectric layer between the second word lines and *a corresponding channel region in each of* the second semiconductor [body region] *bodies*.

*13. A memory device, comprising:*

*a first gate and a second gate;*

*a first semiconductor body including a first channel surface and a second semiconductor body including a second channel surface;*

*a first tunnel structure and a first charge storage region located between the first gate and the first channel surface;*

*the first tunnel structure including a first portion and second portion, a middle portion located between the first and second portion, the first portion having a valence band energy, the middle portion having a valence band energy greater than that of the first portion, the second portion having a valence band energy less than that of the middle portion; and*

*a second tunnel structure and a second charge storage region located between the second gate and the second channel surface, wherein the first charge storage region is over the second charge storage region.*

*14. The memory device of claim 13, wherein the first and second gates include a material having a work function greater than that of N+ polysilicon.*

*15. A method of forming a memory device, comprising:*

*forming a first plurality of gates;*

*forming a first semiconductor body;*

*forming a first plurality of multi-layered hole-tunneling dielectrics and a first plurality of charge storage regions between the first plurality of gates and the first semiconductor body;*

*forming a second plurality of gates;*

*forming a second semiconductor body; and*

*forming a second plurality of multi-layered hole-tunneling dielectrics and a second plurality of charge storage regions between the second plurality of gates and the second semiconductor body, wherein a semiconductor region between one of the second gates and another one of the second gates is junction-free and the first plurality of charge storage regions are over the second plurality of charge storage regions.*

*16. The method of forming a memory device of claim 15, wherein a semiconductor region between one of the first gates and another one of the first gates is junction-free.*

*17. The method of forming a memory device of claim 16, wherein the first and second plurality of gates include a material having a work function greater than that of N+ polysilicon.*

*18. The method of forming a memory device of claim 16, wherein both the first and the second plurality of multi-layered hole-tunneling dielectrics include a first portion and second portion, a middle portion located between the first and second portion, the first portion having a valence band energy, the middle portion having a valence band energy greater than that of the first portion, the second portion having a valence band energy less than that of the middle portion.*

* * * * *